United States Patent
Gardner et al.

(10) Patent No.: US 12,289,885 B2
(45) Date of Patent: Apr. 29, 2025

(54) 3D INTEGRATION OF 3D NAND AND VERTICAL LOGIC BENEATH MEMORY

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 545 days.

(21) Appl. No.: 17/558,485

(22) Filed: Dec. 21, 2021

(65) Prior Publication Data
US 2023/0200066 A1   Jun. 22, 2023

(51) Int. Cl.
| | | |
|---|---|---|
| H10B 43/27 | (2023.01) | |
| H10B 41/27 | (2023.01) | |
| H10B 41/41 | (2023.01) | |
| H10B 43/40 | (2023.01) | |

(52) U.S. Cl.
CPC ............ *H10B 43/27* (2023.02); *H10B 41/27* (2023.02); *H10B 41/41* (2023.02); *H10B 43/40* (2023.02)

(58) Field of Classification Search
CPC .... H10B 43/40; H10B 41/47; H01L 29/78642
See application file for complete search history.

(56) References Cited

U.S. PATENT DOCUMENTS

| | | |
|---|---|---|
| 9,024,376 B2 | 5/2015 | Masuoka et al. |
| 9,425,324 B2 | 8/2016 | Diaz et al. |
| 9,478,624 B2 | 10/2016 | Colinge et al. |

*Primary Examiner* — Matthew L Reames
(74) *Attorney, Agent, or Firm* — Foley & Lardner LLP

(57) ABSTRACT

Three-dimensional (3D) NAND memory structures and methods to manufacture 3D NAND memory structures are disclosed. A method includes forming a stack of layers that includes a first sub-stack for a transistor structure and a second sub-stack for a memory structure positioned on the first sub-stack. The second sub-stack includes at least one layer of conductive material and at least one layer of non-conductive material. The first sub-stack and the second sub-stack are separated by at least one non-conductive layer. The method includes forming a channel opening in the stack of layers, forming a gate dielectric in the channel opening, and providing a channel structure within the channel opening. The channel structure includes a semiconductive-behaving material and aligned with the transistor structure. The method includes providing a charge trap layer within the channel opening and aligned with the memory structure.

12 Claims, 40 Drawing Sheets

Cross-Sectional View 400

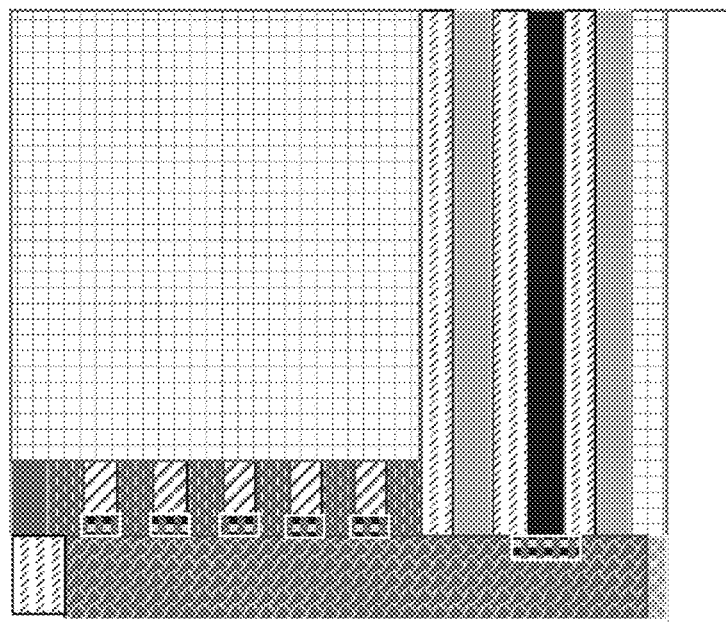
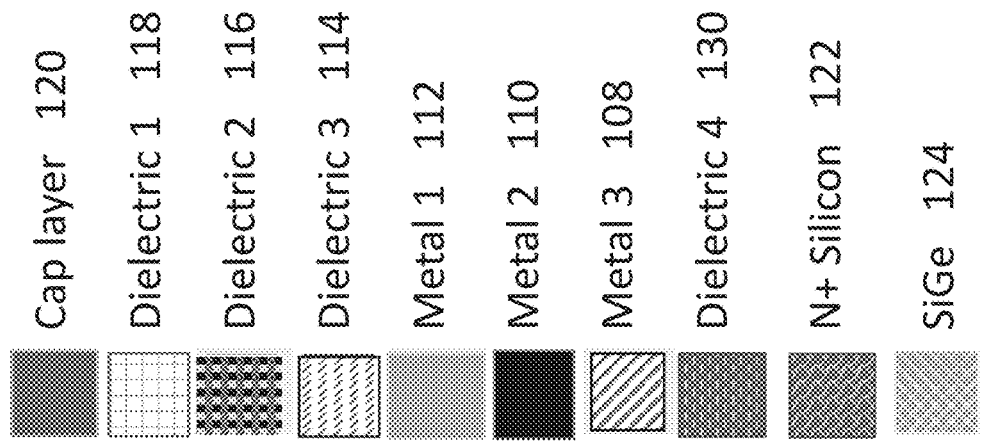
FIG. 21

Cross-Sectional View 2200

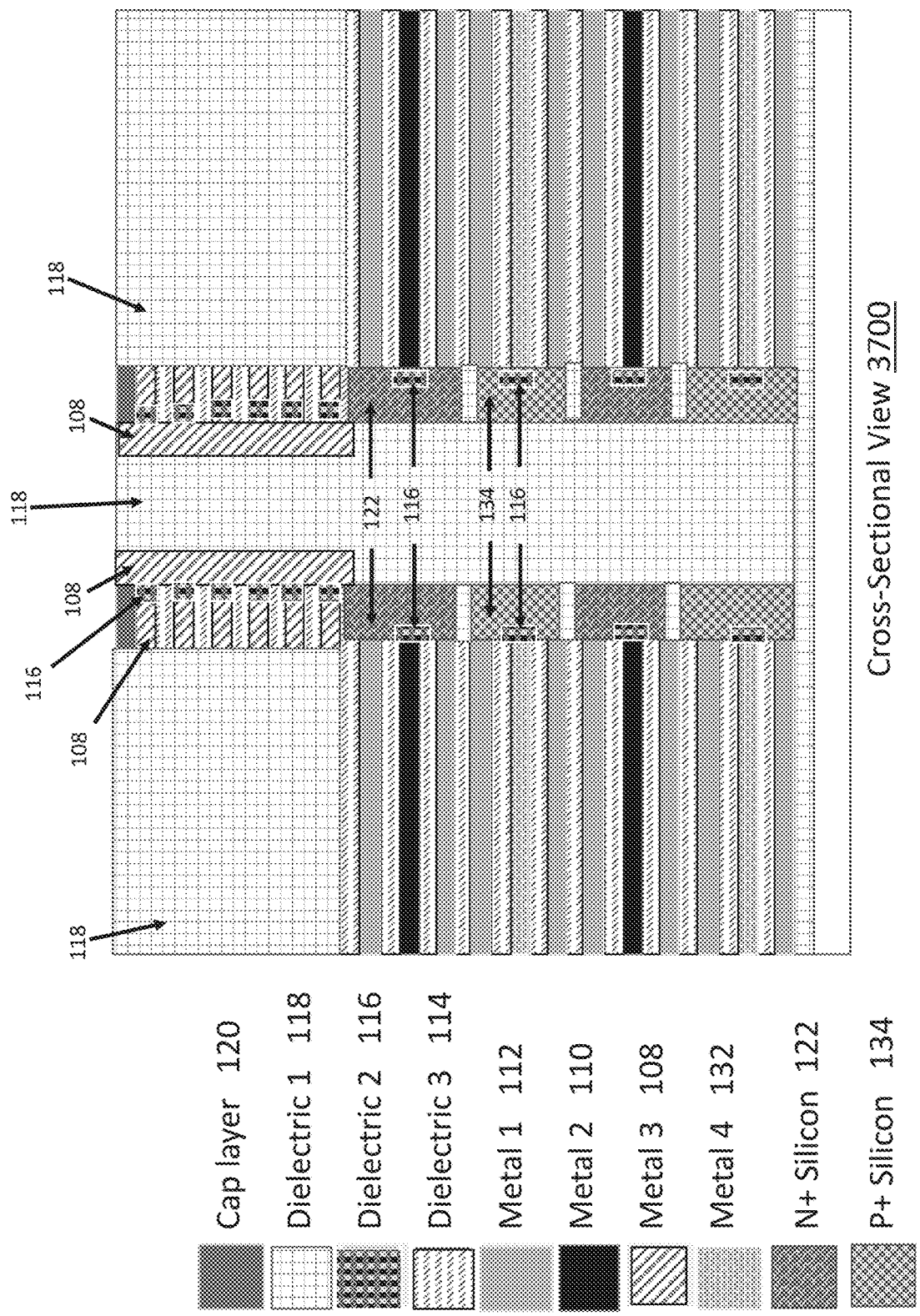

3800

Form a stack of layers including a first sub-stack for a transistor structure, the first sub-stack including a first source/drain layer, a gate conductive layer separated from the first conductive source/drain layer by at least one dielectric layer, and a second source/drain layer separated from the gate conductive layer by at least one dielectric layer, and a second sub-stack for a memory structure positioned on the first sub-stack, the second sub-stack including at least one layer of conductive material and at least one layer of non-conductive material, the first sub-stack and the second sub-stack separated by at least one non-conductive layer 3805

↓

Form a channel opening in the stack 3810

↓

Form a gate dielectric in the channel opening 3815

↓

Provide a channel structure within the channel opening, the channel structure comprising a semiconductive-behaving material and aligned with the transistor structure 3820

↓

Provide a charge trap layer within the channel opening and aligned with the memory structure 3825

Form a stack of layers including a first sub-stack for a transistor structure, the first sub-stack including a first source/drain layer, a gate conductive layer separated from the first conductive source/drain layer by at least one dielectric layer, and a second source/drain layer separated from the gate conductive layer by at least one dielectric layer, and a second sub-stack for a memory structure positioned on the first sub-stack, the second sub-stack including at least one layer of non-conductive material and at least one layer of a different non-conductive material, the first sub-stack and the second sub-stack are separated by at least one non-conductive layer 3905

↓

Form a channel opening in the stack 3910

↓

Provide a channel structure within the channel opening, the channel structure comprising a semiconductive-behaving material and aligned with the transistor structure and the memory structure 3915

↓

Etch an overhang around the second sub-stack down to the first sub-stack 3920

↓

Replace the at least one layer of the different non-conductive material in the second sub-stack with at least one gate structure, the at least one gate structure including a dielectric in contact with the channel structure and a gate metal 3925

*FIG. 39*

3D INTEGRATION OF 3D NAND AND VERTICAL LOGIC BENEATH MEMORY

TECHNICAL FIELD

The present invention relates generally to the field of manufacturing semiconductor devices.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional microfabrication techniques may only manufacture transistors in one plane, while wiring or metallization is formed above the active device plane. Such devices are accordingly characterized as two-dimensional (2D) circuits and are manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators, including memory device manufacturers, have expressed a desire for different manufacturing techniques that integrate high-density logic circuitry with memory structures.

SUMMARY

Three-dimensional (3D) integration, for example, a stacking (or vertical arrangement) of multiple semiconductor devices (e.g., transistor structures, memory structures, etc.) aims to overcome scaling limitations experienced in planar devices by increasing transistor density in volume rather than area. Although device stacking has been successfully demonstrated and implemented by the flash memory industry with the adoption of 3D NAND, applying similar techniques to random logic designs is substantially more difficult. 3D integration for logic chips, including central processing units (CPU), graphics processing units (GPU), and field-programmable gate arrays (FPGA) are being pursued. The techniques described herein extend the manufacturing processes used to create 3D NAND memory with 3D logic integration.

At least one aspect of the present disclosure is directed to a method for forming a stack of layers. The stack of layers can include a first sub-stack for a transistor structure. The first sub-stack can include a first source/drain layer, a gate conductive layer separated from the first source/drain layer by at least one dielectric layer, and a second source/drain layer separated from the gate conductive layer by at least one dielectric layer. The stack of layers can include a second sub-stack for a memory structure positioned on the first sub-stack. The second sub-stack can include at least one layer of conductive material and at least one layer of non-conductive material. The first sub-stack and the second sub-stack can be separated by at least one non-conductive layer. The method can include forming a channel opening in the stack of layers. The method can include forming a gate dielectric in the channel opening. The method can include providing a channel structure within the channel opening. The channel structure comprises a semiconductive-behaving material and aligned with the transistor structure. The method can include providing a charge trap layer within the channel opening and aligned with the memory structure.

The method can include forming a core channel opening through the charge trap layer and the channel structure. In some implementations, forming a metal layer in the core channel opening in contact with the charge trap layer and the channel structure. In some implementations, the method can include providing a dielectric material in the core channel opening in contact with the metal layer and the channel structure.

The semiconductive-behaving material is a p-type semiconductive-behaving material or an n-type semiconductive-behaving material. In some implementations, the method can include etching the stack of layers to form a word line cut. In some implementations, providing a dielectric material in the word line cut. In some implementations, the channel structure is formed on a seed layer. In some implementations, the method can include removing the seed layer after forming the channel opening in the stack of layers.

At least one other aspect of the present disclosure is directed to another method for forming a stack of layers. The stack of layers can include a first sub-stack for a transistor structure. The first sub-stack can include a first source/drain layer, a gate conductive layer separated from the first source/drain layer by at least one dielectric layer, and a second source/drain layer separated from the gate conductive layer by at least one dielectric layer. The stack of layers can include a second sub-stack for a memory structure positioned on the first sub-stack. The second sub-stack can include at least one layer of non-conductive material and at least one layer of a different non-conductive material. The first sub-stack and the second sub-stack can be separated by at least one non-conductive layer. The method can include forming a channel opening in the stack of layers. The method can include providing a channel structure within the channel opening. The channel structure can include a semiconductive-behaving material and aligned with the transistor structure and the memory structure. The method can include etching around the second sub-stack down to the first sub-stack. The method can include replacing the at least one layer of the non-conductive material in the second sub-stack with at least one gate structure. The at least one gate structure can include a dielectric in contact with the channel structure and a gate metal.

Replacing the at least one layer of the non-conductive material in the second sub-stack can include selectively etching the at least one layer of the non-conductive material to form at least one air gap. In some implementations, replacing the at least one layer of the non-conductive material in the second sub-stack can include selectively depositing a gate dielectric material in a portion of the at least one air gap. In some implementations, replacing the at least one layer of the non-conductive material in the second sub-stack can include forming the gate metal in a remaining portion of the at least one air gap to form the at least one gate structure.

The method can include providing a dielectric that surrounds the second sub-stack after forming the at least one gate structure. In some implementations, the method can include forming a gate dielectric on the gate conductive layer prior to providing the channel structure. In some implementations, the semiconductive-behaving material is a p-type semiconductive-behaving material or an n-type semiconductive-behaving material.

The method can include forming a core opening through the channel structure. In some implementations, the channel structure is formed on a seed layer. In some implementations, the method can include removing the seed layer after forming the core opening in the stack of layers.

At least one other aspect of the present disclosure is directed to another method for forming a stack of layers. The stack of layers can include a first sub-stack for a transistor structure. The first sub-stack can include a first source/drain layer, a gate conductive layer separated from the first source/drain layer by at least one dielectric layer, and a second source/drain layer separated from the gate conductive layer by at least one dielectric layer. The stack of layers can include a second sub-stack for a memory structure positioned on the first sub-stack. The second sub-stack can include at least one layer of non-conductive material and at least one layer of a different non-conductive material. The first sub-stack and the second sub-stack can be separated by at least one non-conductive layer. A channel opening in the stack of layers may be formed. A channel structure may be provided or formed within the channel opening. The channel structure can include a semiconductive-behaving material aligned with the transistor structure. A metal structure may be provided or formed within the channel opening on the channel structure and aligned with the memory structure. Etching may be performed around the second sub-stack down to the first sub-stack. The layer(s) of the non-conductive material may be replaced in the second sub-stack with gate structure(s). The gate structure(s) can include a dielectric in contact with the channel structure and a gate metal.

Replacing the layer(s) of the non-conductive material in the second sub-stack can include selectively etching the at least one layer of the non-conductive material to form at least one air gap. In some implementations, replacing the layer(s) of the non-conductive material in the second sub-stack can include selectively depositing a gate dielectric material in a portion of the at least one air gap. In some implementations, replacing the at least one layer of the non-conductive material in the second sub-stack can include forming the gate metal in a remaining portion of the at least one air gap to form the at least one gate structure.

A dielectric that surrounds the second sub-stack after forming the gate structure(s) may be provided or formed. In some implementations, a gate dielectric may be formed on the gate conductive layer prior to providing the channel structure. In some implementations, a core channel opening may be formed through the metal structure and the channel structure. In some implementations, the stack of layers further includes a third sub-stack for a second transistor structure. In some implementations, the third sub-stack can include a third conductive source/drain layer, a second gate conductive layer separated from the first source/drain layer by at least one dielectric layer, and a fourth source/drain layer separated from the second gate conductive layer by at least one dielectric layer. In some implementations, the third sub-stack is formed below the first sub-stack and is separated from the first sub-stack by at least one non-conductive layer.

At least one of other aspect of the present disclosure is directed to device comprising a stack of layers including a first sub-stack for a transistor structure, the first sub-stack including a first source/drain layer, a gate conductive layer separated from the first source/drain layer by at least one dielectric layer, and a second source/drain layer separated from the gate conductive layer by at least one dielectric layer; and a second sub-stack for a memory structure positioned on the first sub-stack, the second sub-stack including at least one layer of non-conductive material and at least one layer of a different non-conductive material, wherein the first sub-stack and the second sub-stack are separated by at least one non-conductive layer; a channel structure in the stack of layers, the channel structure comprising a semiconductive-behaving material and aligned with the transistor structure; a memory channel structure on the channel structure and aligned with the memory structure.

The memory channel structure may be a metal. In other implementations, the memory channel structure is a charge trap layer. The device may further comprise a metal that extends along an inner side of the charge trap layer.

The stack of layers may include a third sub-stack for a second transistor structure positioned beneath the first sub-stack. The channel structure and the memory structure may be formed from the same semiconductive behaving material. The channel structure and the memory structure may be a continuous structure.

At least one of other aspect of the present disclosure is directed to a device comprising a first sub-stack including a 3D NAND structure, and a second sub-stack vertically aligned with the 3D NAND structure and including 3D logic.

The first sub-stack may include a first source/drain layer, a gate conductive layer separated from the first source/drain layer by at least one dielectric layer, and a second source/drain layer separated from the gate conductive layer by at least one dielectric layer.

The second sub-stack may include at least one layer of non-conductive material, and at least one layer of a different non-conductive material.

The device may further comprise a charge trap layer within a channel structure of the second sub-stack.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a,' 'an,' and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 13-23 show cross-sectional views of a second process flow to form 3D NAND floating gate memory circuits integrated with 3D vertical semiconductor devices, according to an embodiment;

FIGS. 36 and 37 show cross-sectional view of a fourth process flow to form 3D NAND floating gate memory circuits integrated with 3D vertical semiconductor devices, according to an embodiment; and FIGS. 38-40 show flow diagrams of example methods for fabricating memory devices integrated with 3D vertical logic described in connection with FIGS. 1-36, according to an embodiment.

DETAILED DESCRIPTION

Figure 1:
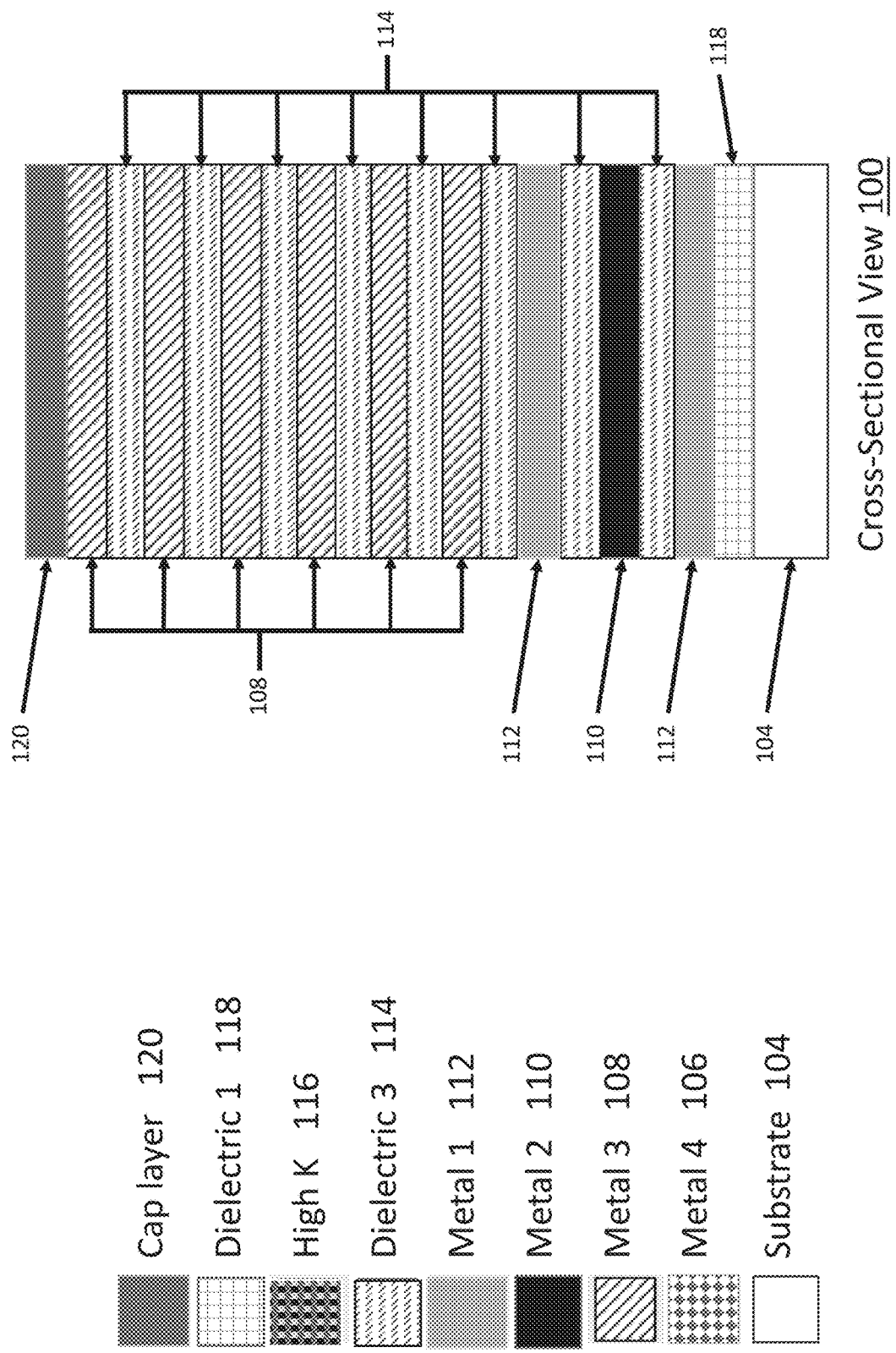
FIGS. 1-12 show cross-sectional views of a first process flow to form 3D NAND charge trap memory circuits integrated with 3D vertical semiconductor devices, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein will refer to deposited layers, formed using material deposition or formation techniques. Such materials may include semiconductors, charge trap layers, non-conductive layers (e.g., dielectric layers), and conductive layers (e.g., metal layers). However, these layers may alternatively be formed epitaxially with minor modifications to the described process without diverting from the scope of this disclosure. Therefore, a semiconductor substrate is not required, and any base layer (sometimes referred to herein as a "substrate" or a "substrate layer") may be used instead of a traditional silicon-based substrate. In addition, such techniques can enable N-high stacks of semiconductor devices, thereby allowing for higher circuit density. For example, any number of alternative conductive and non-conductive layers may be provided in the 3D NAND structures described herein. Some embodiments include 3D stacks of vertical conductive channel nano sheets in both CFET and side-by-side configurations, which may be electrically coupled to or formed in the same material stack as the 3D NAND structures described herein.

The process flows described herein utilize conductive dielectric materials to form 3D channel regions for the definition of vertical channel 3D NAND devices, as well as NMOS and PMOS devices without using epitaxial growth. As such, the techniques described herein can be manufactured or "stacked" on any existing vertically stacked device or substrate, such as metal, plastic, or other materials, according to various implementations. The present techniques may improve upon other semiconductor manufacturing techniques by increasing the N height of stacked semiconductor devices, such as transistors, thereby providing high density logic. Although not necessarily shown in some of the figures, it should be understood that various electrical connections may be formed among or between the conductive layers described herein by patterning circuits and etching vias between layers to form electronic circuits. The techniques described herein may be employed to create both charge trap type and floating gate type memory circuits.

The techniques provided herein may utilize deposited oxide based semiconductor materials (sometimes referred to herein and elsewhere as "conductive channels," "conductive dielectrics" or "conductive oxides"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances). Some examples of N-type semiconductor oxides include $In_2O_3$, $SnO_2$, InGaZnO, and ZnO. One example of a P-type semiconductor oxide is SnO. Additionally or alternatively, the channel may comprise a so called 2D semiconductor material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. The materials described herein may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The materials may be annealed during or after the device formation process to recrystallize or grow the crystals and thereby improve electrical characteristics.

As described briefly above, the process flows described herein may be implemented utilizing 3D channel regions of NMOS and PMOS devices without requiring epitaxial growth. These transistor devices may be formed in the same material stack as material layers that make up 3D NAND memory structures, thereby integrating the 3D NAND memory structures with 3D vertical transistor structures. The devices fabricated using these techniques can be stacked on any existing device or substrate, thereby greatly increasing the number N of stacked transistors (e.g., 2, 3, 4, 5, 10, 20, 50, 100, or more) for high-density logic.

The techniques described herein provide methods and processes for integrating vertical transistors, which can be electrically connected to one another to form logical circuits. These logical circuits are integrated into the same 3D material stack as 3D NAND memory devices. The techniques described herein can implement a metal first flow for both logical transistor materials and 3D NAND materials. In addition, techniques for metal last for 3D NAND and metal first for transistor structures are provided. The 3D devices described herein can include a semiconductive-behaving material for transistor structures that is integrated with the semiconductor-behaving material provided as part of the 3D NAND memory structures. These techniques described herein may be implemented to stack any number of memory material layers or device (e.g., transistor, memory, etc.) structures, thereby allowing for devices with greater than 100 memory layers that are integrated with 3D logic structures. These techniques may implement metal first wiring techniques that define connections between transistor structures to create logical circuits and metal channels for memory cells. These techniques can provide logical elements (e.g., CMOS transistor structures, etc.) beneath an array of 3D NAND memory structures, thereby achieving significant improvements in scaling by requiring less area while enabling higher circuit density.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the views depicted the Figures, connections between conductive layers or materials may be shown or may be omitted for ease of visualization. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a cylindrical configuration, other shapes are also contemplated, and indeed the techniques described herein may be implemented in any shape or geometry. As an example, noncontiguous contact shapes such as arcs or polygonal trenches, may be adjacent to, partially surround, or fully surround a central channel in addition to or as an alternative to the shapes illustrated. In addition, examples in which two or more transistors or devices are shown stacked on top of one another are shown for illustrative purposes only, and for the purposes of simplicity. Indeed, the techniques described herein may provide for one to any number N stacked devices, which may include transistor structures, memory structures, or other electric or electronic structures. Further, although the devices fabricated using these techniques are shown as transistors and memory structures, it should be understood that any type of electric electronic device may be manufactured using such techniques, including but not limited to transistors, memory structures, variable resistors, resistors, and capacitors.

FIGS. 1-12 show cross-sectional views of a first process flow to form 3D NAND charge trap memory circuits integrated with 3D vertical semiconductor devices, according to an embodiment. Each of the FIGS. 1-12 generally refer to one or more process steps (sometimes referred to as "stages") in a first process flow, each of which are described in detail in connection with the respective Figure. For the purposes of simplicity and ease of visualization, some reference numbers may be omitted from some Figures. Referring to FIG. 1, illustrated is a cross-sectional view 100 of a device. At the start of the first process flow, a first layer of dielectric 118 (shown in the legend as the "Dielectric 1") is deposited on top of a base layer 104 (shown in the legend as the "Substrate"). As described briefly above, the techniques described herein may be implemented without requiring epitaxial growth, and therefore the base layer 104 may be any type of material capable of binding to the dielectric 118. The base layer 104 may be active or passive and may comprise dielectric, conductive, or semiconductive materials, or any combination thereof. The dielectric 118 may be any type of dielectric material or otherwise non-conductive material that is capable of being disposed, patterned, or otherwise provided on top of the base layer 104. Some examples of dielectric materials can include, but are not limited to, oxide materials. The substrate 104 may remain in the final structure or may be removed during or after the formation of the devices described herein.

As used herein, the terms "first," "second," "third," and "fourth" with respect to particular layers of the stack shown in FIGS. 1-12 refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 118 (sometimes referred to herein as a "first dielectric layer") is deposited on top of the base layer 104, a first transistor structure may be formed using alternating layers of conductive and non-conductive material layers.

The term source/drain (S/D) will be used to describe layers that may be used as either a source or a drain of a transistor structure. The first S/D layer 112 (e.g., shown as "Metal 1" in the legend) may be formed directly on the base layer 104 (e.g., if the base layer 104 is non-conductive), or on the one or more dielectric layers 118 described above. The S/D layers 112 may be any type of conductive material, such as a metal, suitable to form a source or drain electrode in a semiconductor device. Some examples of such materials include, but are not limited to copper, gold, silver, platinum, nickel, tungsten, ruthenium, or other types of conductive metals or alloys. An insulating dielectric 114 (e.g., shown as "Dielectric 3" in the legend) is formed on the first S/D layer 112, after the first S/D layer 112 has been formed.

A gate layer 110 (e.g., shown as "Metal 2" in the legend) may then be formed on top of the first insulating dielectric layer 114. A second insulating dielectric layer 114 and then a second S/D layer 112 is formed on the gate layer 110. The gate layer 110 may be a different material than the first and second S/D layers 112. A third insulating dielectric layer 114 may then be formed on top of the second S/D layer 112 to complete a first transistor structure. In some implementations, multiple transistor structures may be formed on top of one another prior to forming the material stacks for memory structures, as described herein. In a multi-transistor stack, the foregoing layers (not necessarily including the base layer 104) would constitute a first sub-stack. As shown in the cross-sectional view 100, a transistor structure can include four dielectric layers (with the first transistor having one dielectric layer be the dielectric layer 118, which separates the first transistor structure from the substrate 104) and three conductive metal layers (the two S/D layers 112 and one gate layer 110).

Subsequent transistor structures (e.g., second sub-stacks, third sub-stacks, etc.) may be stacked above the first transistor structure by depositing similar layers. One or more insulating dielectric layers 114 may be deposited between adjacent transistor structures. These layers in the stack of layers may be formed without a mask, such that each layer forms a blanket layer over the prior layer. The gate layers 110 may be a different material than the S/D layers 112 to allow selectivity in etch and deposition processes. Moreover, the gate layer 110 for a P-type device may be selected to be different from the gate layer 110 of an N-type device. A non-exhaustive list of potential materials to use for the gate layer 110 includes ruthenium (Ru), tantalum nitride (TaN), titanium nitride (TiN), and tungsten (W), tungsten nitride (VVN), titanium carbide (TiC), gallium (Ga), gadolinium (Gd), titanium oxynitride (TiON), tantalum silicon nitride (TaSiN), titanium silicon nitride (TiSiN), molybdenum (Mo), aluminum (Al), copper (Cu), and combinations/stacks/alloys of these or similar materials.

After forming the one or more transistor structures in one or more corresponding sub-stacks, an additional sub-stack may be formed that includes alternating conductive and non-conductive layers, forming a memory structure. As shown in the cross-sectional view 100, the memory structure includes alternating layers of the insulating dielectric 114 and a conductive layer 108 (shown as "Metal 3" in the legend). The conductive layers 108 may be different materials than the S/D layer 112 or the gate layer 110. The conductive layers 108 may include any type of conductive material, including copper, gold, silver, platinum, nickel, tungsten, ruthenium, or other types of conductive metals or alloys. In some implementations, the conductive layers 108 may include TaN, TiN, W, WN, TiC, Ga, Gd, TiON, TaSiN, TiSiN, Mo, Al, Cu, or combinations, stacks, or alloys of these or similar materials. These alternating layers of the insulating dielectric layers 114 and the conductive layers 108 collectively form a memory structure. After forming the memory structure, a cap layer 120 may be formed. The cap layer 120 can be any type of dielectric or other non-conductive material and may serve to protect the underlying layers from the external environment. In some implementations, one or more additional transistor structures (e.g., a deselect transistor, additional logic, etc.) may be formed (e.g., using techniques similar to those described above) on the memory structure prior to forming the cap layer 120.

When forming each of the layers, layers that make up the transistor structures or memory structures may be patterned as is well understood in the art to form electrical connections between transistor structures or the memory structures. These connections may be formed by patterning the conductive layers described herein, as well as by forming vias to electrically connect different layers. As such, transistor structures and memory structures that are isolated in the x-y plane may be electrically connected with one another to form logical or electronic circuits. Although the memory structure is shown as including six alternating layers of conductive layers 108 and insulating dielectric layers 114, it should be understood that any number of alternating conductive layers 108 and insulating dielectric layers 114 may be utilized, and only a few layers are shown here for ease of visualization. For example, the memory structure may include dozens or hundreds of alternating conductive layers 108 and insulating dielectric layers 114.

Figure 2:
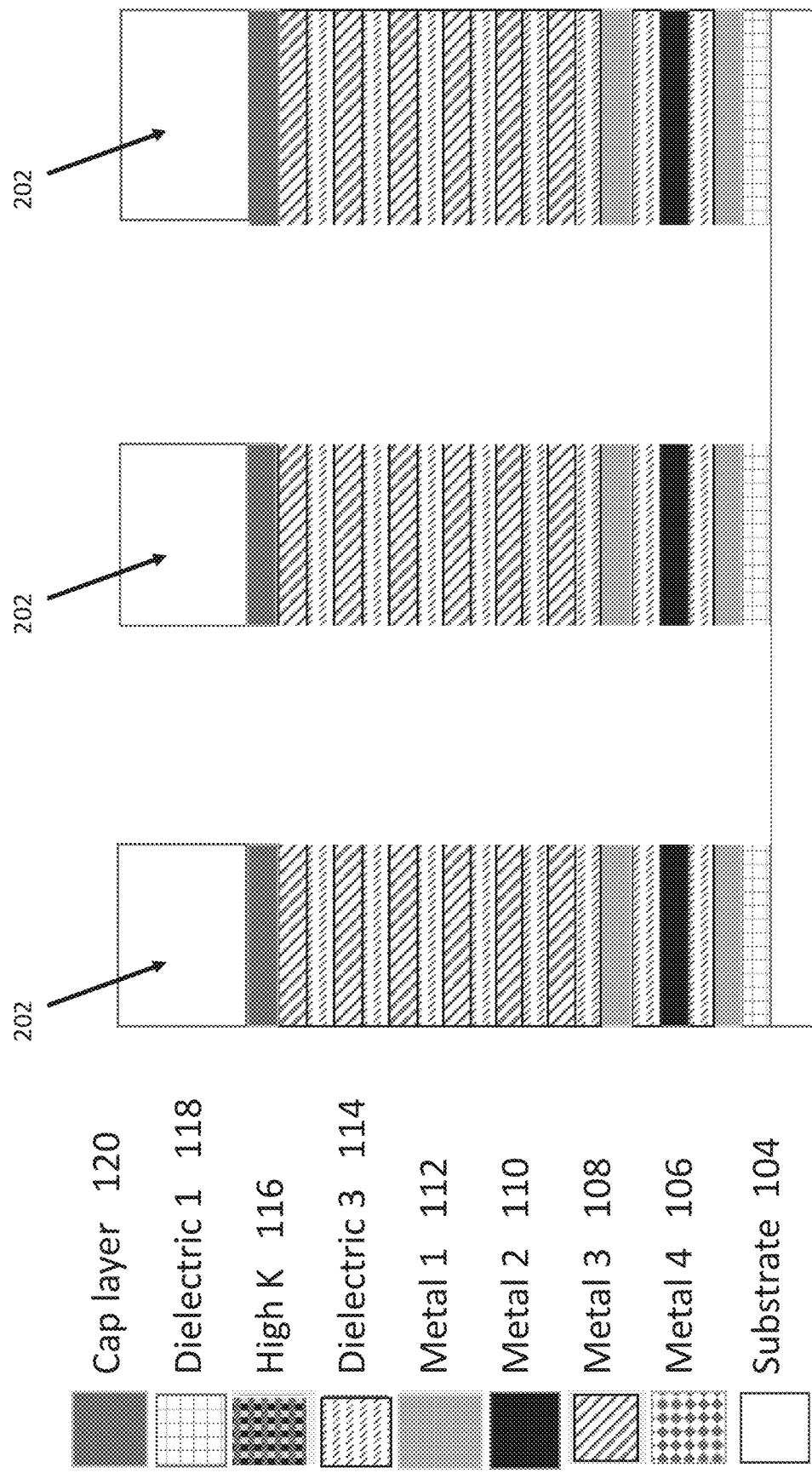

Once the stack of layers has been formed to include one or more transistor structures and one or more memory structures, the first process flow proceeds to the next stage shown in FIG. 2. FIG. 2 illustrates a cross-sectional view 200 of the device at the next stage in the first process flow. As shown, a masking material 202 is used to mask (e.g., protect) areas of interest in the stack of materials. The masking material 202 may be patterned to define a desired shape and size of one or more of channel openings in the stack of layers. Although the masking material 202 is shown here as defining two channel openings, it should be understood that any number of channel openings may be defined using a directional etching process. One or more etching techniques may be performed to remove etch away all of the material not protected by the masking material 202, down to the base layer 104. Any type of suitable etching techniques may be used, including but not limited to dry etching, wet etching, or plasma etching techniques. The masking material 202 may then be removed, or may be retained to protect the underlying surface or to remain as part of the final structure.

Figure 3:
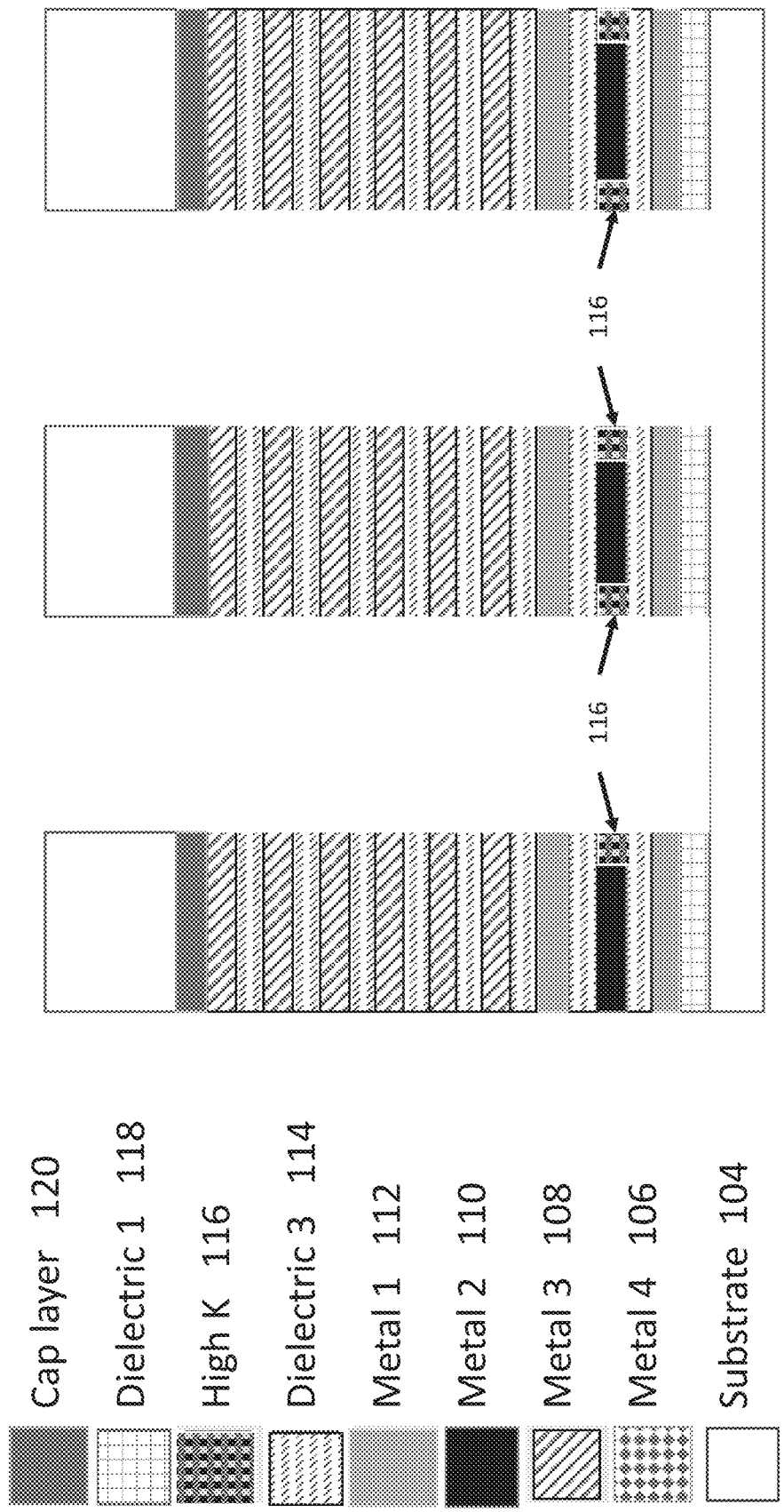

FIG. 3 illustrates a cross-sectional view 300 of the device at the next stage in the first process flow. Once etching the channel opening is complete, one or more of the gate layers 110 may be etched slightly in the x-y direction to recess the gate layers 110 from the channel openings. The etching process may be a selective etching process that etches the gate layers 110 to create recessed regions, or air gaps, of a predetermined volume, by etching the gate layers 110 (the gate metal) by a predetermined amount. A gate dielectric, such as a high-k dielectric 116 (shown as "High-K" or sometimes in other figures as "Dielectric 2" in the legend), may be selectively formed on the gate layers 110 in the channel opening. The high-k dielectric 116 may be grown or deposited such that a predetermined amount of high-k dielectric 116 fills the recessed region of the gate layers 110. Additionally or alternatively, the high-k dielectric 116 may be formed on recessed or non-recessed gate layer 110 so as to extend into the channel opening. The high-k dielectric 116 material may be selected to have desired attributes or properties, such as a desired dielectric constant. Likewise, the high-k dielectric 116 may be grown or deposited to create a predetermined separation distance between the gate layer 110 and the central channel of the transistor structure. The high-k dielectric 116 may alternatively be formed non-selectively and then etched to leave material primarily in the recessed region.

The high-k dielectric 116 may be any type of material that has a relatively large dielectric constant. As one example, a silicon oxide ($SiO_2$) gate dielectric may be selectively formed on the gate layer 110. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The resulting gate dielectric may be formed (or formed and then etched) to be slightly recessed, flush or slightly protruding relative to the channel opening depending on the desired device characteristics and process parameters. If multiple devices, such as N-type and P-type devices, are exposed in the opening, suitable dielectrics and thicknesses may be provided to each gate to achieve the desired characteristics. Deposition control may be achieved using specific materials for each gate layer 110 and selecting the gate dielectric 116 to form selectively on that gate layer.

Figure 4:
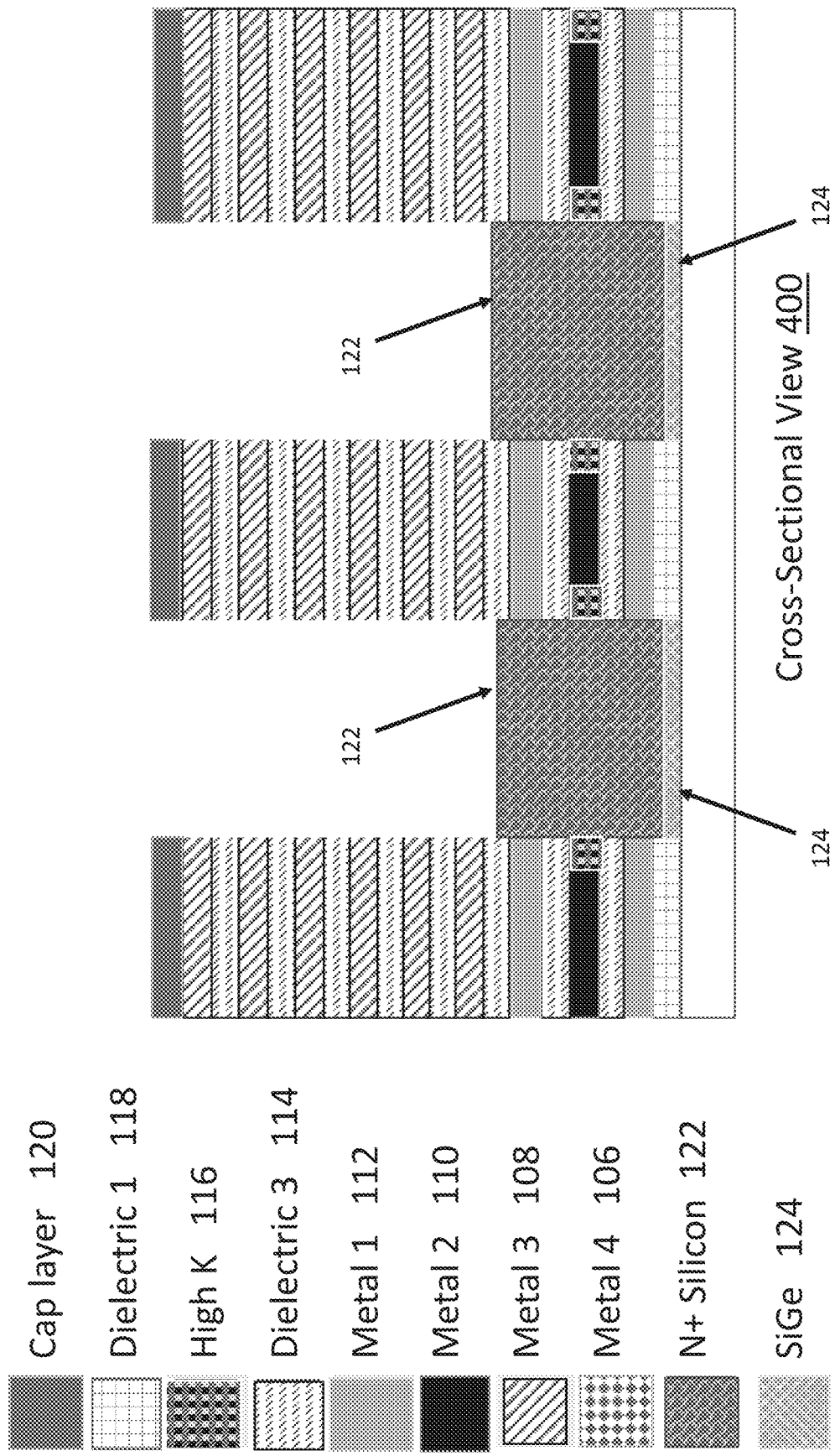

Referring to FIG. 4, illustrated is a cross-sectional view 400 of the device at the next stage in the first process flow. At this stage, a channel structure may be formed in the channel openings formed in the process flow shown in FIG. 2. The channel structure may be formed from a semiconductive behaving material 122 (shown as "N+ silicon" in the legend). The channel structure may be any type of material that can be deposited or grown in the channel opening and may sometimes be referred to as deposited material 122. The semiconductive behaving material 122 may be a silicon material and may be grown on a seed material 124 (shown as "SiGe" in the legend). The seed material 124 can be any type of material usable as a seed layer for epitaxial growth and may include SiGe. To form the semiconductive behaving material 122, a thin film of the seed material 124 may first be deposited on the base layer 104 in the channel openings. The seed material 124 can be deposited using any type of deposition technique, such as ALD, CVD, PVD, or plasma-enhanced techniques, such as plasma-enhanced CVD. In some implementations, if the base layer 104 is made of a suitable seed material, the semiconductive behaving material 122 may be grown or selectively deposited directly onto the base layer 104.

Once the seed material 124 has been deposited on the base layer 104, the semiconductive behaving material 122 can be formed on the seed material 124. The semiconductive behaving material 122 may be formed using selective deposition (e.g., selective ALD, CVD, PVD, plasma-enhanced techniques, etc.) or may be formed through epitaxial growth using the seed material 124 as a seed. In some implementations, the seed material 124 may be omitted, and the semiconductive behaving material 122 can be deposited in the channel opening on the base layer 104 or on a dielectric layer to isolate the semiconductive behaving material 122 from the base layer 104. The semiconductive behaving material 122 can be grown selectively or non-selectively deposited until the semiconductive behaving material 122 has reached a predetermined height in the channel opening. In some implementations, the semiconductive behaving material 122 may be grown or deposited to fill a portion of the channel opening, and then selectively etched to a predetermined height within the channel opening.

In some implementations, the semiconductive-behaving material 122 may be formed such that the level of the semiconductive-behaving material 122 is at or around the same level as the uppermost S/D layer 112 of the first transistor structure. In some implementations, if multiple transistor structures are formed beneath the memory structure in the stack of layers, this stage in the process flow may be repeated multiple times to create a corresponding channel structure for each transistor structure in the stack of layers. In such implementations, the semiconductive-behaving materials 122 formed for each transistor structure may be separated with one or more layers of dielectric material.

The semiconductive behaving material 122 can be any type of material with semiconductive properties. Although the example embodiments may show or describe the semiconductive material 122 as N+ silicon, the semiconductive behaving material 122 may be a semiconductive oxide, 2D material, doped silicon, or other similar material and combinations thereof. In some implementations, the semiconductive-behaving material 122 may be formed using certain elements that, when combined with oxygen, form a new material that exhibits semiconductive behavior. For example, the material can be "turned off" with a low off state leakage current or can be "turned on" and become highly conductive when voltage is applied. For example, the semiconductive-behaving material 122 may be an N-type (e.g., N+) oxide, such as $In_2O_3$, $SnO_2$, InGaZnO, ZnO, and Si, among others. Alternatively, the semiconductive-behaving material 122 may be a P-type oxide, such as SnO or P-doped silicon. Additionally or alternatively, the semiconductive-behaving material 122 may include an epitaxially grown or polycrystalline deposited semiconductor, such as Si, Ge, or GaAs, among others.

As shown in the cross-sectional view 400, in this implementation the stack of layers may include a single insulating dielectric layer 114 between the S/D layers 112 of the transistor structure and the memory structure. However, it should be understood that any number of dielectric layers may be interposed between the transistor structure and the memory structure (or other transistor structures, if present). Various parameters (e.g., thickness or shape of one or more S/D layers 112, thickness or shape of one or more layers of the gate layers 110, thickness or shape of one or more layers, thickness or shape of the high-K dielectric 116, thickness or shape of the layers of insulating dielectric 114, the diameter of the channel opening, etc.) may be selected prior to the fabrication process to create transistors or memory structures with desired properties.

Figure 5:
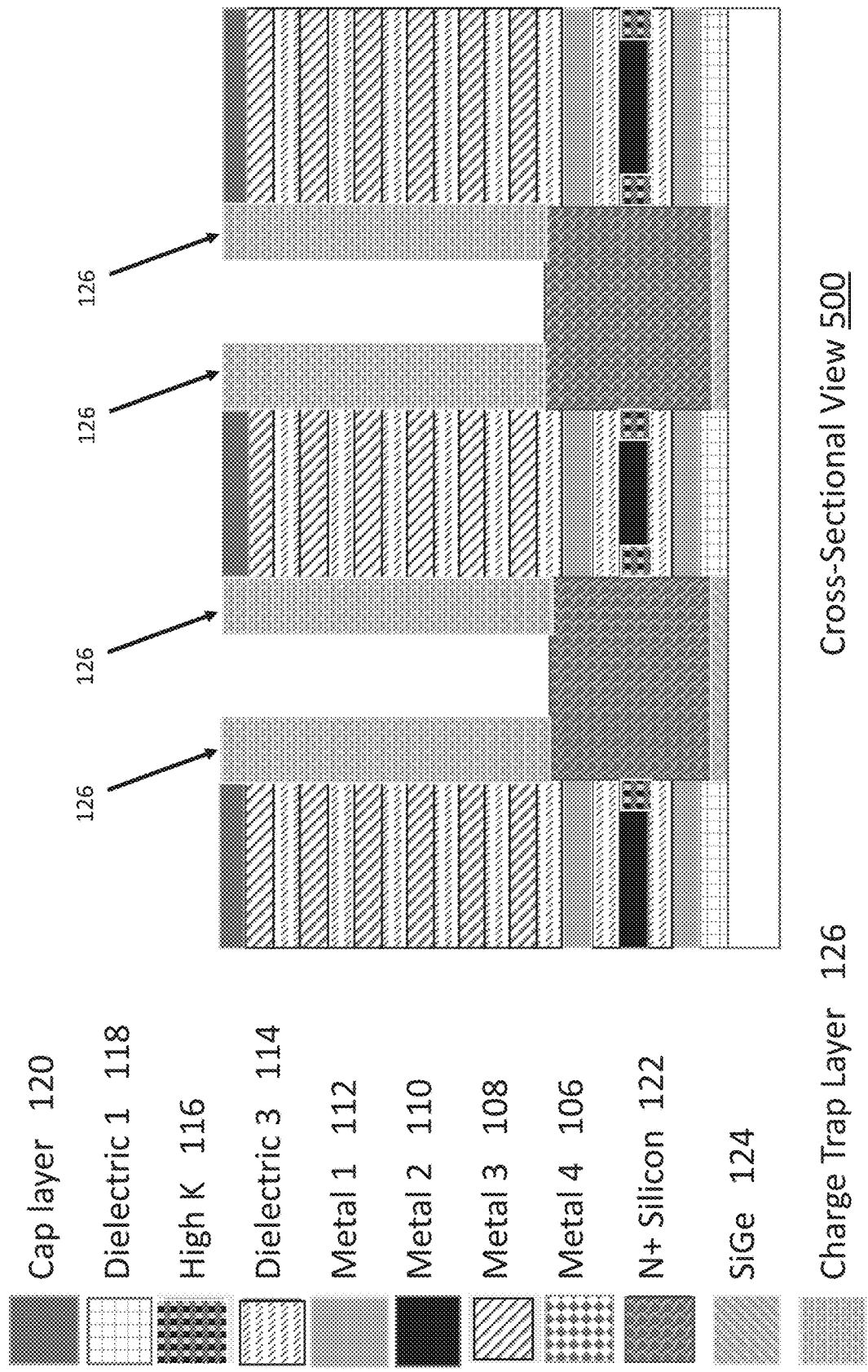

Referring to FIG. 5, illustrated is a cross-sectional view 500 of the device at the next stage in the first process flow. At this stage, a charge trap layer 126 may be formed on the layers of the memory structure in the channel openings. The charge trap layer 126 can include one or more suitable charge trapping materials, such as silicon-oxide-nitride-oxide-silicon (SONOS) materials, metal-oxide-nitride-oxide-silicon (MONOS) materials, metal-oxide-nitride-oxide-silicon (MONOS) materials, titanium-alumina-nitride-oxide-silicon (TANOS) materials, or titanium-high k dielectric-nitride-oxide-silicon (THNOS) materials, among others. The charge trap layer 126 can be created using any type of deposition, etching, or growth techniques and may be selectively formed on the materials of the memory structure in the stack of layers. In some implementations, the charge trap layer 126 may be deposited as at least two layers: one or more dielectric layers in the channel opening and in contact with the layers of the memory structure, and one or more layers of charge trap material formed on said dielectric layer.

In some implementations, the charge trap layer 126 may be deposited as at least two layers: one dielectric layer in the channel opening and in contact with the layers of the memory structure, one or more charge trap layers 126 formed on said dielectric layer, and then one or more layers of dielectric material formed in the channel opening on the charge trap layer 126. The charge trap layer 126 (and any associated dielectric layers) may be deposited or formed using any suitable technique, including ALD, CVD, PVD, or plasma enhanced techniques, among others. As shown, the charge trap layer 126, when formed, leaves an open region in the channel opening that exposes the surface of the semiconductive-behaving material 126 to an external environment. This can be used in further process steps to etch or remove material in a way that is self-aligned with the opening formed in the charge trap layer 126.

Figure 6:
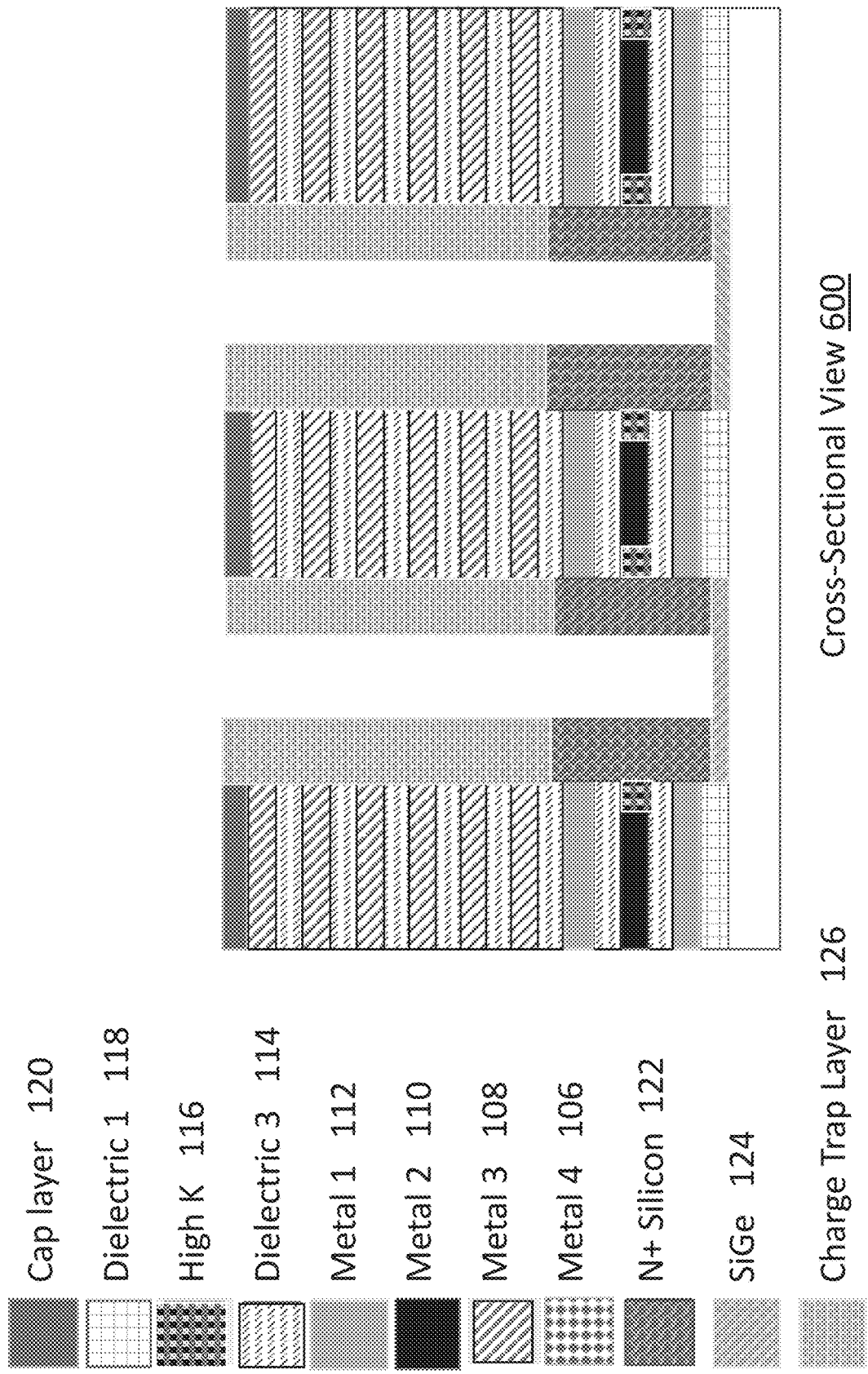

Referring to FIG. 6, illustrated is a cross-sectional view 600 of the device at the next stage in the first process flow. At this stage, the semiconductive-behaving material 122 can be etched down to the seed material 124 (or the base layer 104, if the seed layer 124 is not used). The etching process may be a selective directional etch that is selective to the semiconductive behaving material 122. The etching process may utilize the charge trap layer 126 as a self-aligning etch mask, such that a vertical etch of the semiconductive behaving material 122 creates an opening that is aligned with the opening formed by the charge trap material 126, as shown in the cross-sectional view 600. Any type of suitable etching techniques may be used, including but not limited to dry etching, wet etching, or plasma etching techniques. The etching process may be de-selective to the seed material 124, which may behave as an etch stop material.

Figure 7:
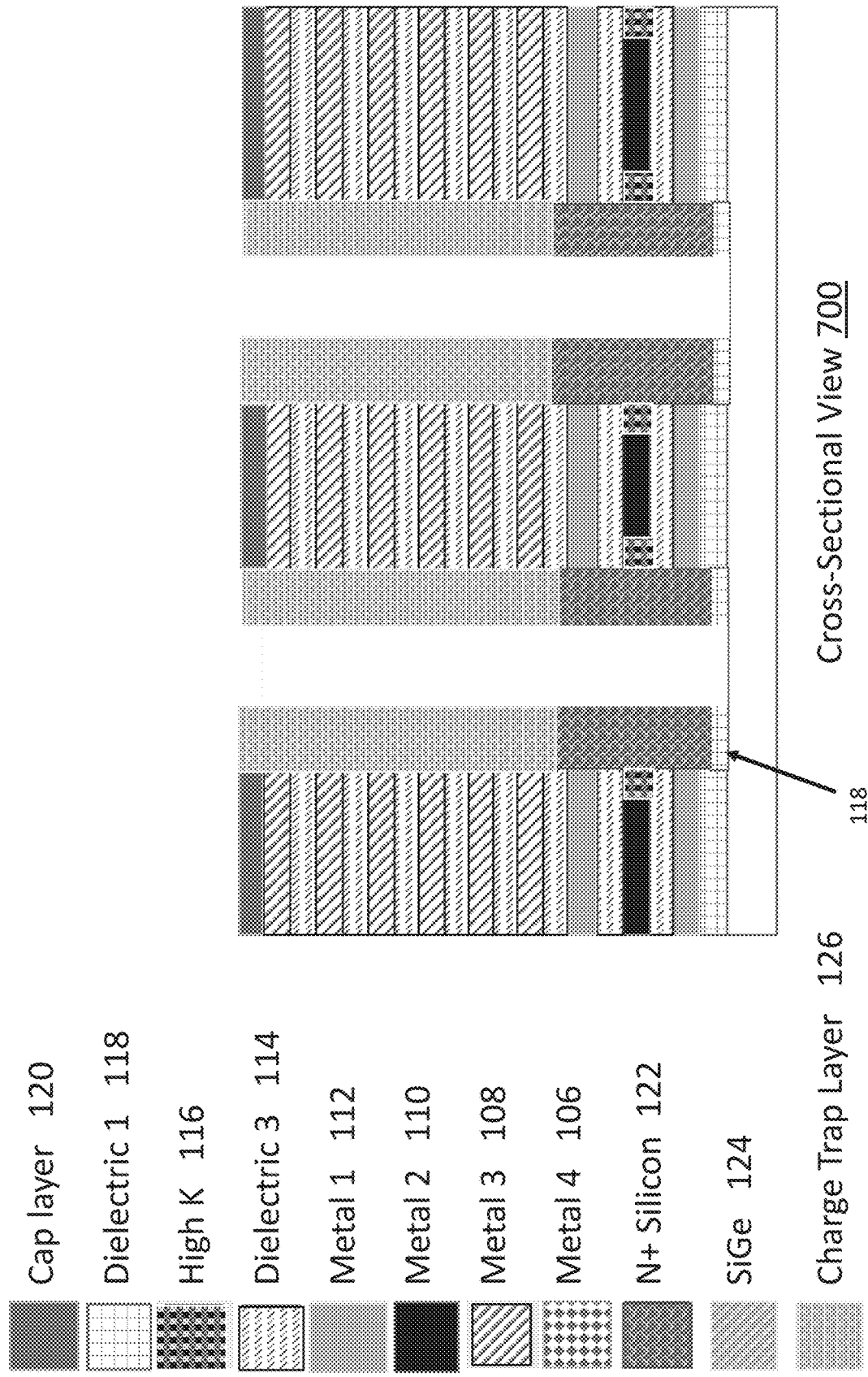

Referring to FIG. 7, illustrated is a cross-sectional view 700 of the device at the next stage in the first process flow. At this stage, the seed layer 124 (if used) can be removed using a suitable selective etching process to create an air gap. Any type of suitable selective etching techniques may be used, including but not limited to dry etching, wet etching, or plasma etching techniques. The etching process may be selective to the seed layer 124, or a protective mask layer may be provided that prevents the etching process from etching any other material in the stack of layers. Once the seed layer 124 has been removed, the resulting air gap can be filled with the dielectric material 118. The dielectric material 118 may be formed in the air gap using any suitable material deposition technique. In some implementations, the air gap left by removing the seed layer 124 can remain in the final device configuration without filling the air gap with the dielectric material 118.

Figure 8:
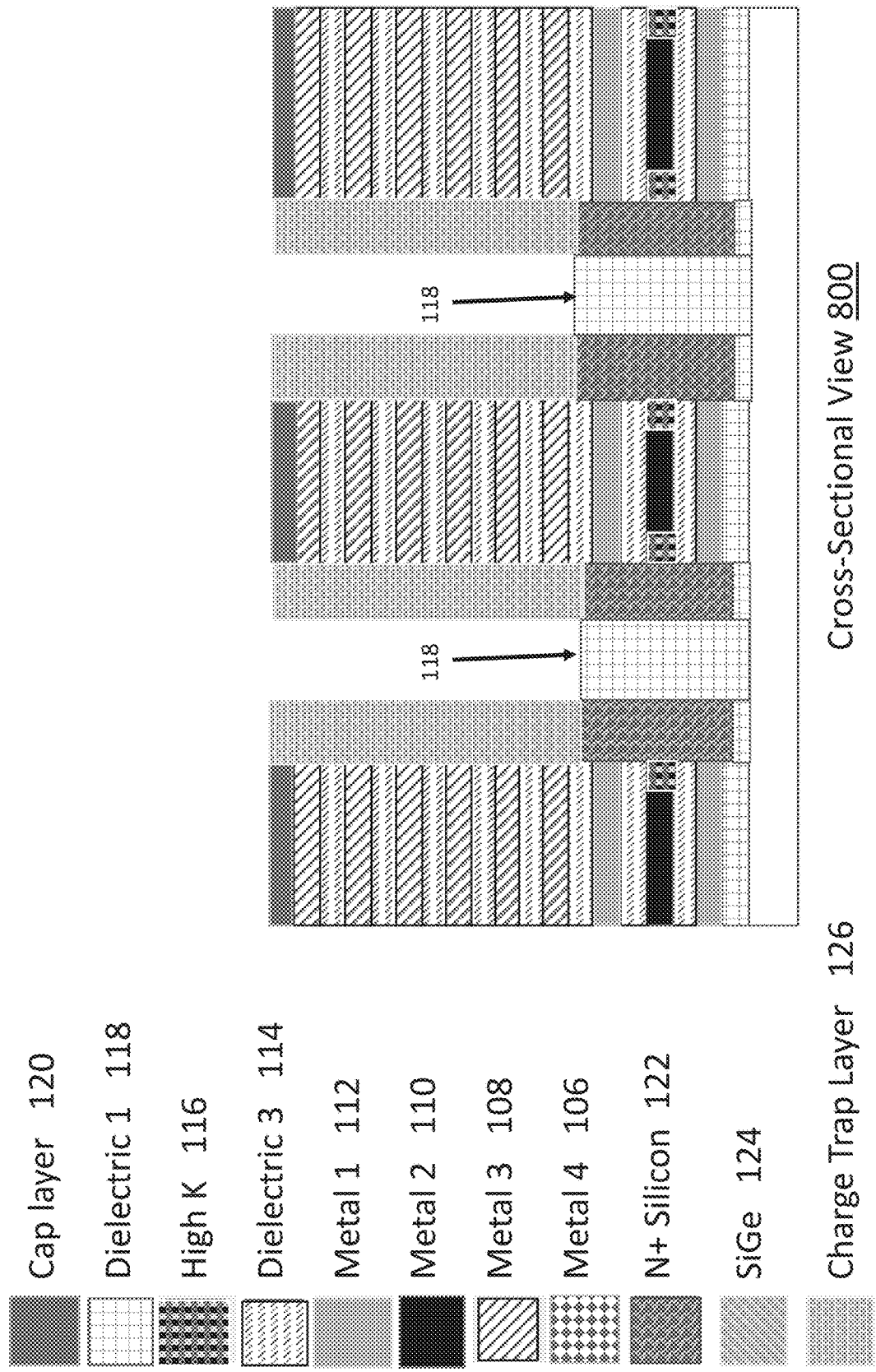

Referring to FIG. 8, illustrated is a cross-sectional view 800 of the device at the next stage in the first process flow. At this stage, the opening etched in the semiconductive-behaving material 122 formed in the process flow step described in connection with FIG. 6 can be filled with the dielectric material 118. The dielectric material 118 may be formed using any suitable technique, such as ALD, CVD, PVD, or plasma-enhanced techniques, among others. The dielectric material 118 may be deposited until the dielectric material 118 is flush with the top of the semiconductive-behaving material 122 (e.g., a predetermined height). In some implementations, a larger portion of the channel opening may be filled with the dielectric material 118, and then the dielectric material 118 may be etched to a predetermined height. In some implementations, a chemical-mechanical polish (CMP) process may be used prior to or during the formation of the dielectric material 118 in the channel opening. In some implementations, the dielectric 118 may be etched or formed to a height that leaves a portion of the semiconductive-behaving material 122 exposed in the central channel.

Figure 9:
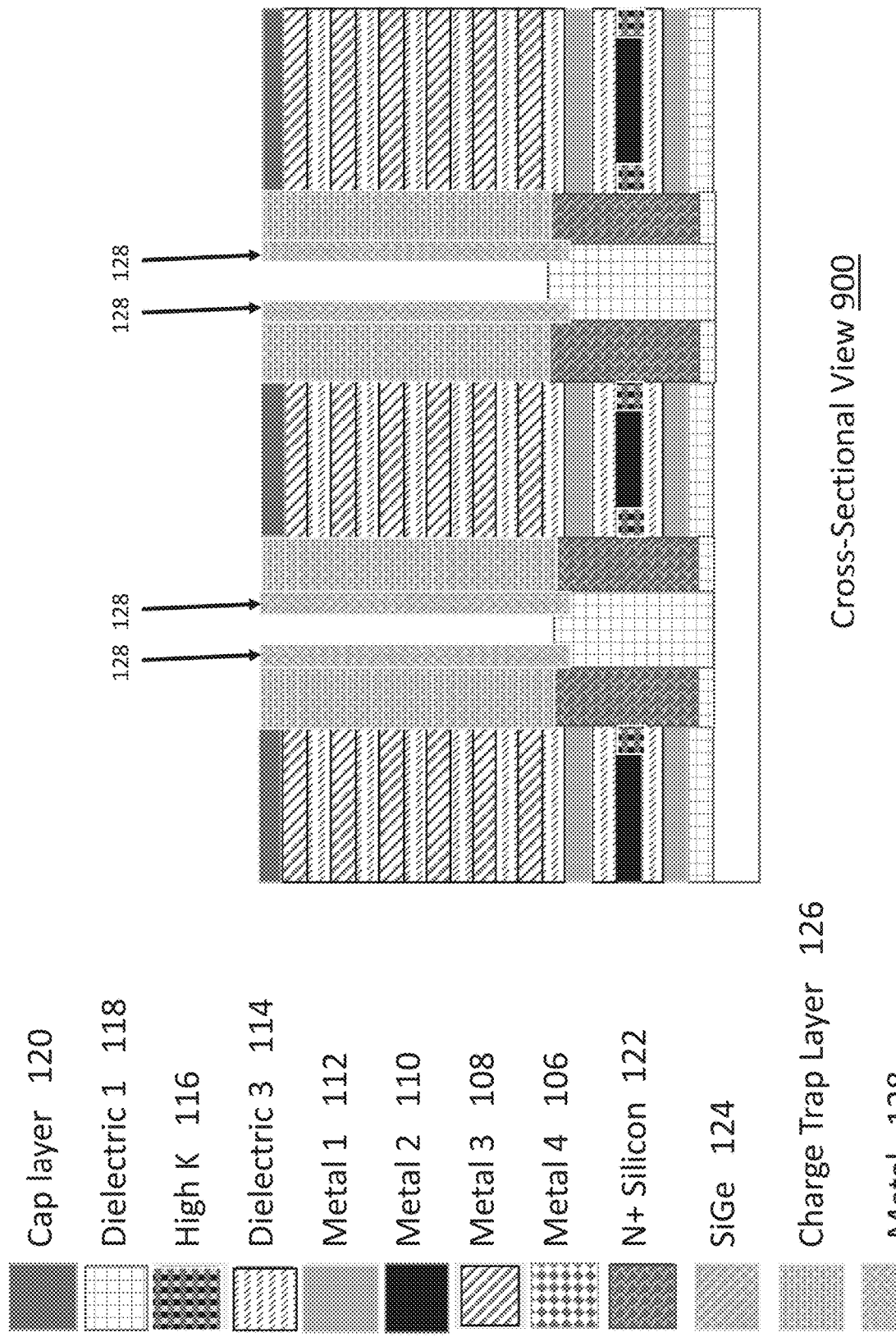

Referring to FIG. 9, illustrated is a cross-sectional view 900 of the device at the next stage in the first process flow. At this stage, a metal material 128 (shown as "Metal" in the legend), may be formed in the opening of the device in contact with the charge trap layer 126. The metal material 128 may also be in contact with an upper portion of the semiconductive behaving material 122, such that the transistor structure may be used to read information stored in the charge trap layer 126 of the memory structure. The metal material 128 may be deposited in the opening using any suitable material formation technique, including ALD, CVD, PVD, plasma-enhanced techniques, or other techniques. In some implementations, the metal material 128 can be selectively grown on the charge trap material. A further opening may be etched down to the dielectric material 118 in the core of the semiconductive behaving material 122, as shown in the cross-sectional view 900.

Figure 10:
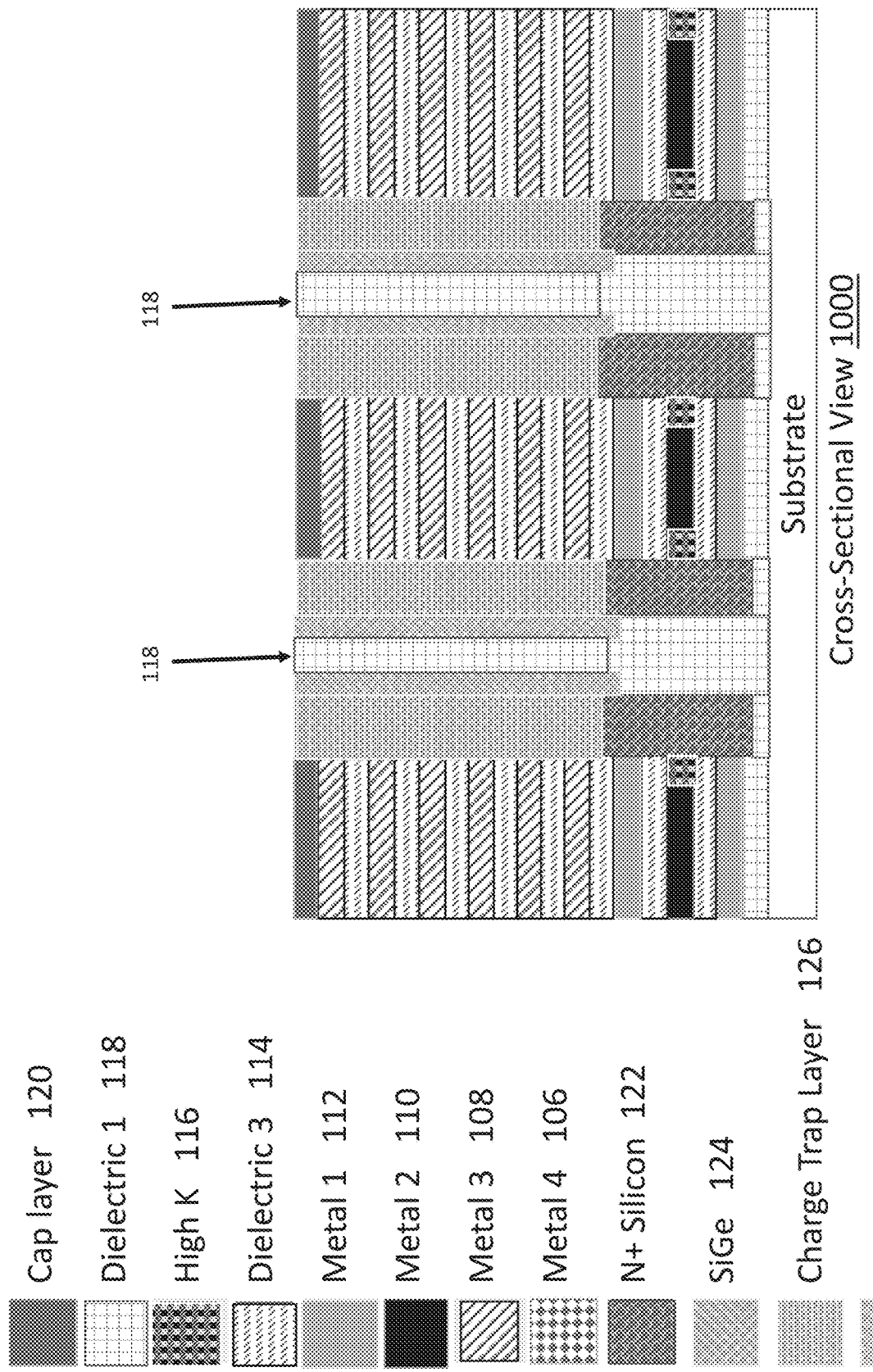

Referring to FIG. 10, illustrated is a cross-sectional view 1000 of the device at the next stage in the first process flow. At this stage, a dielectric material 118 can be deposited to fill the channel opening, in contact with the metal material 128. The dielectric material 118 may be formed using any suitable technique, such as ALD, CVD, PVD, or plasma-enhanced techniques, among others. The dielectric material 118 may be deposited until the dielectric material 118 is flush with the top of the device and can fill any air gaps in the channel opening. In some implementations, a CMP process may be used after the formation of the dielectric material 118 in the channel opening.

Figure 11:
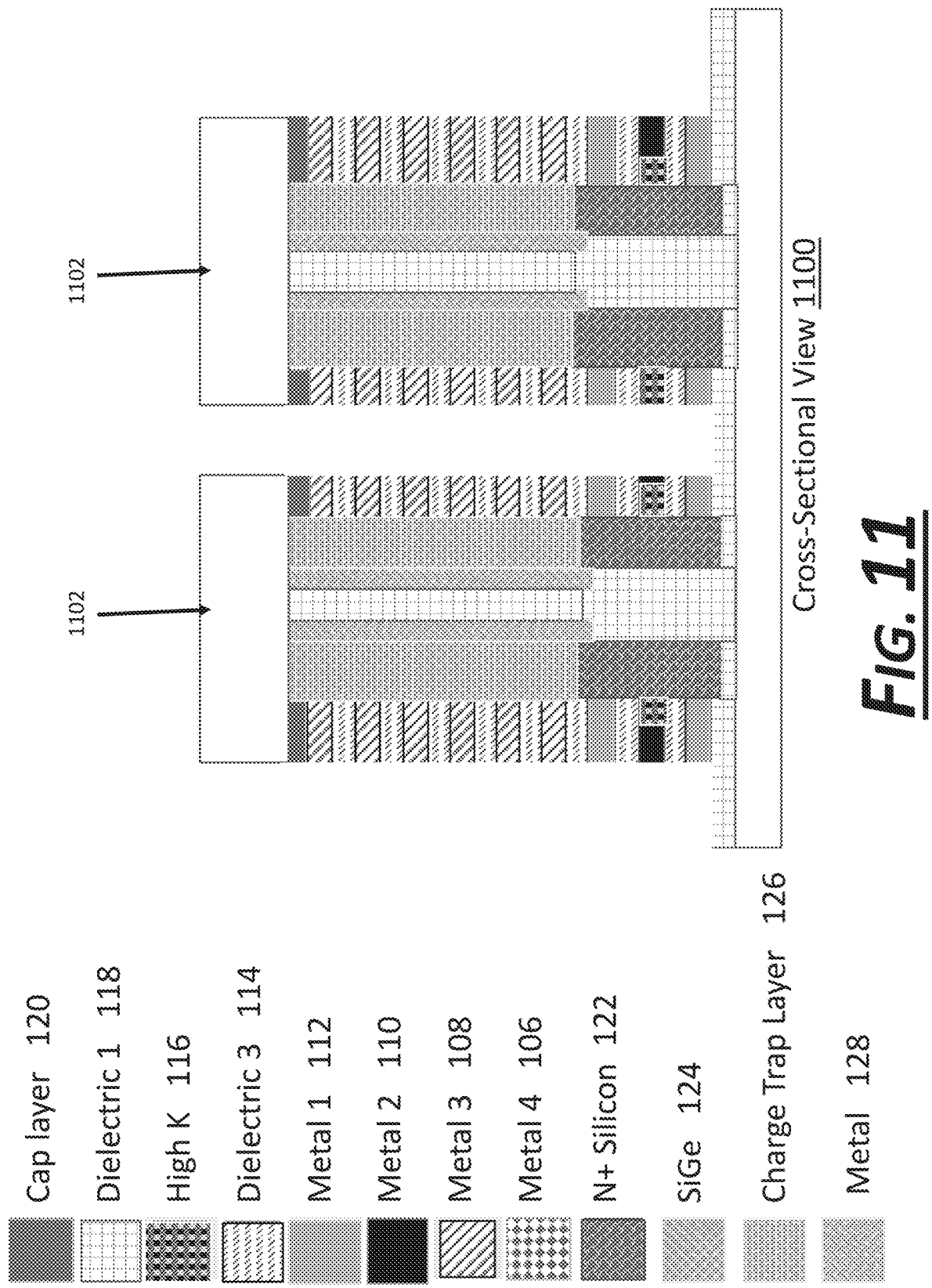

Referring to FIG. 11, illustrated is a cross-sectional view 1100 of the device at the next stage in the first process flow. At this stage, a masking material 1102 is used to mask (e.g., protect) areas of interest in the stack of materials. The masking material 1102 may be patterned to define a desired shape and size of one or more 3D NAND structures in the stack of layers. Although the masking material 1102 is shown here as defining two structures, it should be understood that any number of 3D NAND structures may be formed with integrated logic as described herein. Similarly, the etching processes may be formed to create one or more word lines in the material stack. The word lines may be defined using a directional etching process. One or more etching techniques may be performed to remove etch away all of the material not protected by the masking material 1102, down to the dielectric layer 118 formed on the base layer 104. In some implementations, the word line etching process may etch the stack of layers down to the base layer 104. Any type of suitable etching techniques may be used, including but not limited to dry etching, wet etching, or plasma etching techniques. The masking material 1102 may then be removed, or may be retained to protect the underlying surface or to remain as part of the final structure.

Figure 12:
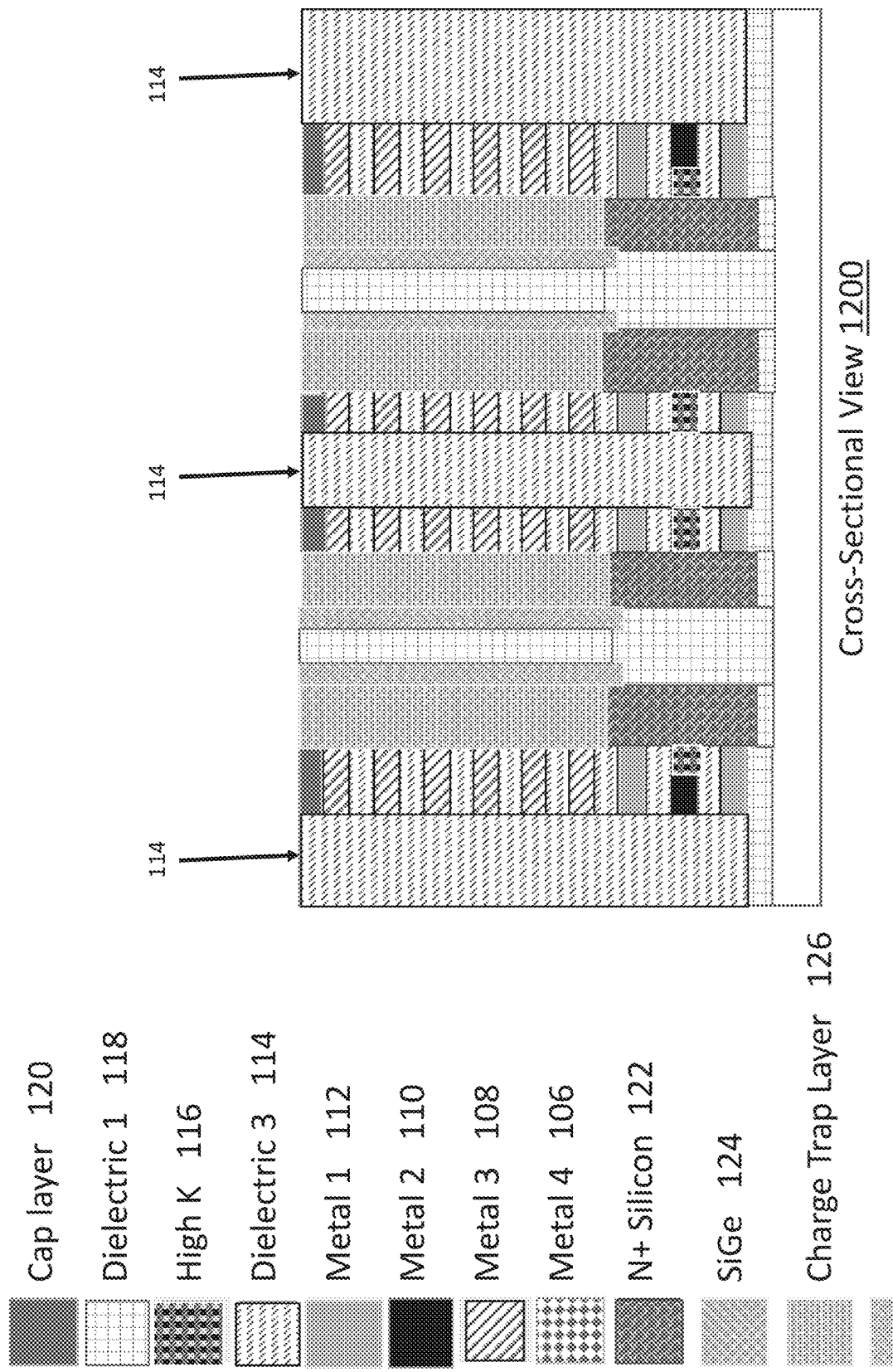

Referring to FIG. 12, illustrated is a cross-sectional view 1200 of the device at the next stage in the first process flow. At this stage, a dielectric material 114 is provided in the openings formed when etching the word lines in the previous step in the process flow. The dielectric material 114 may be formed using any suitable technique, such as ALD, CVD, PVD, or plasma-enhanced techniques, among others. The dielectric material 114 may be deposited until the dielectric material 114 is flush with the top of the device. In some implementations, a CMP process may be used after the formation of the dielectric material 114 in the openings formed from the word line etch.

Figure 13:
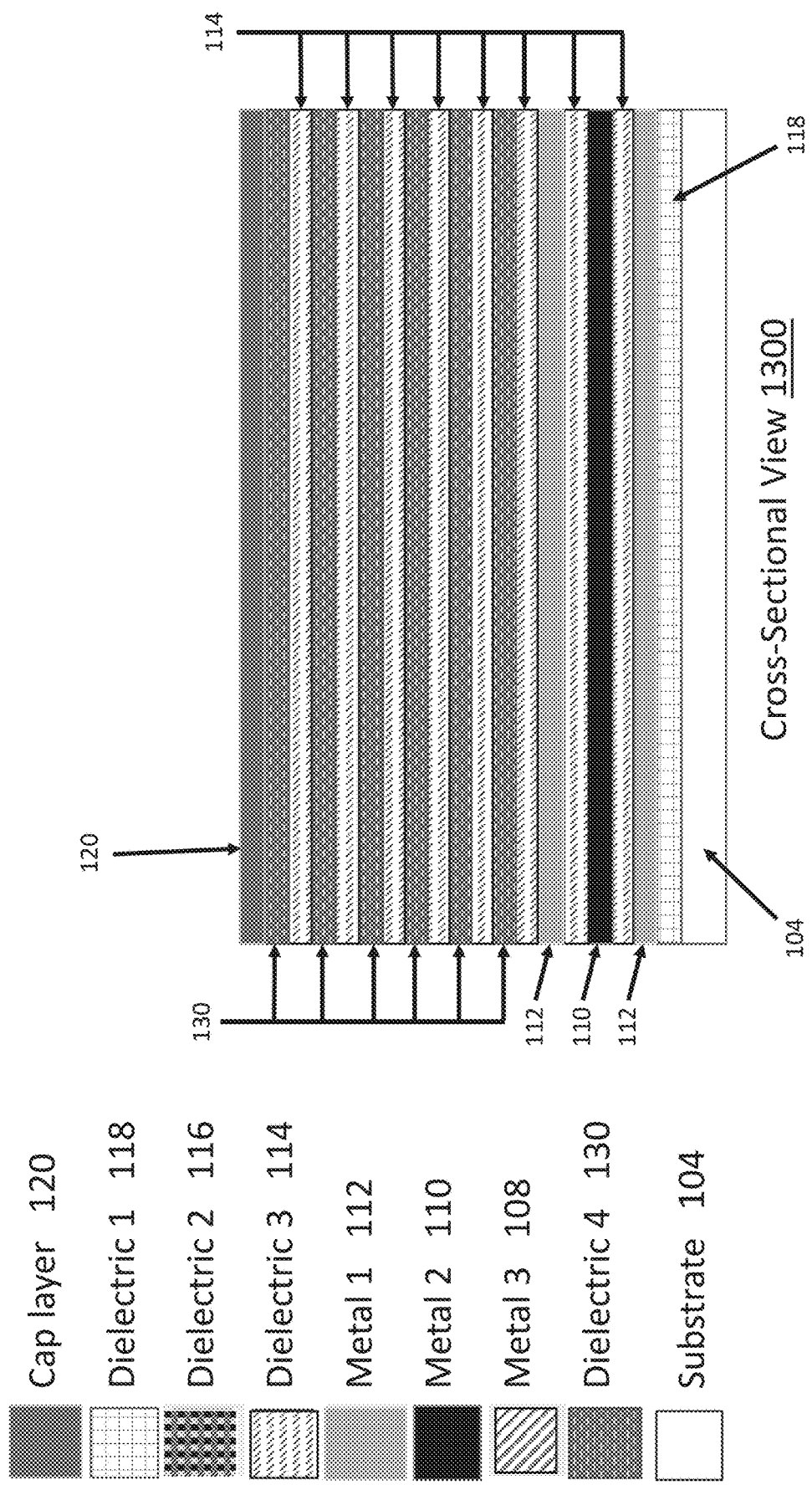

FIGS. 13-23 show cross-sectional views of a second process flow to form 3D NAND floating gate memory circuits integrated with 3D vertical semiconductor devices, according to an embodiment. Referring to FIG. 13, illustrated is a cross-sectional view 1300 of a device. The material stack shown in FIG. 13 may be similar to that shown in FIG. 1, but with different materials formed for the memory structure. At the start of the second process flow, a first layer of dielectric 118 is deposited on top of a base layer 104. As described above, the techniques described herein may be implemented without requiring epitaxial growth, and therefore the base layer 104 may be any type of material capable of binding to the dielectric 118. The base layer 104 may be active or passive and may comprise dielectric, conductive, or semiconductive materials or any combination thereof. The dielectric 118 may be any type of dielectric material or otherwise non-conductive material that is capable of being disposed, patterned, or otherwise provided on top of the base layer 104. Some examples of dielectric materials can include, but are not limited to, oxide materials. The substrate 104 may remain in the final structure or may be removed during or after the formation of the devices described herein.

As used with respect to the second process flow of FIGS. 13-23, the terms "first," "second," "third," and "fourth" refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 118 (sometimes referred to herein as a "first dielectric layer") is deposited on top of the base layer 104, a first transistor structure may be formed using alternating layers of conductive and non-conductive material layers.

The first S/D layer 112 may be formed directly on the base layer 104 (e.g., if the base layer 104 is non-conductive), or on the one or more dielectric layers 118 described above. The S/D layers 112 may be any type of conductive material, such as a metal, suitable to form a source or drain electrode in a semiconductor device. Some examples of such materials include, but are not limited to copper, gold, silver, platinum, nickel, tungsten, ruthenium, or other types of conductive metals or alloys. An insulating dielectric 114 is formed on the first S/D layer 112, after the first S/D layer 112 has been formed.

A gate layer 110 may then be formed on top of the first insulating dielectric layer 114. A second insulating dielectric layer 114, and then a second S/D layer 112, is then formed on the gate layer 112. The gate layer 110 may be a different material than the first and second S/D layers 112. A third insulating dielectric layer 114 may then be formed on top of the second S/D layer 114 to complete a first transistor structure. In some implementations, multiple transistor structures may be formed on top of one another prior to forming the material stacks for memory structures, as described herein. In a multi-transistor stack, the foregoing layers (not necessarily including the base layer 104) would constitute a first sub-stack. As shown in the cross-sectional view 1300, a transistor structure can include four dielectric layers (with the first transistor having one dielectric layer be the dielectric layer 118, which separates the first transistor structure from the substrate 104) and three conductive metal layers (the two S/D layers 112 and one gate layer 110).

Subsequent transistor structures (e.g., second sub-stacks, third sub-stacks, etc.) may be stacked above the first transistor structure, by depositing similar layers. One or more insulating dielectric layers 114 may be deposited between adjacent transistor structures. These layers in the stack of layers may be formed without a mask, such that each layer forms a blanket layer over the prior layer. The gate layers 110 may be a different material than the S/D layers 112 to allow selectivity in etch and deposition processes. Moreover, the gate layer for a P-type device may be selected to be different from the gate layer 110 of an N-type device. A non-exhaustive list of potential materials to use for the gate layer includes Ru, TaN, TiN, W, WN, TiC, Ga, Gd, TiON, TaSiN, TiSiN, Mo, Al, Cu, and combinations, stacks, or alloys of these or similar materials.

After forming the one or more transistor structures in one or more corresponding sub-stacks, an additional sub-stack may be formed that includes alternating conductive and non-conductive layers, forming a memory structure. As shown in the cross-sectional view 1300, the memory structure includes alternating layers of the insulating dielectric 114 and a different dielectric 130 (shown as "Dielectric 4" in the legend). The different dielectric 130 may be different from the other dielectric materials (e.g., the dielectric material 114, the dielectric material 118, the high-k dielectric 116, etc.) in the stack of layers. These alternating layers of the insulating dielectric layers 114 and the different dielectric 130 collectively form a memory structure (e.g., a foundation for a memory structure that is formed by replacing one or more of the insulating dielectric layers 114 in later process steps). After forming the memory structure, a cap layer 120 may be formed. The cap layer 120 can be any type of dielectric or other non-conductive material and may serve to protect the underlying layers from the external environment. In some implementations, one or more additional transistor structures (e.g., a deselect transistor, additional logic, etc.) may be formed (e.g., using techniques similar to those described above) on the memory structure prior to forming the cap layer 120.

When forming each of the layers, layers that make up the transistor structures or memory structures may be patterned as is well understood in the art to form electrical connections between transistor structures or the memory structures. These connections may be formed by patterning the conductive layers described herein, as well as by forming vias to electrically connect different layers. As such, transistor structures and memory structures that are isolated in the x-y plane may be electrically connected with one another to form logical or electronic circuits. Although the memory structure is shown as including six alternating layers of the different dielectric layers 130 and the insulating dielectric layers 114, it should be understood that any number of alternating different dielectric layers 130 and insulating dielectric layers 114 may be utilized, and only a few layers are shown here for ease of visualization. For example, the memory structure may include dozens or hundreds of alternating different dielectric layers 130 and insulating dielectric layers 114.

Figure 14:
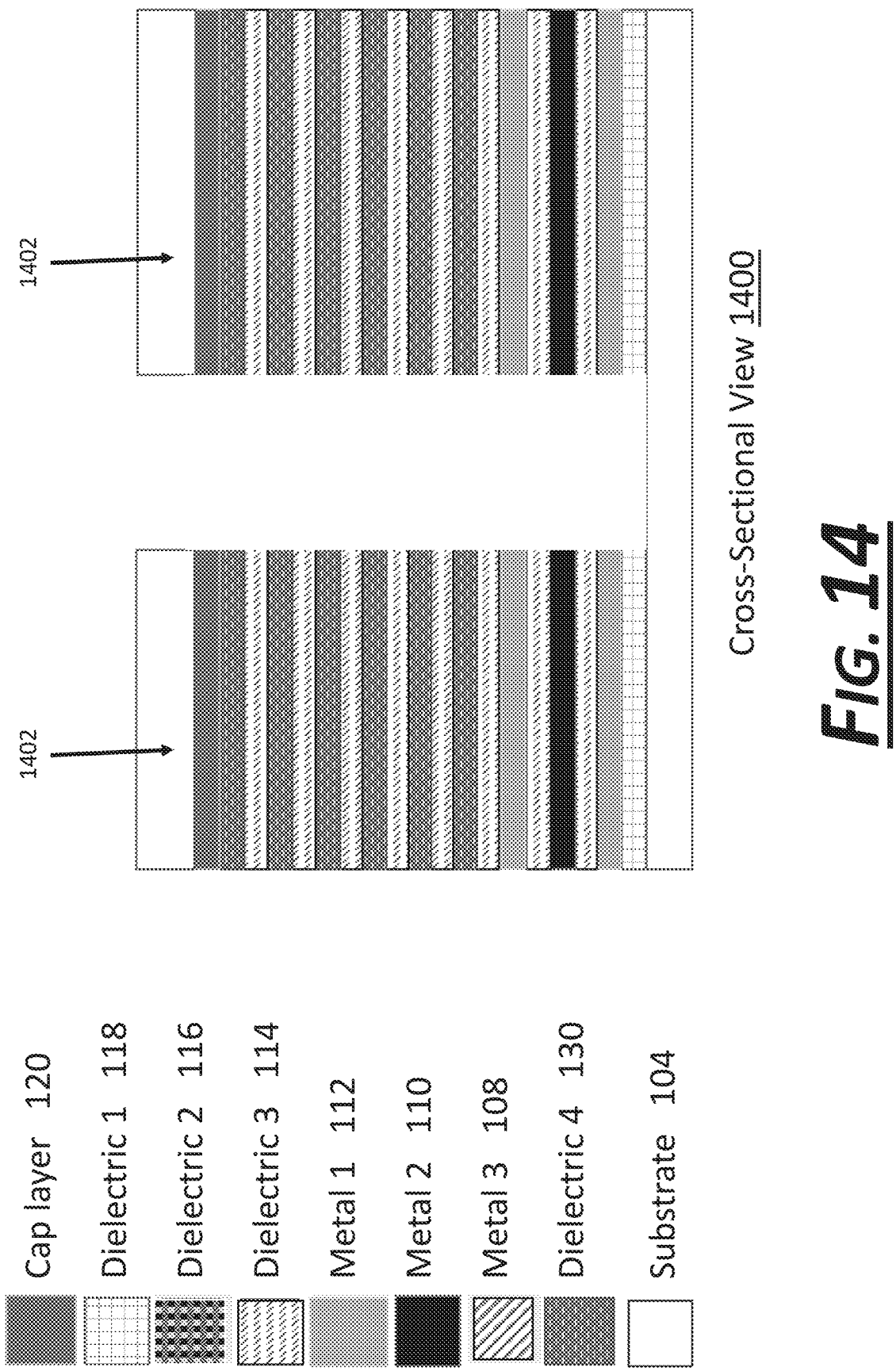

Once the stack of layers has been formed to include one or more transistor structures and one or more memory structures, the second process flow proceeds to the next stage shown in FIG. 14. Referring to FIG. 14, illustrated is a cross-sectional view 1400 of the device at the next stage in the second process flow. As shown, a masking material 1402 is used to mask (e.g., protect) areas of interest in the stack of materials. The masking material 1402 may be patterned to define a desired shape and size of one or more of channel openings in the stack of layers formed in the previous process flow step. Although the masking material 1402 is shown here as defining one channel opening, it should be understood that any number of channel openings may be defined using a directional etching process. One or more etching techniques may be performed to remove etch away all of the material not protected by the masking material 1402, down to the base layer 104. Any type of suitable etching techniques may be used, including but not limited to dry etching, wet etching, or plasma etching techniques. The masking material 1402 may then be removed, or may be retained to protect the underlying surface or to remain as part of the final structure.

Figure 15:
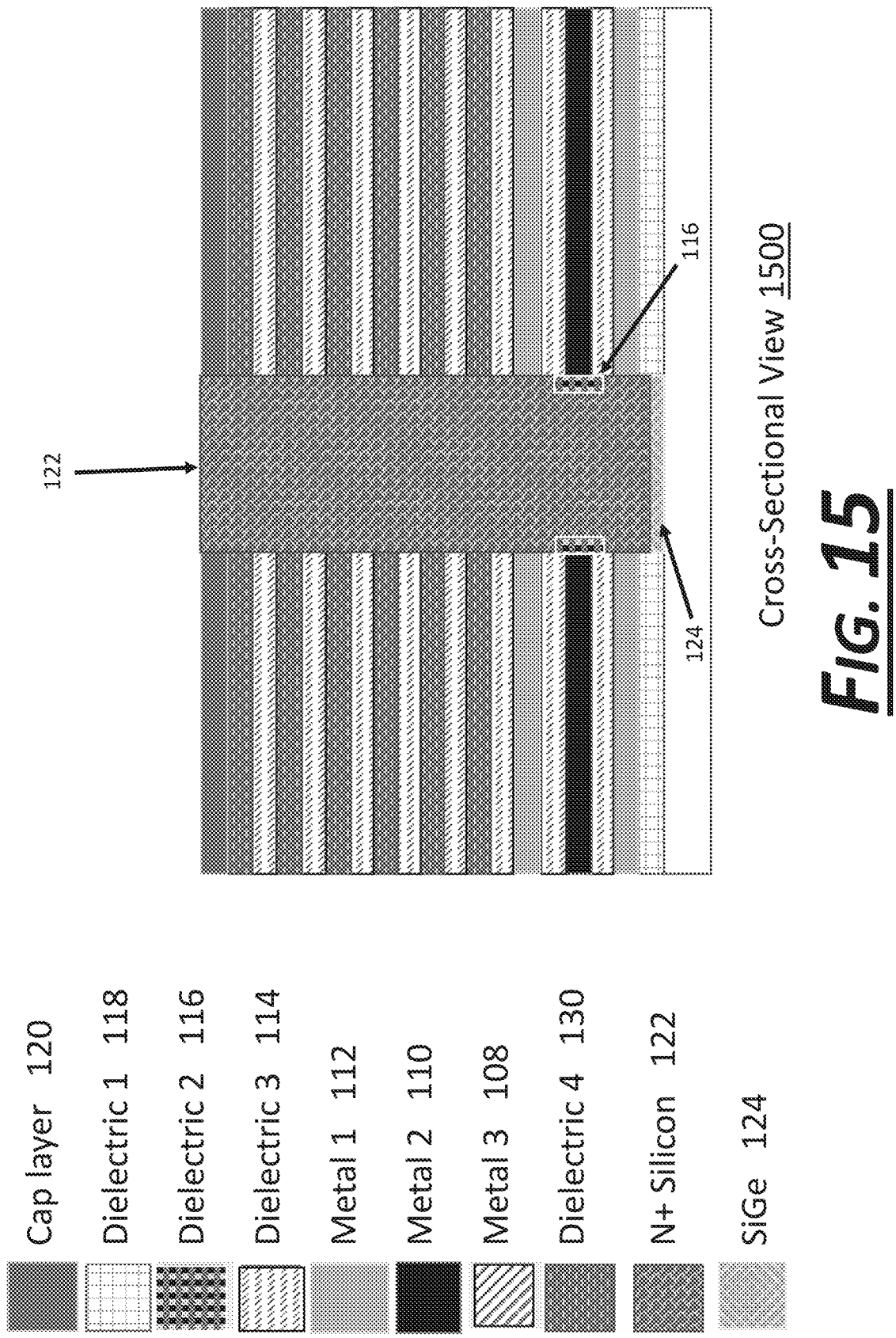

Referring to FIG. 15, illustrated is a cross-sectional view 1500 of the device at the next stage in the second process flow. Once etching the channel opening is complete, a gate dielectric, such as a high-k dielectric 116 (shown as "Dielectric 2" in the legend), may be selectively formed on the gate layers 110 in the channel opening. The high-k dielectric 116 may be grown or deposited such that the gate layer 110 extends into the channel opening, for example, by a predetermined amount. The high-k dielectric 116 material may be selected to have desired attributes or properties, such as a desired dielectric constant. Likewise, the high-k dielectric 116 may be grown or deposited to create a predetermined separation distance between the gate layer 110 and the central channel of the transistor structure. If multiple devices, such as N-type and P-type devices, are exposed in the opening, suitable dielectrics and thicknesses may be provided to each gate to achieve the desired characteristics. Deposition control may be achieved using specific materials for each gate layer 110 and selecting the gate dielectric 116 to form selectively on that gate layer 110.

Once the high-k dielectric 116 has been deposited, a channel structure can be formed in the channel opening. The channel structure may be formed from a semiconductive behaving material 122 (shown as "N+ silicon" in the legend). The channel structure may be any type of material that can be deposited or grown in the channel opening and may sometimes be referred to as deposited material 122. The semiconductive behaving material 122 may be a silicon material and may be grown on a seed material 124 (shown as "SiGe" in the legend). The seed material 124 can be any type of material usable as a seed layer for epitaxial growth and may include SiGe. To form the semiconductive behaving material 122, a thin film of the seed material 124 may first be deposited on the base layer 104 in the channel openings. The seed material 124 can be deposited using any type of deposition technique, such as ALD, CVD, PVD, or plasma-enhanced techniques such as plasma-enhanced CVD. In some implementations, if the base layer 104 is made of a suitable seed material, the semiconductive behaving material 122 may be grown or selectively deposited directly onto the base layer 104.

Once the seed material 124 has been deposited on the base layer 104, the semiconductive behaving material 122 can be formed on the seed material 124. The semiconductive behaving material 122 may be formed using selective deposition (e.g., selective ALD, CVD, PVD, plasma-enhanced techniques, etc.) or may be formed through epitaxial growth using the seed material 124 as a seed. In some implementations, a seed material 124 may be not be used and the semiconductive behaving material 122 can be deposited in the channel opening on the base layer 104. The semiconductive behaving material 122 can be grown or selectively deposited until the semiconductive behaving material 122 has filled the channel opening.

Figure 16:
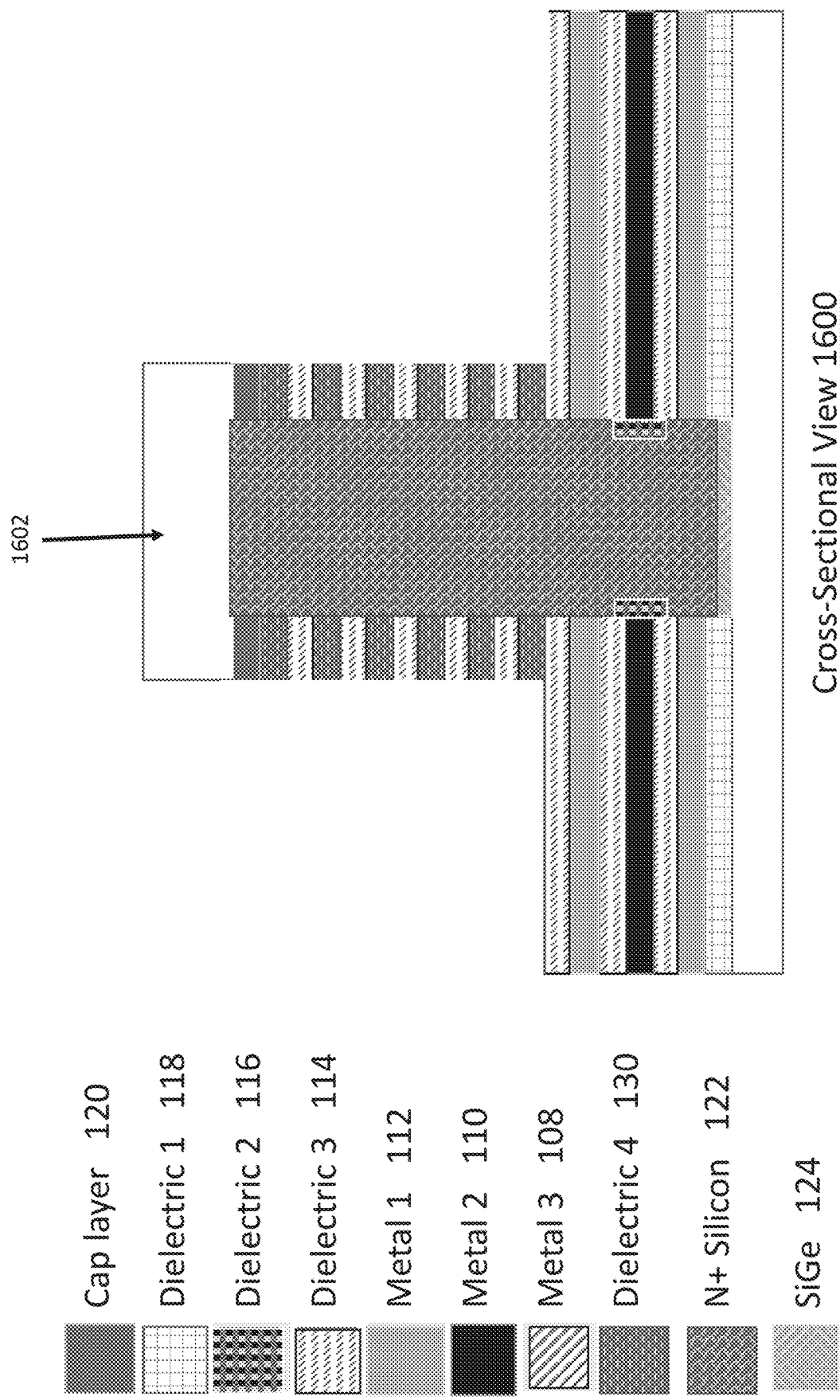

Referring to FIG. 16, illustrated is a cross-sectional view 1600 of the device at the next stage in the second process flow. At this stage, a masking material 1602 is used to mask (e.g., protect) areas of interest in the stack of materials. The masking material 1602 may be patterned to define a desired shape and size of one or more 3D NAND structures in the stack of layers. Although the masking material 1602 is shown here as defining on structure, it should be understood that any number of 3D NAND structures may be formed with integrated logic as described herein. One or more etching techniques may be performed to remove etch away all of material not protected by the masking material 1602, down to the insulating dielectric layer 114 that separates the second S/D layer 112 of the transistor structure from the first different dielectric layer 130 of the memory structure. Any type of suitable etching techniques may be used, including but not limited to dry etching, wet etching, or plasma etching techniques. The masking material 1602 may then be removed, or may be retained to protect the underlying surface or to remain as part of the final structure.

Figure 17:
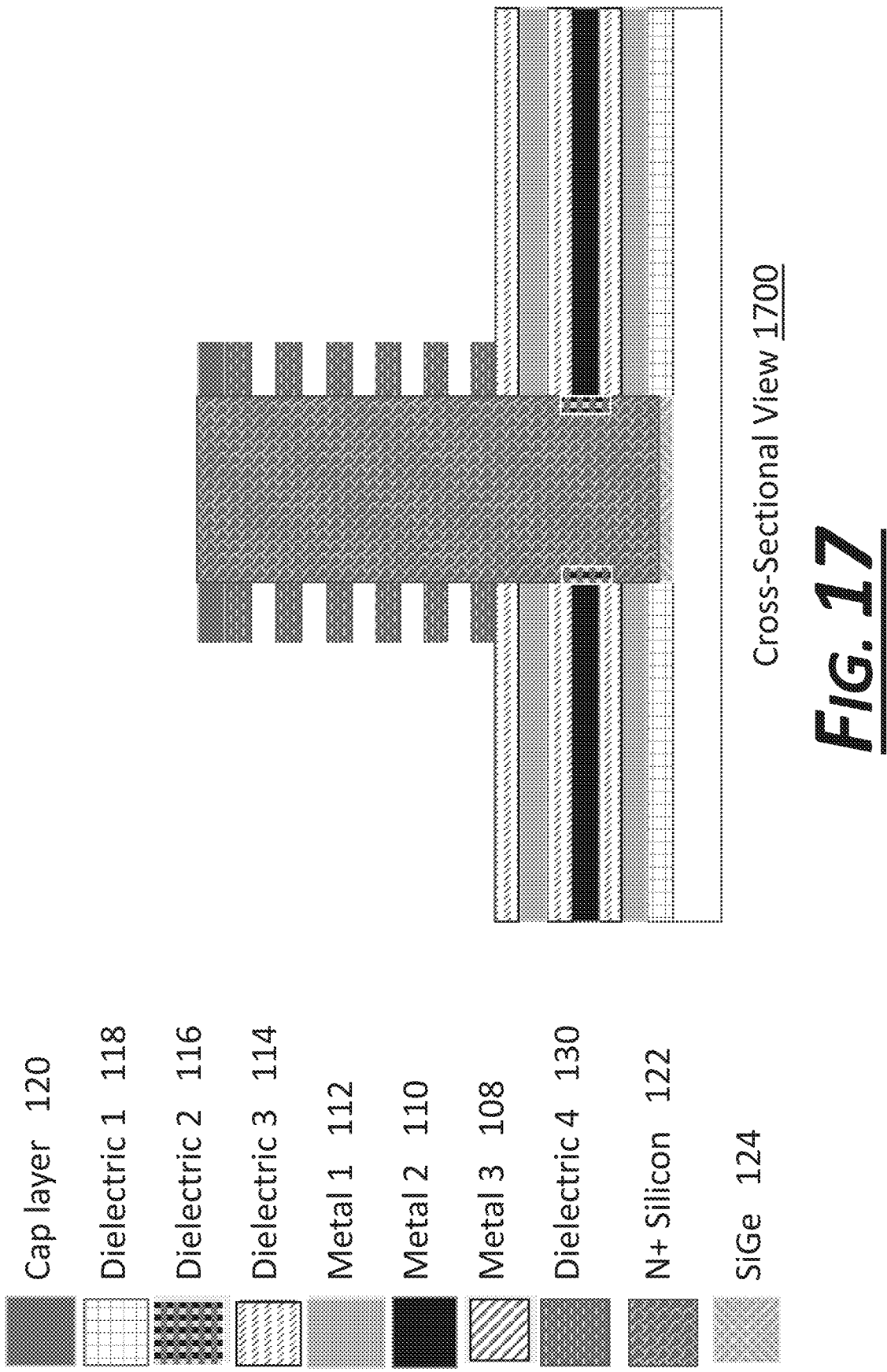

Referring to FIG. 17, illustrated is a cross-sectional view 1700 of the device at the next stage in the second process flow. At this stage, the insulating dielectric layers 114 that make up the memory structure may be removed using an etching process. Any type of suitable etching techniques may be used, including but not limited to dry etching, wet etching, or plasma etching techniques. When performing the etching process, the one or more insulating dielectric layers 114 separating the transistor structure from the memory structure may be protected by a mask material (not shown). As shown, when the insulating dielectric layers 114 in the memory layer are removed, air gaps are left between the layers of the different dielectric material 130. These air gaps can be filled with floating gates and gate contact metal in subsequent process steps.

Figure 18:
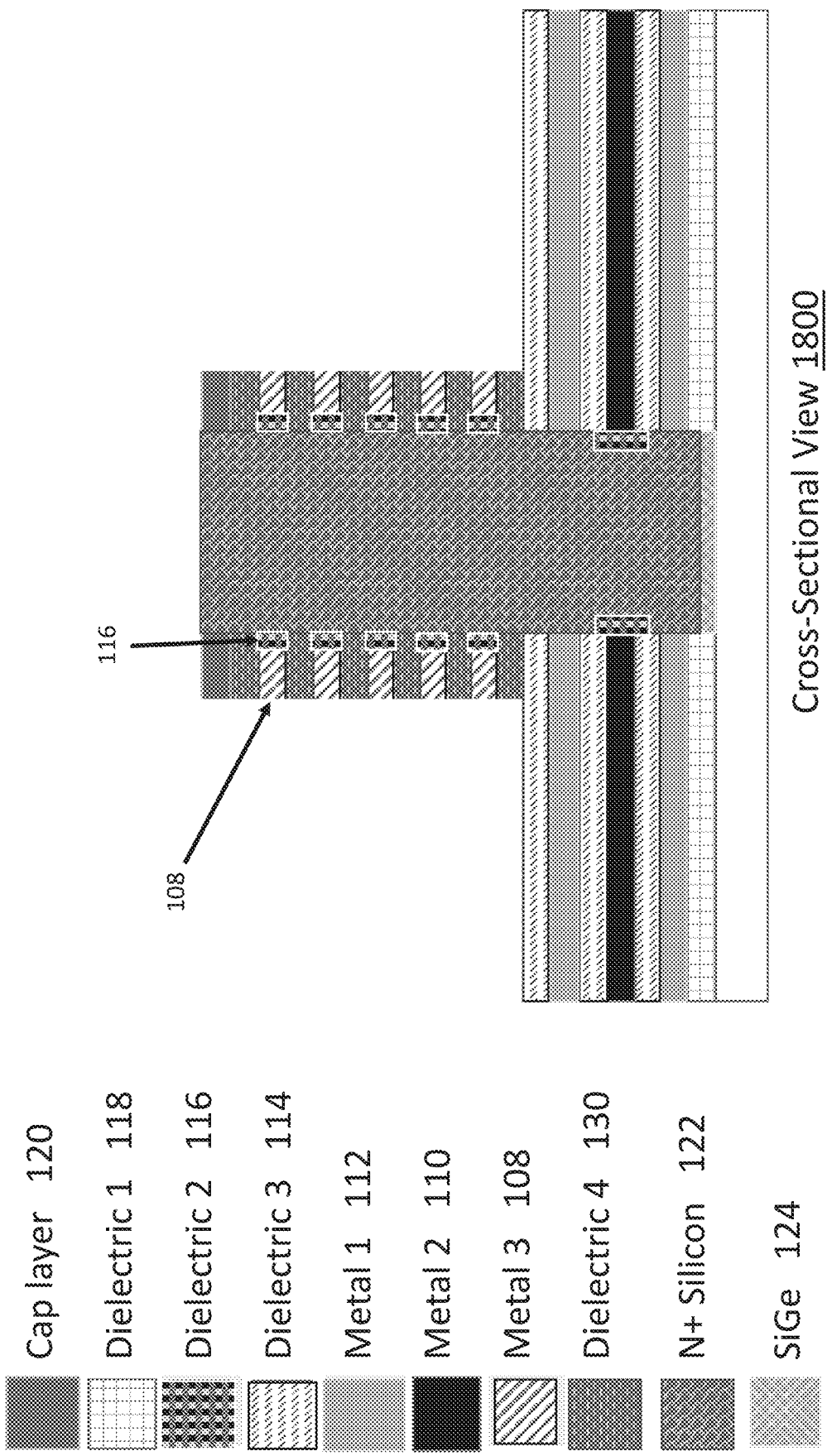

Referring to FIG. 18, illustrated is a cross-sectional view 1800 of the device at the next stage in the second process flow. At this stage, high-k dielectric 116 materials can be deposited in a portion of the air gaps left after etching the insulating dielectric layers 114 in the memory structure. The high-k dielectric 116 may be grown or deposited such that a predetermined amount of high-k dielectric 116 fills the air gaps. Alternatively, the high-k dielectric 116 may be grown on the semiconductive behaving materials 122 so as to extend into the air gaps. The high-k dielectric 116 material may be selected to have desired attributes or properties, such as a desired dielectric constant. Once the high-k dielectrics 116 have been deposited to fill a portion of the air gaps, the remainder of the air gaps can be deposit-filled with the metal layers 108. The metal layers 108 can be deposited in the air gaps in contact with the high-k dielectrics 116 using any suitable material deposition technique, such as ALD, CVD, PVD, or plasma-enhanced techniques, among others.

Figure 19:
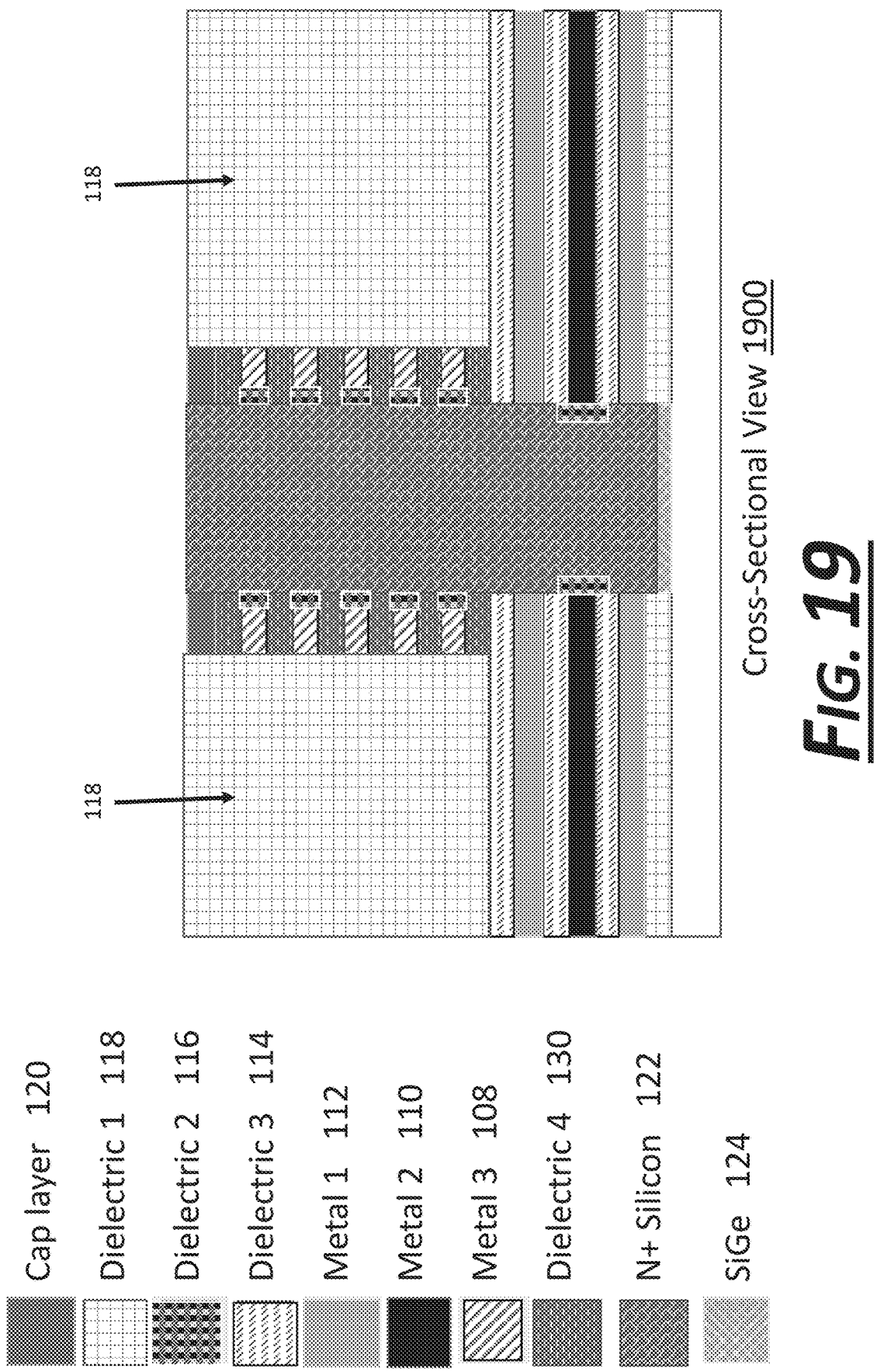

Referring to FIG. 19, illustrated is a cross-sectional view 1900 of the device at the next stage in the second process flow. At this stage, a dielectric material 118 is provided in the openings formed when etching the 3D NAND structures in the previous step of the second process flow described in connection with FIG. 16. The dielectric material 118 may be formed using any suitable technique, such as ALD, CVD, PVD, or plasma-enhanced techniques, among others. The dielectric material 118 may be deposited until the dielectric material 118 is flush with the top of the device. In some implementations, a CMP process may be used after the formation of the dielectric material 118 in the openings formed from the word line etch.

Figure 20:
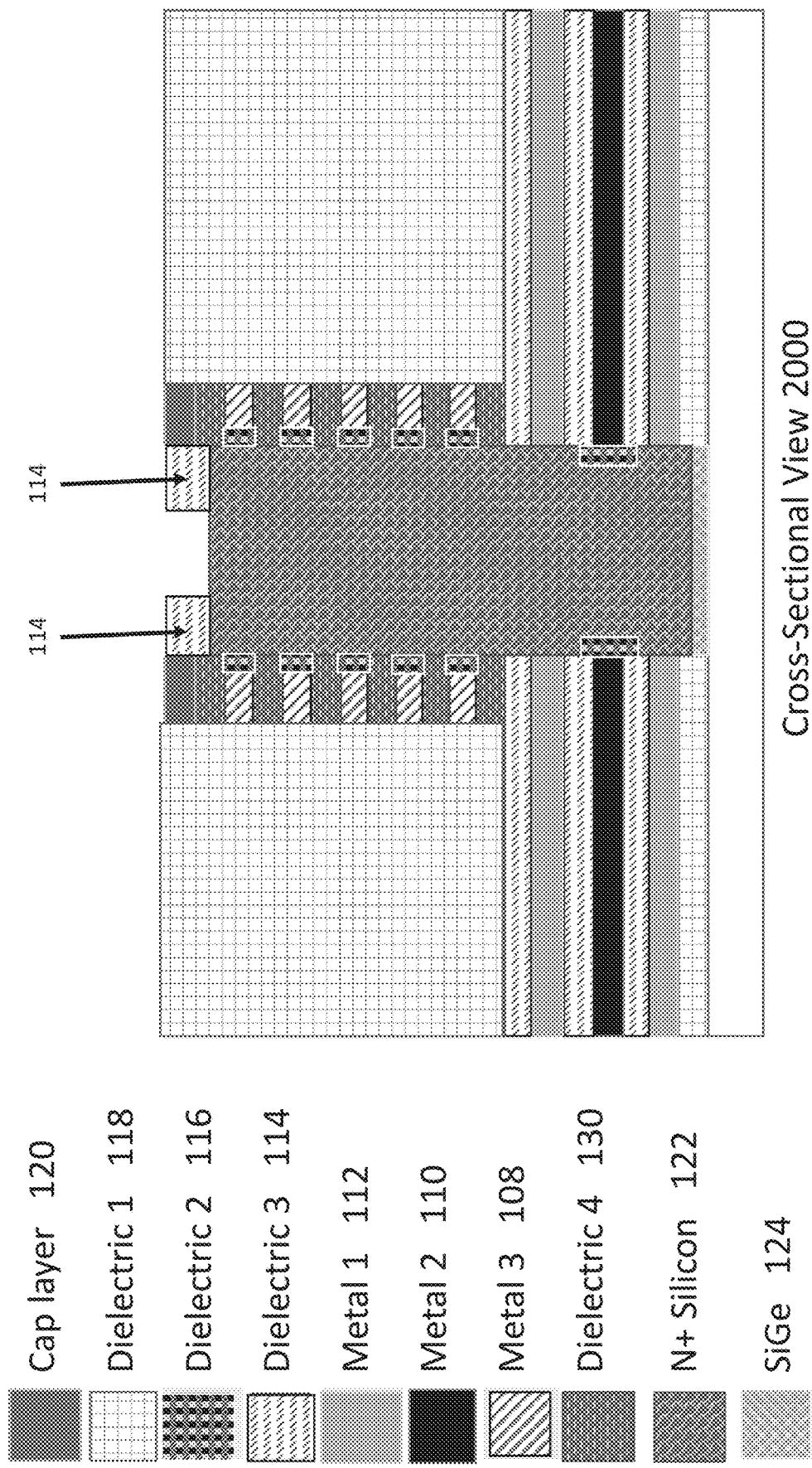

Referring to FIG. 20, illustrated is a cross-sectional view 2000 of the device at the next stage in the second process flow. At this stage, the semiconductive-behaving material 122 can be etched by a predetermined amount, shown here as midway down the top different dielectric layer 130. Any type of suitable etching techniques may be used, including but not limited to dry etching, wet etching, or plasma etching techniques. The etching process can create an air gap in the upper portion of the channel opening. Then, a patterned layer of the insulating dielectric 114 can be formed (e.g., using a suitable mask (not pictured) and any suitable material deposition technique) in the opening formed using the etching process. The insulating dielectric 114 can be patterned, for example, in a ring formation, such that the opening of the ring is centered on the channel opening. This can guide a further etching process through the center of the semiconductive-behaving material 122 in future process steps. The insulating dielectric 114 can be formed as a spacer or patterned in any shape on the semiconductive-behaving material 122 to define the shape of a core channel that will be etched through the semiconductive-behaving material 122 in further process steps.

Referring to FIG. 21, illustrated is a cross-sectional view 2100 of the device at the next stage in the second process flow. At this stage, a core channel is etched in the semiconductive behaving material 122 down to the base layer 104. The etching process may be a selective directional etch that is selective to the semiconductive behaving material 122. The etching process may utilize the insulating dielectric 114 formed in the previous stage as a self-aligning etch mask, such that a vertical etch of the semiconductive behaving material 122 creates an opening that is aligned with the opening formed by the insulating dielectric 114, as shown in the cross-sectional view 2100. Any type of suitable etching techniques may be used, including but not limited to dry etching, wet etching, or plasma etching techniques. The etching process may be de-selective to the base layer 104, as shown, which may behave as an etch stop material.

Figure 22:
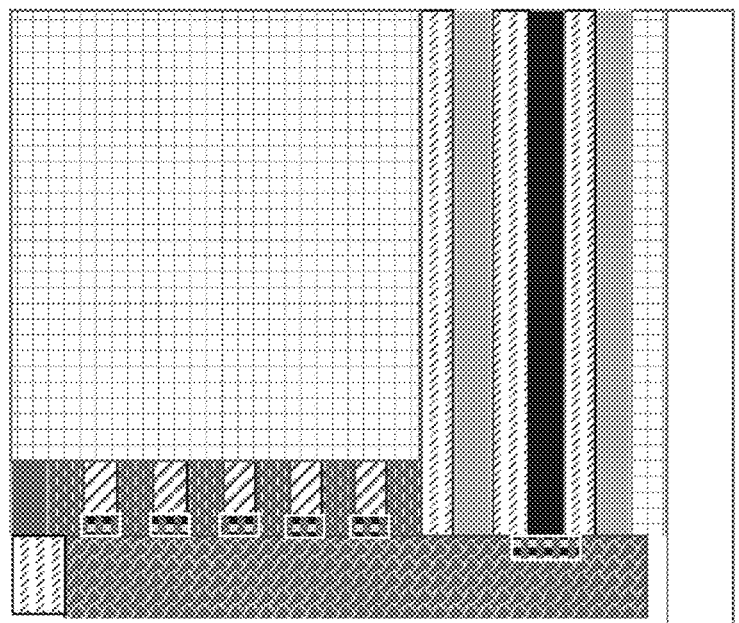

Referring to FIG. 22, illustrated is a cross-sectional view 2200 of the device at the next stage in the second process flow. At this stage, the seed layer 124 can be removed using a suitable selective etching process to create an air gap. Any type of suitable selective etching techniques may be used, including but not limited to dry etching, wet etching, or plasma etching techniques. The etching process may be selective to the seed layer 124, or a protective mask layer may be provided that prevents the etching process from etching any other material in the stack of layers. This stage in the second process flow may be omitted if a seed layer 124 is not used, in which case the stage shown in FIG. 23 can be performed following the process flow stage described in connection with FIG. 21. Air gaps can remain the space previously occupied by the seed layer 124, which may remain in the final design or may be filled with a dielectric 118 in further process steps.

Figure 23:
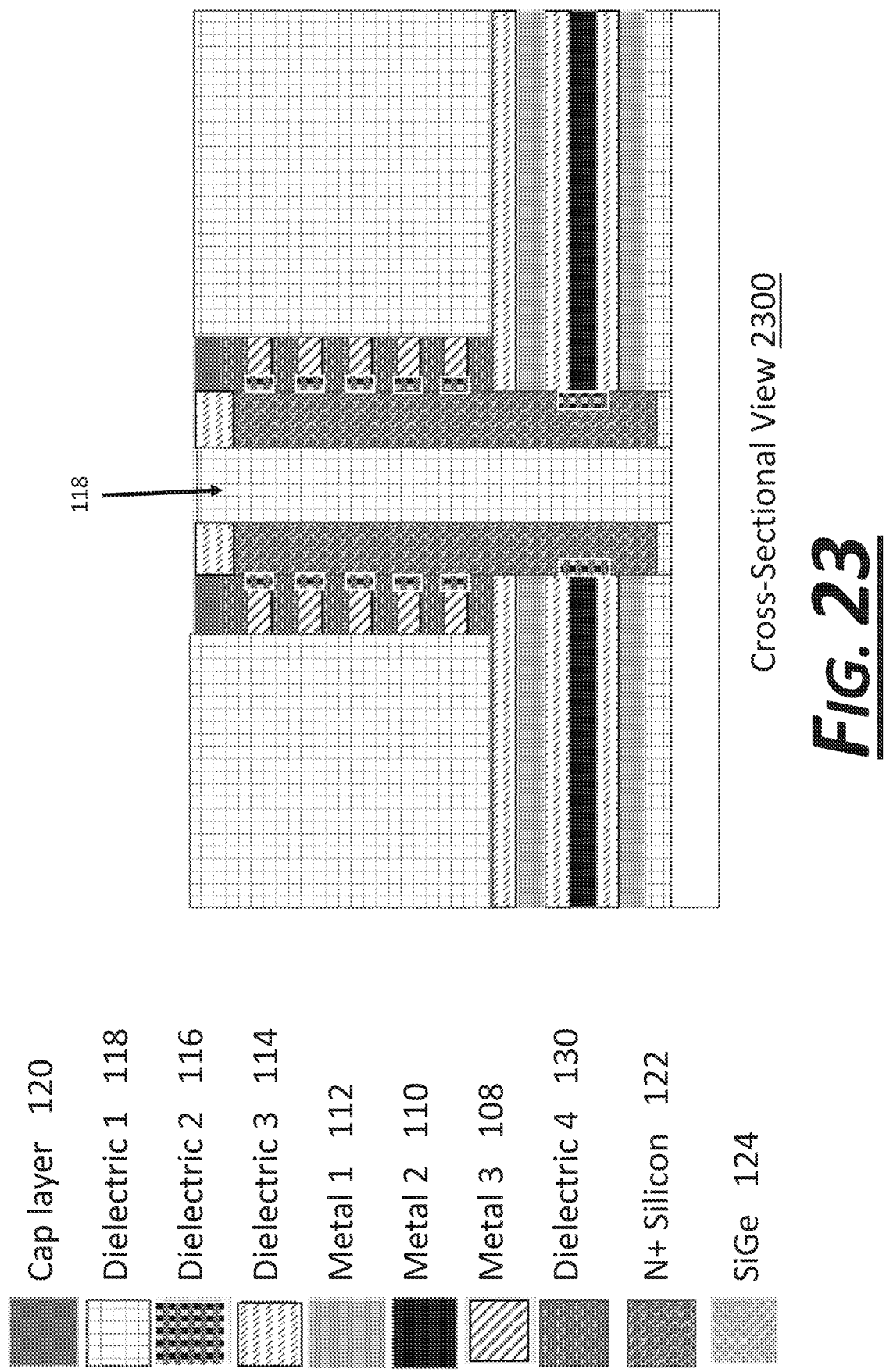

Referring to FIG. 23, illustrated is a cross-sectional view 2300 of the device at the next stage in the second process flow. At this stage, the core channel formed in the semiconductive-behaving material 122 can be filled with a dielectric 118. Any type of material deposition process may be used to form the dielectric 118, including ALD, CVD, PVD, or plasma enhanced techniques, among others. In some implementations, and as shown in the cross-sectional view 2300, the air gaps that remain after etching the seed layer 124 can also be deposit-filled with the dielectric 118. In some implementations, a CMP process may be performed following the deposition of the dielectric 118 in the core opening.

Figure 24:
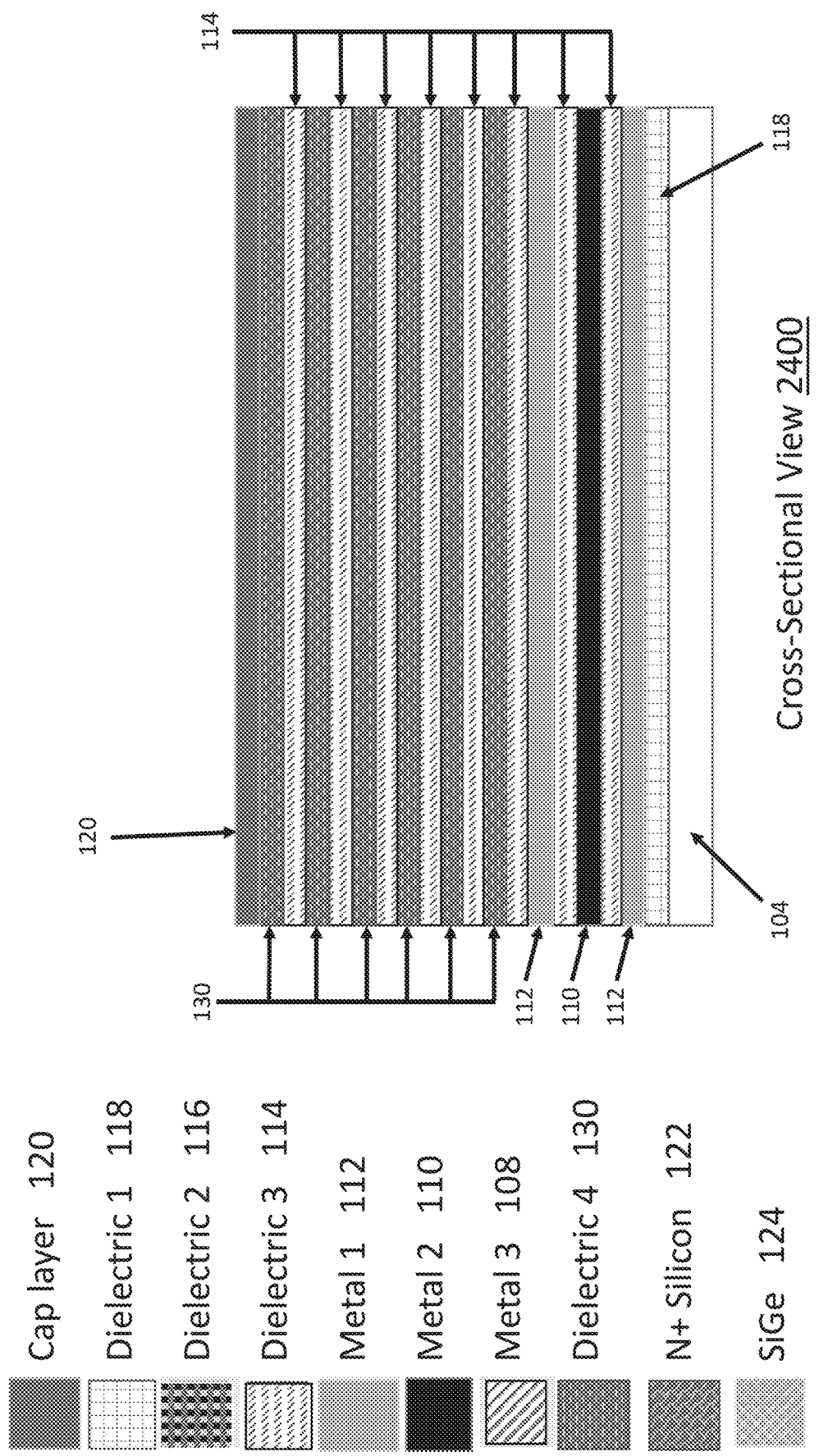
FIGS. 24-35 show cross-sectional views of a third process flow to form 3D NAND floating gate memory circuits integrated with 3D vertical semiconductor devices, according to an embodiment.

FIGS. 24-35 show cross-sectional views of a third process flow to form 3D NAND floating gate memory circuits integrated with 3D vertical semiconductor devices, according to an embodiment. Referring to FIG. 24, illustrated is a cross-sectional view 2400 of a device. The material stack shown in FIG. 24 may be similar to that shown in FIG. 13. At the start of the third process flow, a first layer of dielectric 118 is deposited on top of a base layer 104. As described briefly above, the techniques described herein may be implemented without requiring epitaxial growth, and therefore the base layer 104 may be any type of material capable of binding to the dielectric 118. The base layer 104 may be active or passive and may comprise dielectric, conductive or semiconductive materials or any combination thereof. The dielectric 118 may be any type of dielectric material or otherwise non-conductive material that is capable of being disposed, patterned, or otherwise provided on top of the base layer 104. Some examples of dielectric materials can include, but are not limited to, oxide materials. The substrate 104 may remain in the final structure or may be removed during or after the formation of the devices described herein.

As used with respect to the third process flow of FIGS. 24-35, the terms "first," "second," "third," and "fourth" refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 118 (sometimes referred to herein as a "first dielectric layer") is deposited on top of the base layer 104, a first transistor structure may be formed using alternating layers of conductive and non-conductive material layers.

The first S/D layer 112 may be formed directly on the base layer 104 (e.g., if the base layer 104 is non-conductive), or on the one or more dielectric layers 118 described above. The S/D layers 112 may be any type of conductive material, such as a metal, suitable to form a source or drain electrode in a semiconductor device. Some examples of such materials include, but are not limited to copper, gold, silver, platinum, nickel, tungsten, ruthenium, or other types of conductive metals or alloys. An insulating dielectric 114 is formed on the first S/D layer 112, after the first S/D layer 112 has been formed.

A gate layer 110 may then be formed on top of the first insulating dielectric layer 114. A second insulating dielectric layer 114, and then a second S/D layer 112, is then formed on the gate layer 112. The gate layer 110 may be a different material than the first and second S/D layers 112. A third insulating dielectric layer 114 may then be formed on top of the second S/D layer 114 to complete a first transistor structure. In some implementations, multiple transistor structures may be formed on top of one another prior to forming the material stacks for memory structures, as described herein. In a multi-transistor stack, the foregoing layers (not necessarily including the base layer 104) would constitute a first sub-stack. As shown in the cross-sectional view 1300, a transistor structure can include four dielectric layers (with the first transistor having one dielectric layer be the dielectric layer 118, which separates the first transistor structure from the substrate 104) and three conductive metal layers (the two S/D layers 112 and one gate layer 110).

Subsequent transistor structures (e.g., second sub-stacks, third sub-stacks, etc.) may be stacked above the first transistor structure, by depositing similar layers. One or more insulating dielectric layers 114 may be deposited between adjacent transistor structures. These layers in the stack of layers may be formed without a mask, such that each layer forms a blanket layer over the prior layer. The gate layers 110 may be a different material than the S/D layers 112 to allow selectivity in etch and deposition processes. Moreover, the gate layer 110 for a P-type device may be selected to be different from the gate layer 110 of an N-type device. A non-exhaustive list of potential materials to use for the gate layer includes Ru, TaN, TiN, W, WN, TiC, Ga, Gd, TiON, TaSiN, TiSiN, Mo, Al, Cu, and combinations, stacks, or alloys of these or similar materials.

After forming the one or more transistor structures in one or more corresponding sub-stacks, an additional sub-stack may be formed that includes alternating conductive and non-conductive layers, forming a memory structure. As shown in the cross-sectional view 2400, the memory structure includes alternating layers of the insulating dielectric 114 and a different dielectric 130 (shown as "Dielectric 4" in the legend). The different dielectric 130 may be different from the other dielectric materials (e.g., the dielectric material 114, the dielectric material 118, the high-k dielectric 116, etc.) in the stack of layers. These alternating layers of the insulating dielectric layers 114 and the different dielectric 130 collectively form a memory structure (e.g., a foundation for a memory structure that is formed by replacing one or more of the insulating dielectric layers 114 in later process steps). After forming the memory structure, a cap layer 120 may be formed. The cap layer 120 can be any type of dielectric or other non-conductive material and may serve to protect the underlying layers from the external environment. In some implementations, one or more additional transistor structures (e.g., a deselect transistor, additional logic, etc.) may be formed (e.g., using techniques similar to those described above) on the memory structure prior to forming the cap layer 120.

When forming each of the layers, layers that make up the transistor structures or memory structures may be patterned as is well understood in the art to form electrical connections between transistor structures or the memory structures. These connections may be formed by patterning the conductive layers described herein, as well as by forming vias to electrically connect different layers. As such, transistor structures and memory structures that are isolated in the x-y plane may be electrically connected with one another to form logical or electronic circuits. Although the memory structure is shown as including six alternating layers of the different dielectric layers 130 and the insulating dielectric layers 114, it should be understood that any number of alternating different dielectric layers 130 and insulating dielectric layers 114 may be utilized, and only a few layers are shown here for ease of visualization. For example, the memory structure may include dozens or hundreds of alternating different dielectric layers 130 and insulating dielectric layers 114.

Figure 25:
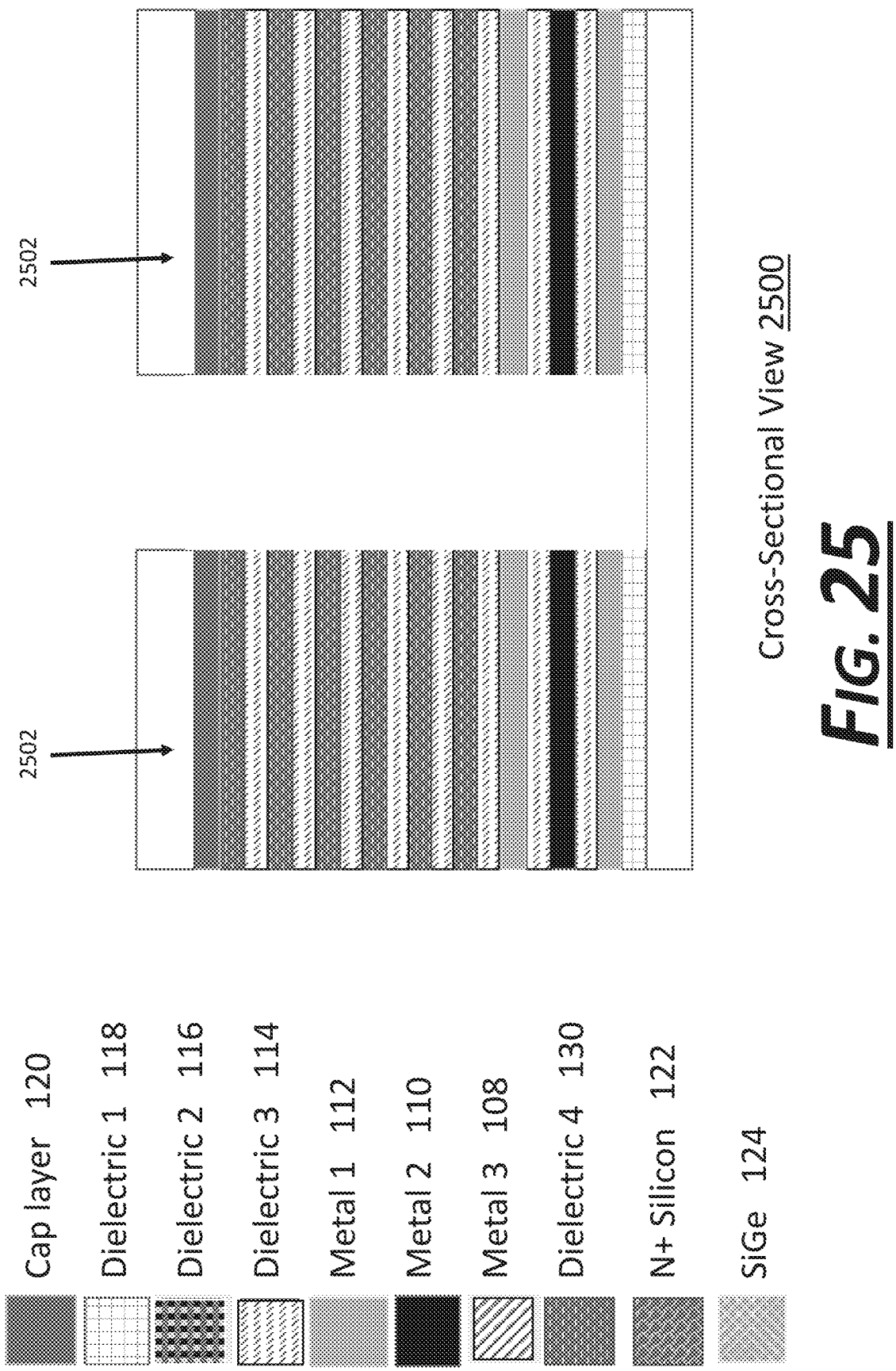

Once the stack of layers has been formed to include one or more transistor structures and one or more memory structures, the third process flow proceeds to the next stage shown in FIG. 25. Referring to FIG. 25, illustrated is a cross-sectional view 2500 of the device at the next stage in the third process flow. As shown, a masking material 2502 is used to mask (e.g., protect) areas of interest in the stack of materials. The masking material 2502 may be patterned to define a desired shape and size of one or more of channel openings in the stack of layers formed in the previous process flow step. Although the masking material 2502 is shown here as defining one channel opening, it should be understood that any number of channel openings may be defined using a directional etching process. One or more etching techniques may be performed to remove etch away all of the material not protected by the masking material 2502, down to the base layer 104. Any type of suitable etching techniques may be used, including but not limited to dry etching, wet etching, or plasma etching techniques. The masking material 2502 may then be removed, or may be retained to protect the underlying surface or to remain as part of the final structure.

Figure 26:
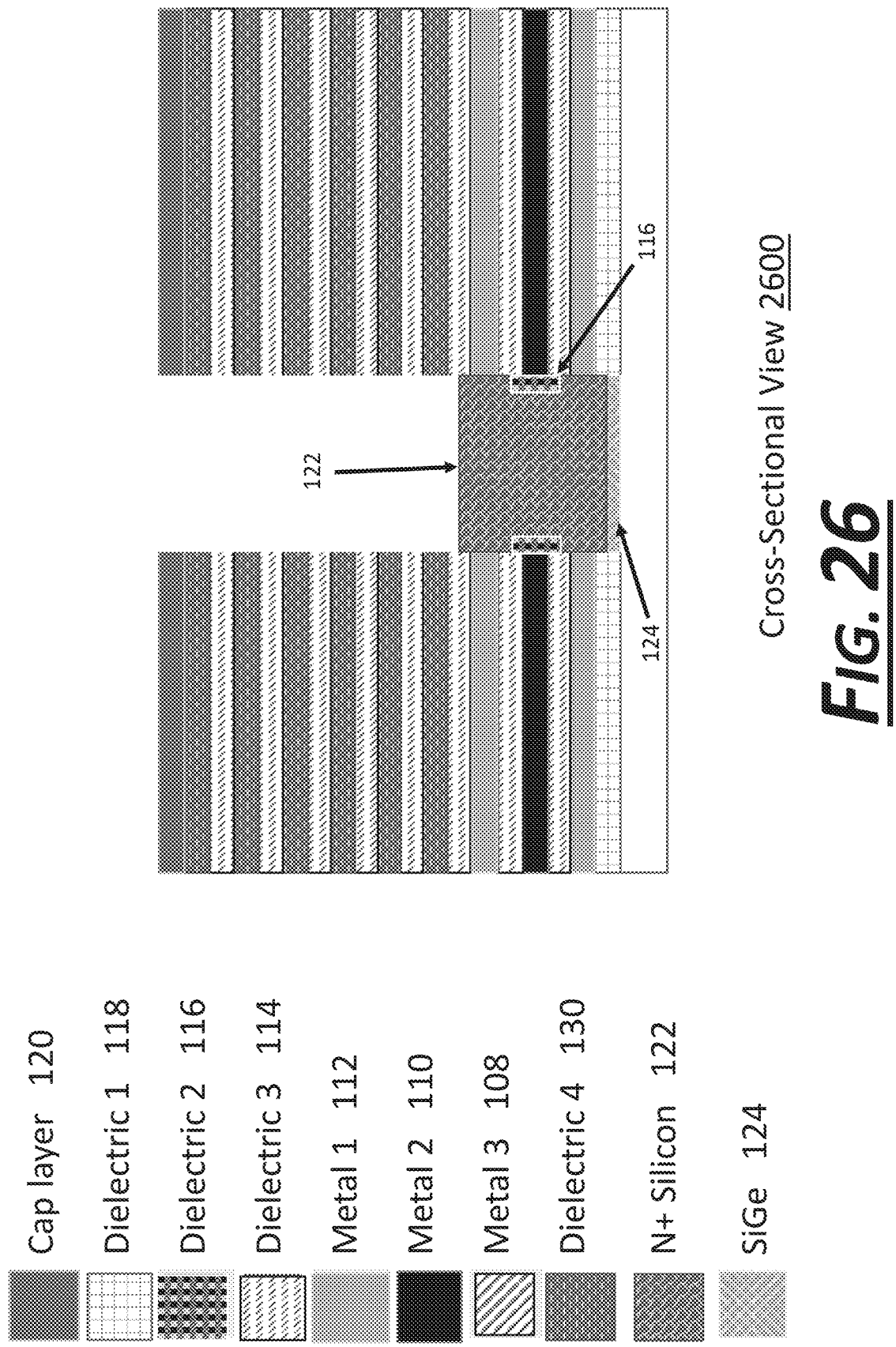

Referring to FIG. 26, illustrated is a cross-sectional view 2600 of the device at the next stage in the third process flow. Once etching the channel opening is complete, a gate dielectric, such as a high-k dielectric 116, may be selectively formed on the gate layers 110 in the channel opening. The high-k dielectric 116 may be grown or deposited such that the gate layer 110 extends into the channel opening, for example, by a predetermined amount. The high-k dielectric 116 material may be selected to have desired attributes or properties, such as a desired dielectric constant. Likewise, the high-k dielectric 116 may be grown or deposited to create a predetermined separation distance between the gate layer 110 and the central channel of the transistor structure. If multiple devices, such as N-type and P-type devices, are exposed in the opening, suitable dielectrics and thicknesses may be provided to each gate to achieve the desired characteristics. Deposition control may be achieved using specific materials for each gate layer 110 and selecting the gate dielectric 116 to form selectively on that gate layer 110.

Once the high-k dielectric 116 has been deposited, a channel structure can be formed in the channel opening. The channel structure may be formed from a semiconductive behaving material 122. The channel structure may be any type of material that can be deposited or grown in the channel opening and may sometimes be referred to as deposited material 122. The semiconductive behaving material 122 may be a silicon material and may be grown on a seed material 124 (shown as "SiGe" in the legend). The seed material 124 can be any type of material usable as a seed layer for epitaxial growth and may include SiGe. To form the semiconductive behaving material 122, a thin film of the seed material 124 may first be deposited on the base layer 104 in the channel openings. The seed material 124 can be deposited using any type of deposition technique, such as ALD, CVD, PVD, or plasma-enhanced techniques, such as plasma-enhanced CVD. In some implementations, if the base layer 104 is made of a suitable seed material, the semiconductive behaving material 122 may be grown or selectively deposited directly onto the base layer 104.

Once the seed material 124 has been deposited on the base layer 104, the semiconductive behaving material 122 can be formed on the seed material 124. The semiconductive behaving material 122 can be formed using selective deposition (e.g., selective ALD, CVD, PVD, plasma-enhanced techniques, etc.), or may be formed through epitaxial growth using the seed material 124 as a seed. In some implementations, a seed material 124 may be not be used, and the semiconductive behaving material 122 can be deposited in the channel opening on the base layer 104. The semiconductive behaving material 122 can be grown or selectively deposited until the semiconductive behaving material 122 has achieved a predetermined height within the channel opening. As shown, the predetermined height can be in the middle of the insulating dielectric layer 114 separating the transistor structure from the memory structure in the stack of layers. In some implementations, the semiconductive behaving material 122 can be formed to fill the channel opening and then be etched to achieve the predetermined height for the semiconductive behaving material 122 within the channel opening.

Figure 27:
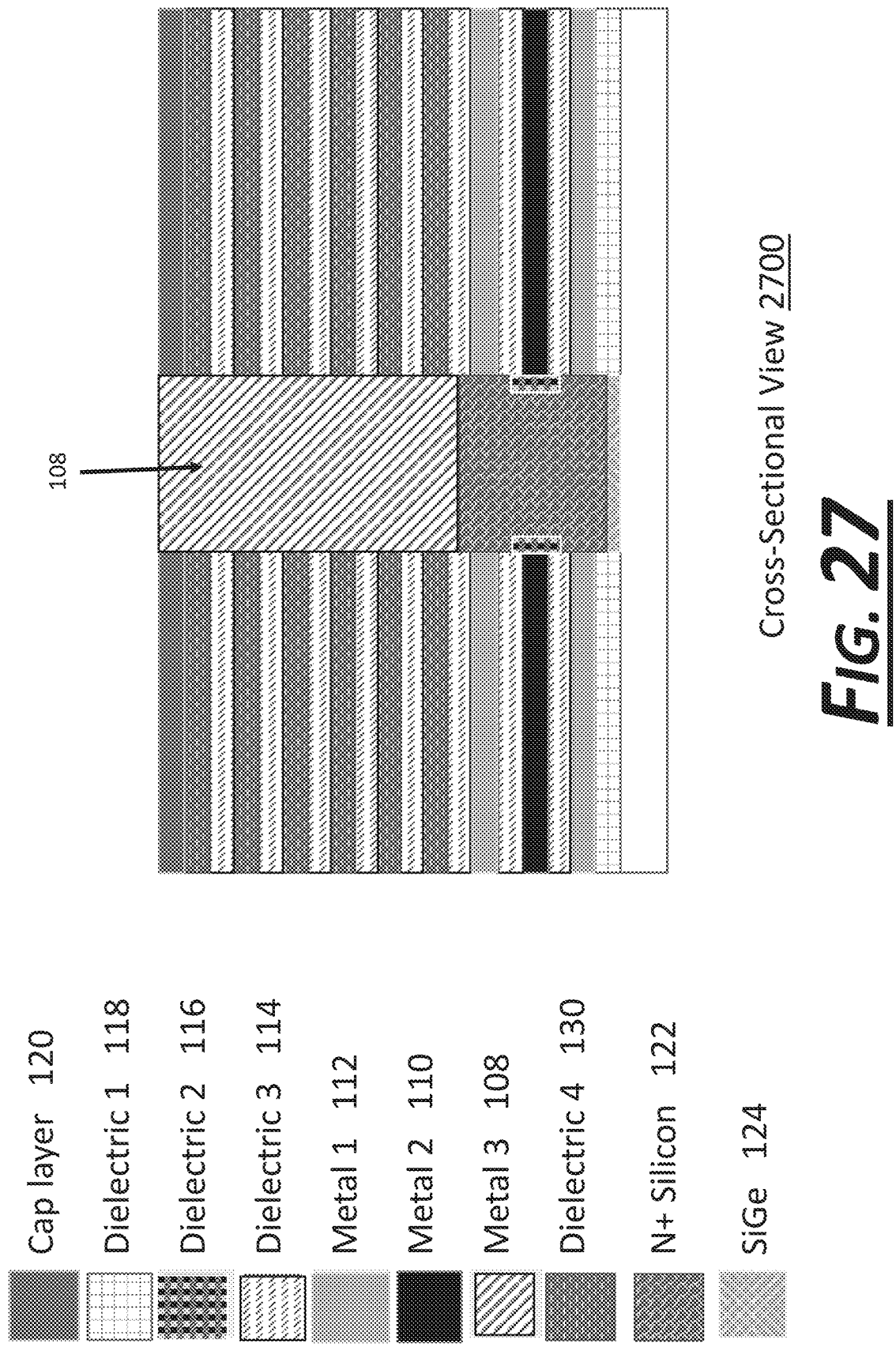

Referring to FIG. 27, illustrated is a cross-sectional view 2700 of the device at the next stage in the third process flow. At this stage, the remainder of the channel opening can be filled with the metal material 108, which can be deposited or formed in the channel opening on the semiconductive-behaving material 122 using any suitable material deposition or formation technique. The metal material 108 may be deposited using, for example, ALD, CVD, PVD, or plasma enhanced techniques, among others. The metal material 108 may be formed to fill the air gaps in the channel opening until the metal material 108 is flush with the top of the device. In some implementations, following the deposition of the material, a CMP process may be performed.

Figure 28:
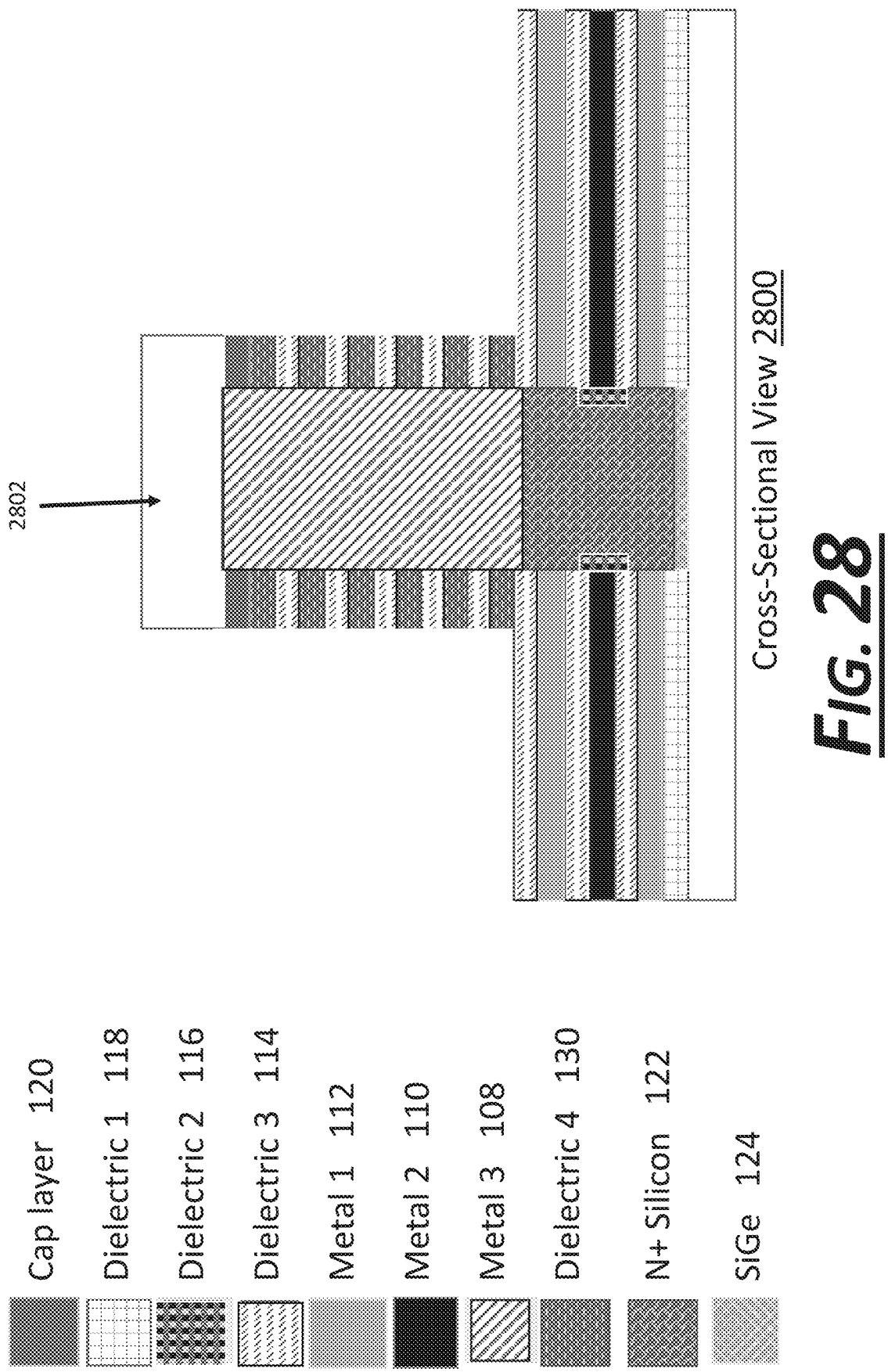
Figure 29:
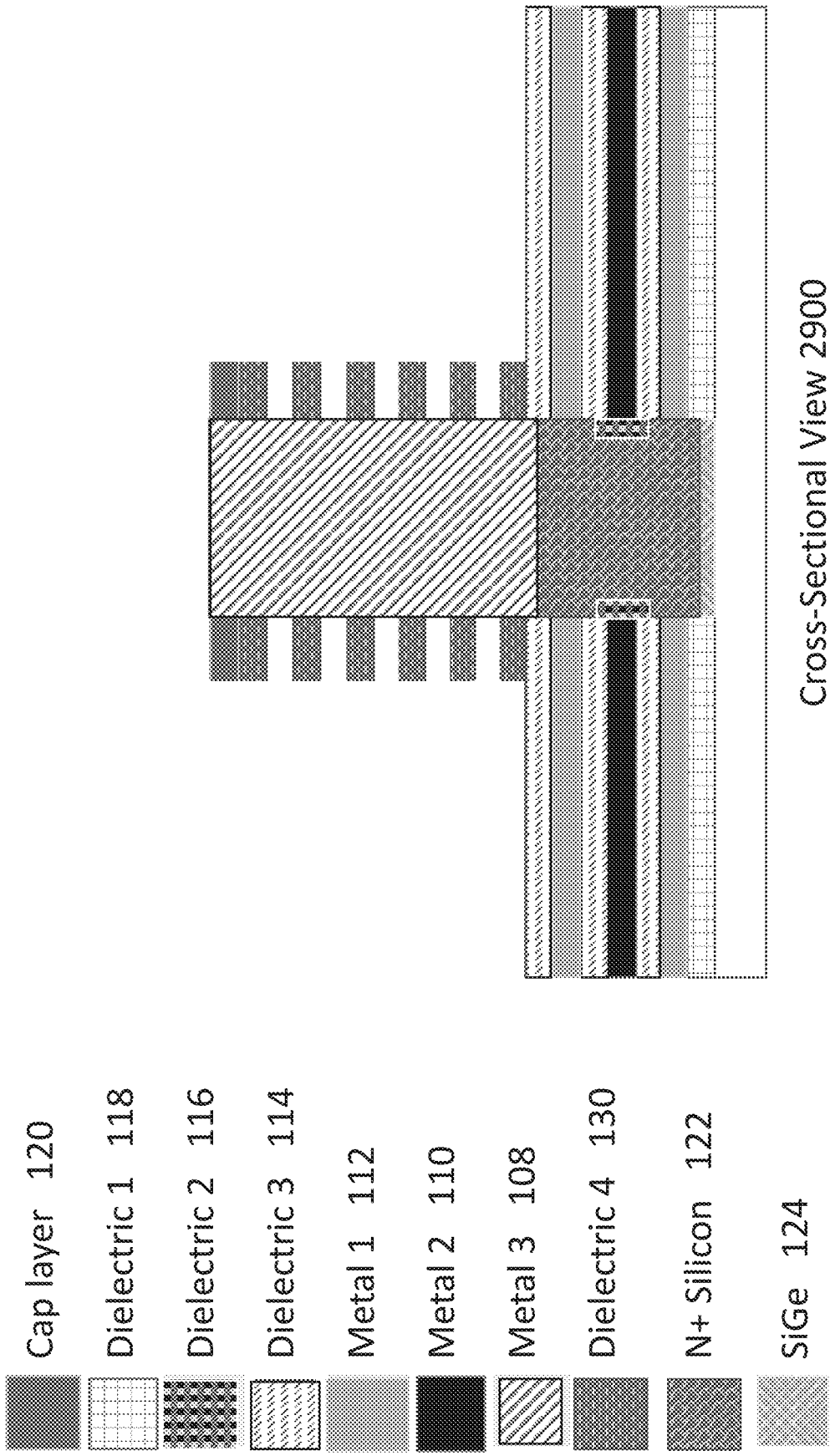

Referring to FIG. 28, illustrated is a cross-sectional view 2800 of the device at the next stage in the third process flow. At this stage, a masking material 2802 is used to mask (e.g., protect) areas of interest in the stack of materials. The masking material 2802 may be patterned to define a desired shape and size of one or more 3D NAND structures in the stack of layers. Although the masking material 2802 is shown here as defining two structures, it should be understood that any number of 3D NAND structures may be formed with integrated logic as described herein. One or more etching techniques may be performed to remove etch away all of material not protected by the masking material 2802, down to the insulating dielectric layer 114 that separates the second S/D layer 112 of the transistor structure from the first different dielectric layer 130 of the memory structure. Any type of suitable etching techniques may be used, including but not limited to dry etching, wet etching, or plasma etching techniques. The masking material 2802 may then be removed, or may be retained to protect the underlying surface or to remain as part of the final structure Referring to FIG. 29, illustrated is a cross-sectional view 2900 of the device at the next stage in the third process flow. At this stage, the masking material 2802 can be removed, and the insulating dielectric layers 114 that make up the memory structure may be removed using an etching process. Any type of suitable etching techniques may be used, including but not limited to dry etching, wet etching, or plasma etching techniques. When performing the etching process, the one or more insulating dielectric layers 114 separating the transistor structure from the memory structure may be protected by a mask material (not shown). As shown, when the insulating dielectric layers 114 in the memory layer are removed, air gaps are left between the layers of the different dielectric material 130. These air gaps can be filled with floating gates and gate contact metal in subsequent process steps.

Figure 30:
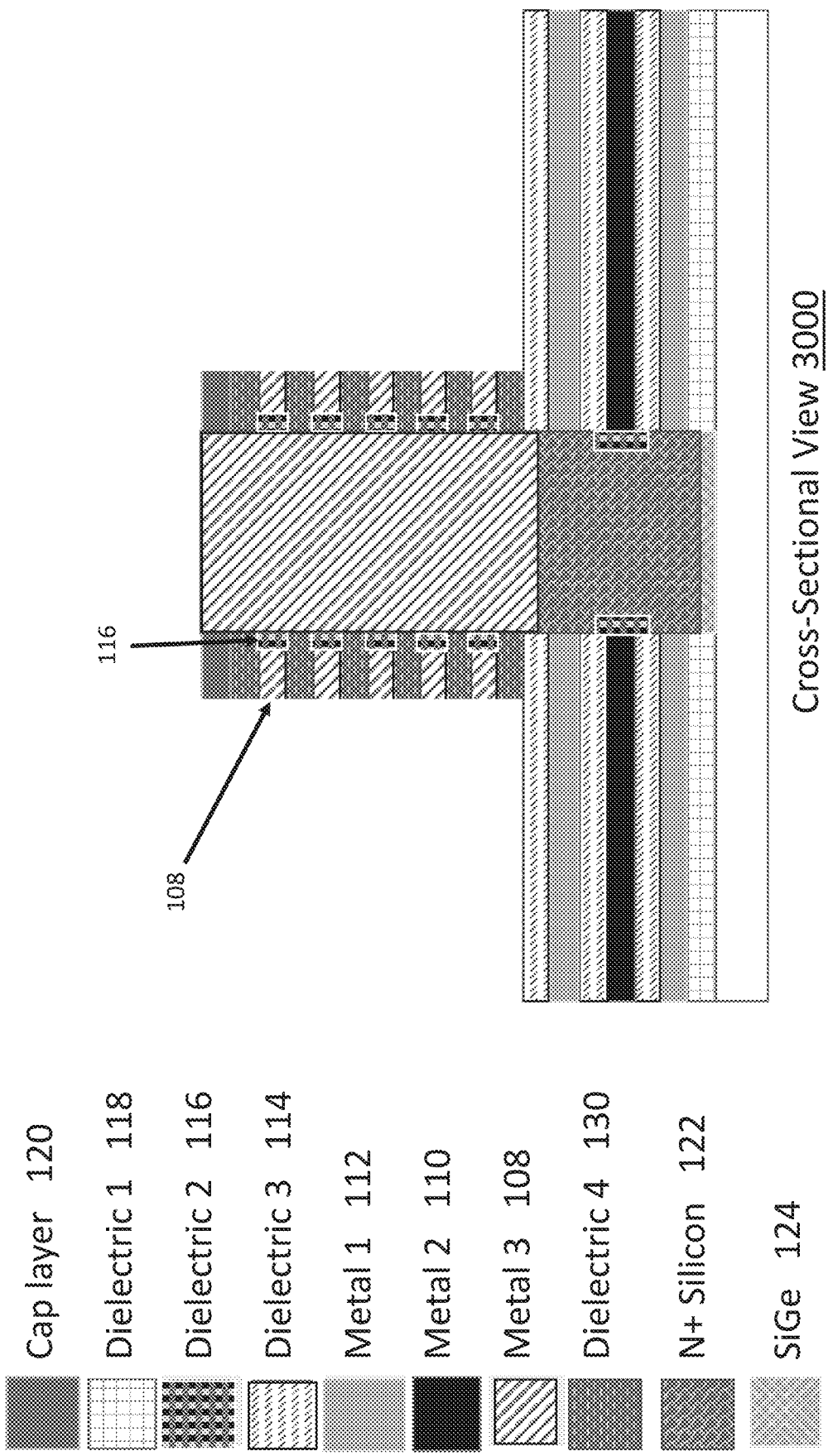

Referring to FIG. 30, illustrated is a cross-sectional view 3000 of the device at the next stage in the third process flow. At this stage, high-k dielectric materials 116 can be deposited in a portion of the air gaps left after etching the insulating dielectric layers 114 in the memory structure. The high-k dielectric 116 may be grown or deposited such that a predetermined amount of high-k dielectric 116 fills the air gaps. Alternatively, the high-k dielectric 116 may be grown on the metal material 108 so as to extend into the air gaps. The high-k dielectric 116 material may be selected to have desired attributes or properties, such as a desired dielectric constant. Once the high-k dielectrics 116 have been deposited to fill a portion of the air gaps, the remainder of the air gaps can be deposit-filled with the metal material 108. The metal material 108 can be deposited in the air gaps in contact with the high-k dielectrics 116 using any suitable material deposition technique, such as ALD, CVD, PVD, or plasma-enhanced techniques, among others.

Figure 31:
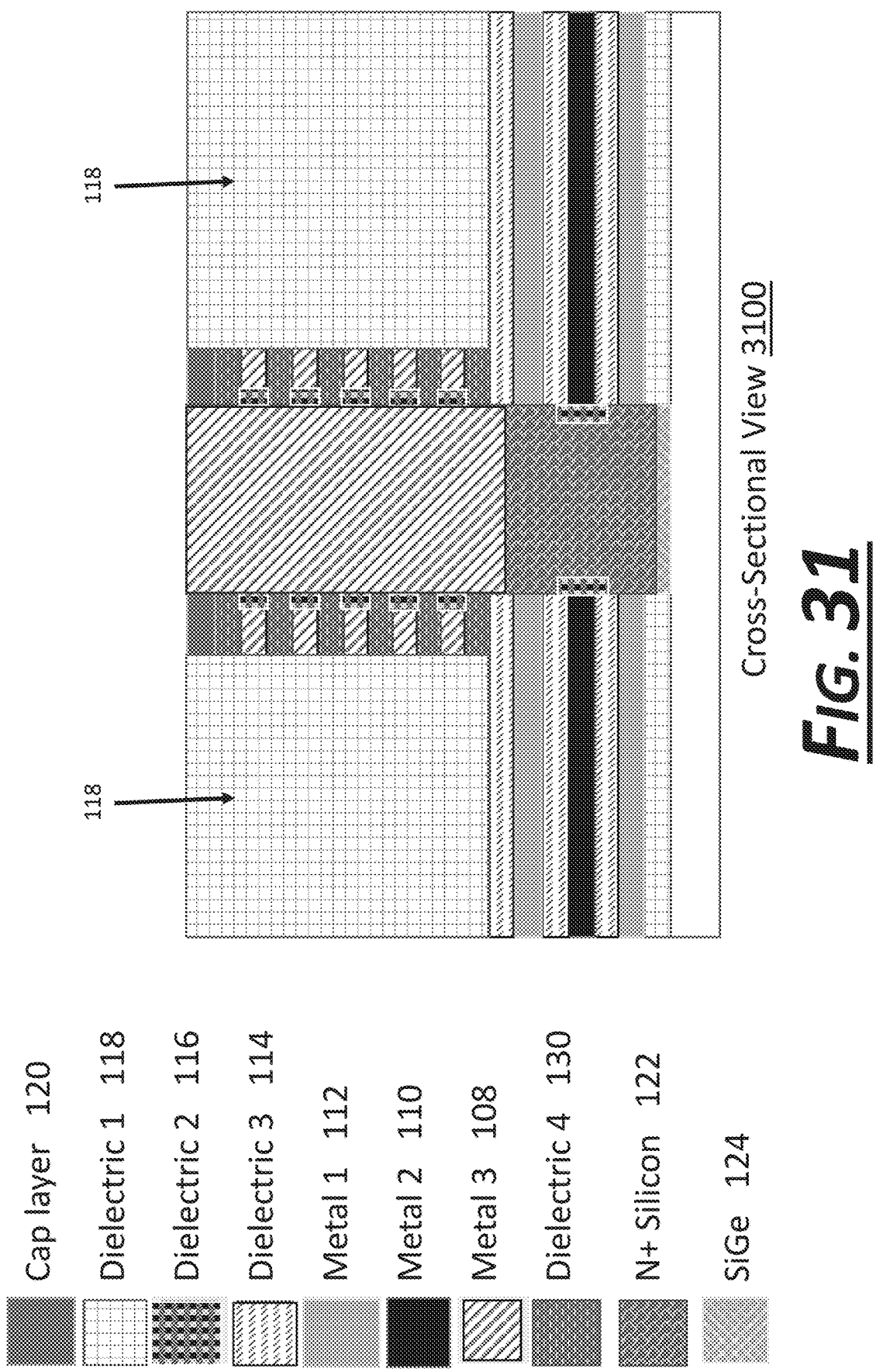

Referring to FIG. 31, illustrated is a cross-sectional view 3100 of the device at the next stage in the third process flow. At this stage, a dielectric material 118 is provided in the openings formed when etching the 3D NAND structures in the previous step of the third process flow described in connection with FIG. 16. The dielectric material 118 may be formed using any suitable technique, such as ALD, CVD, PVD, or plasma-enhanced techniques, among others. The dielectric material 118 may be deposited until the dielectric material 118 is flush with the top of the device. In some implementations, a CMP process may be used after the formation of the dielectric material 118 in the openings formed from the word line etch.

Figure 32:
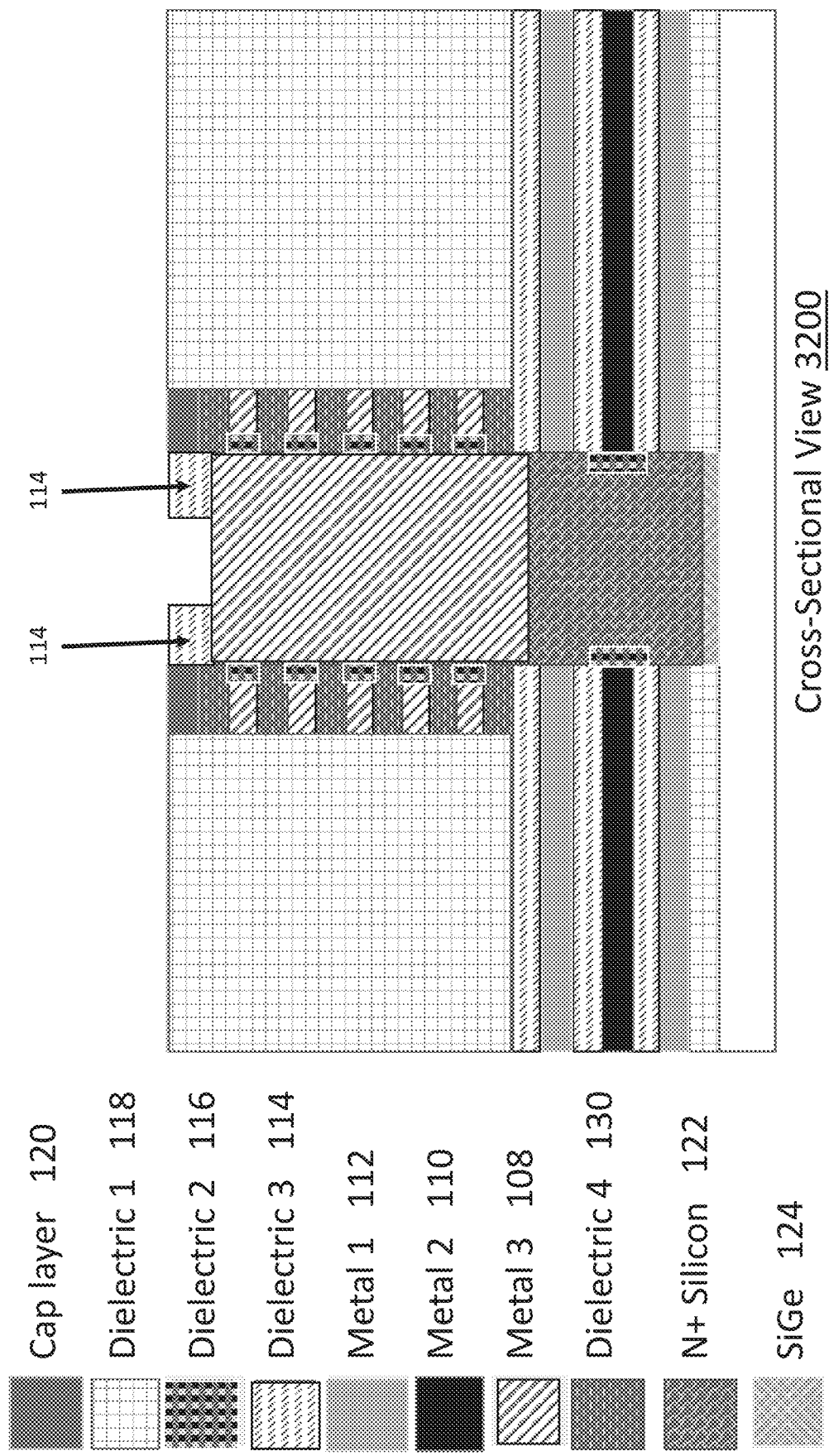

Referring to FIG. 32, illustrated is a cross-sectional view 3200 of the device at the next stage in the third process flow. At this stage, the metal material 108 formed in the channel opening can be etched by a predetermined amount, shown here as midway down the top different dielectric layer 130. Any type of suitable etching techniques may be used, including but not limited to dry etching, wet etching, or plasma etching techniques. The etching process can create an air gap in the upper portion of the channel opening. Then, a patterned layer of the insulating dielectric 114 can be formed (e.g., using a suitable mask (not pictured), by deposit and etch back to form a spacer structure or any other suitable material deposition/masking technique) in the opening formed using the etching process. The insulating dielectric 114 can be patterned, for example, in a ring formation, such that the opening of the ring is centered on the channel opening. This can guide a further etching process through the center of the metal material 108 and the semiconductive-behaving material 122 in future process steps. The insulating dielectric 114 can be patterned in any shape on the semiconductive-behaving material 122 to define the shape of a core channel that will be etched through the metal material 108 and the semiconductive-behaving material 122 in further process steps.

Figure 33:
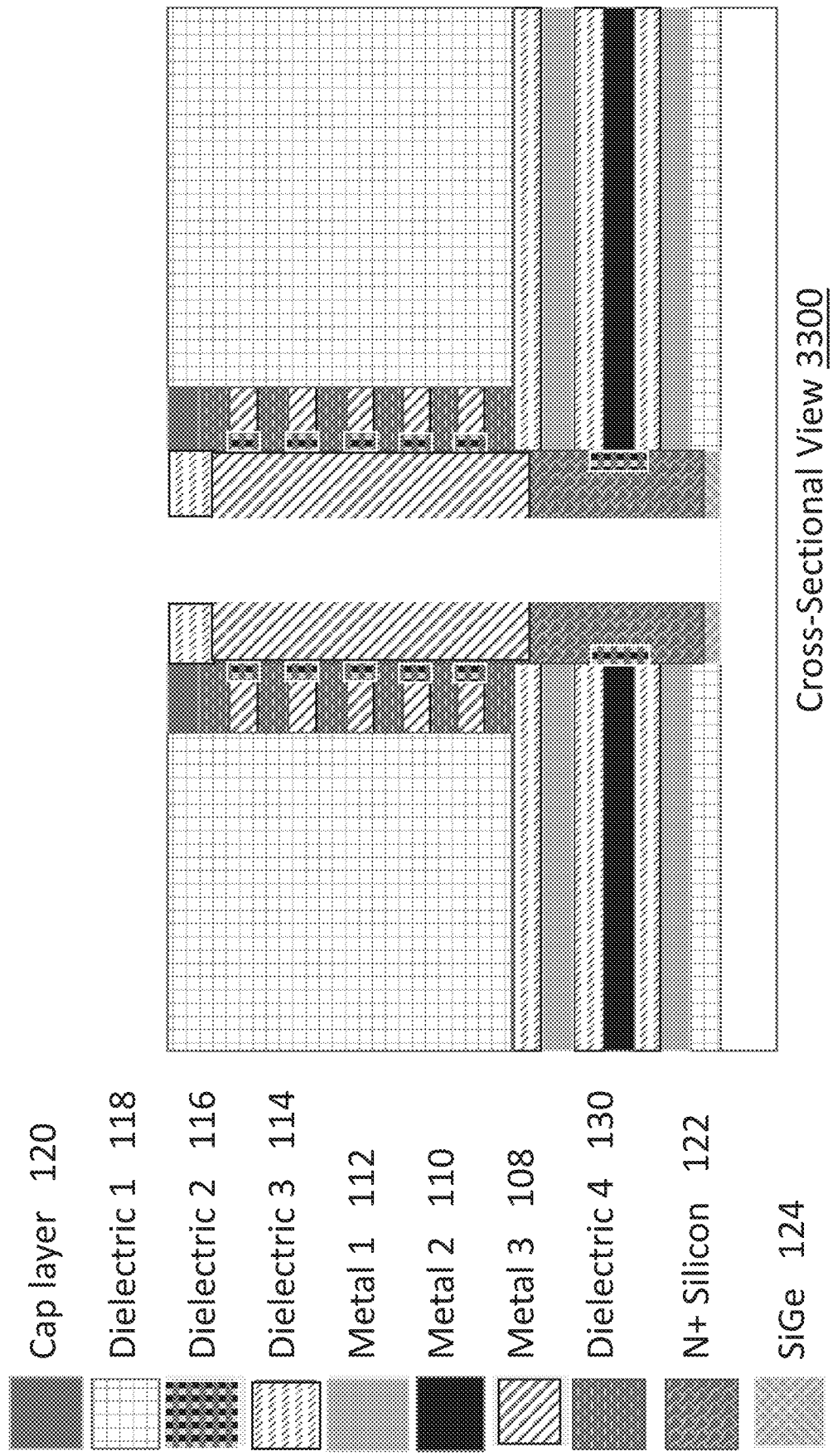

Referring to FIG. 33, illustrated is a cross-sectional view 3300 of the device at the next stage in the third process flow. At this stage, a core channel is etched through the metal material 108 and the semiconductive behaving material 122 down to the base layer 104. The etching process may be a selective directional etch that is selective to the semiconductive behaving material 122 and the metal material 108. The etching process may utilize the insulating dielectric 114 formed in the previous stage as a self-aligning etch mask, such that a vertical etch of the metal material 108 and the semiconductive behaving material 122 creates an opening that is aligned with the opening formed by the insulating dielectric 114, as shown in the cross-sectional view 3300. Any type of suitable etching techniques may be used, including but not limited to dry etching, wet etching, or plasma etching techniques. The etching process may be de-selective to the base layer 104, as shown, which may behave as an etch stop material.

Figure 34:
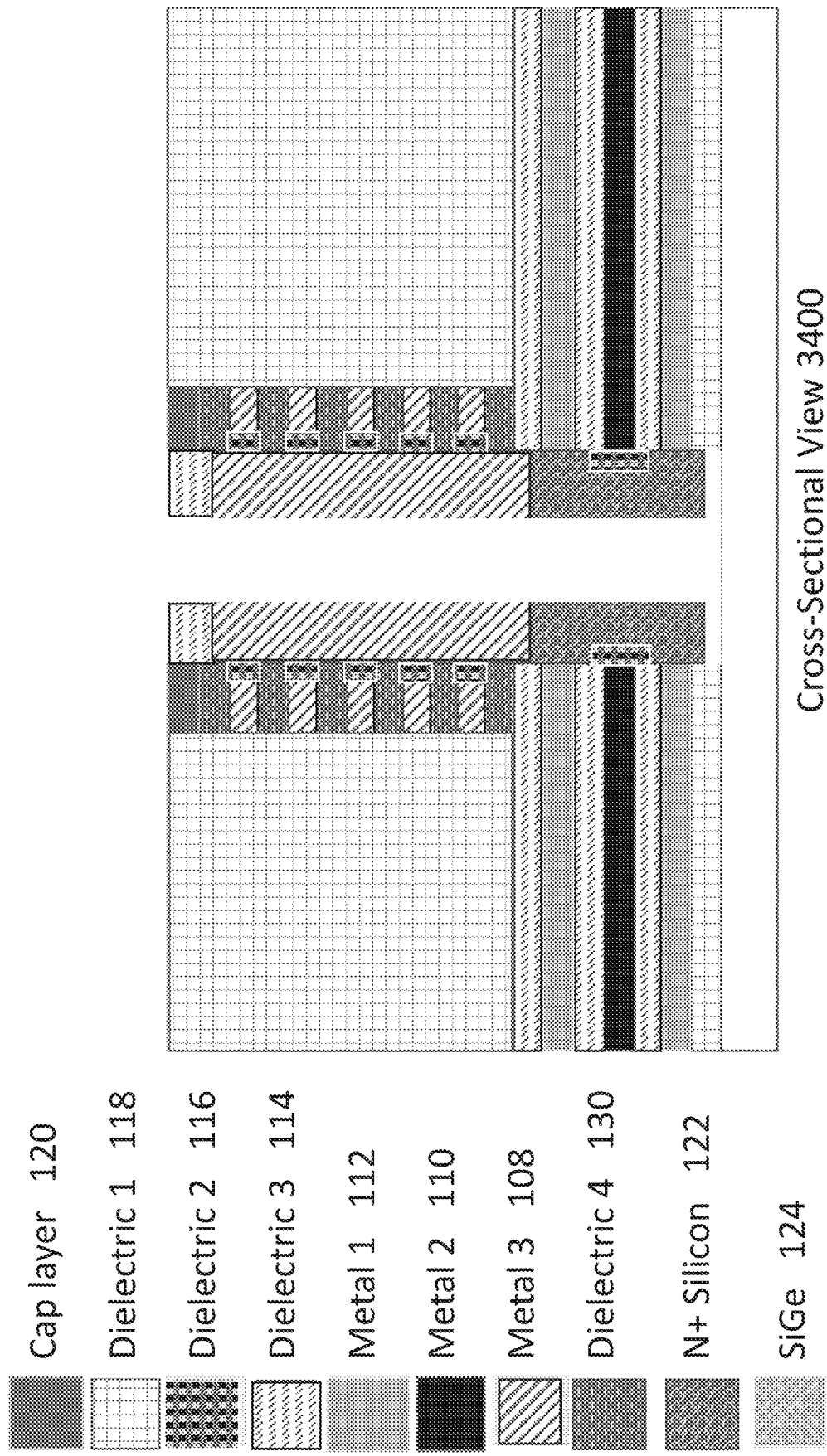

Referring to FIG. 34, illustrated is a cross-sectional view 3400 of the device at the next stage in the third process flow. At this stage, the remainder of the seed layer 124 can be removed using a suitable selective etching process to create an air gap. Any type of suitable selective etching techniques may be used, including but not limited to dry etching, wet etching, or plasma etching techniques. The etching process may be selective to the seed layer 124, or a protective mask layer may be provided that prevents the etching process from etching any other material in the stack of layers. This stage in the second process flow may be omitted if a seed layer 124 is not used, in which case the stage shown in FIG. 35 can be performed following the process flow stage described in connection with FIG. 33. Air gaps can remain the space previously occupied by the seed layer 124, which may remain in the final design or may be filled with a dielectric 118 in further process steps.

Figure 35:
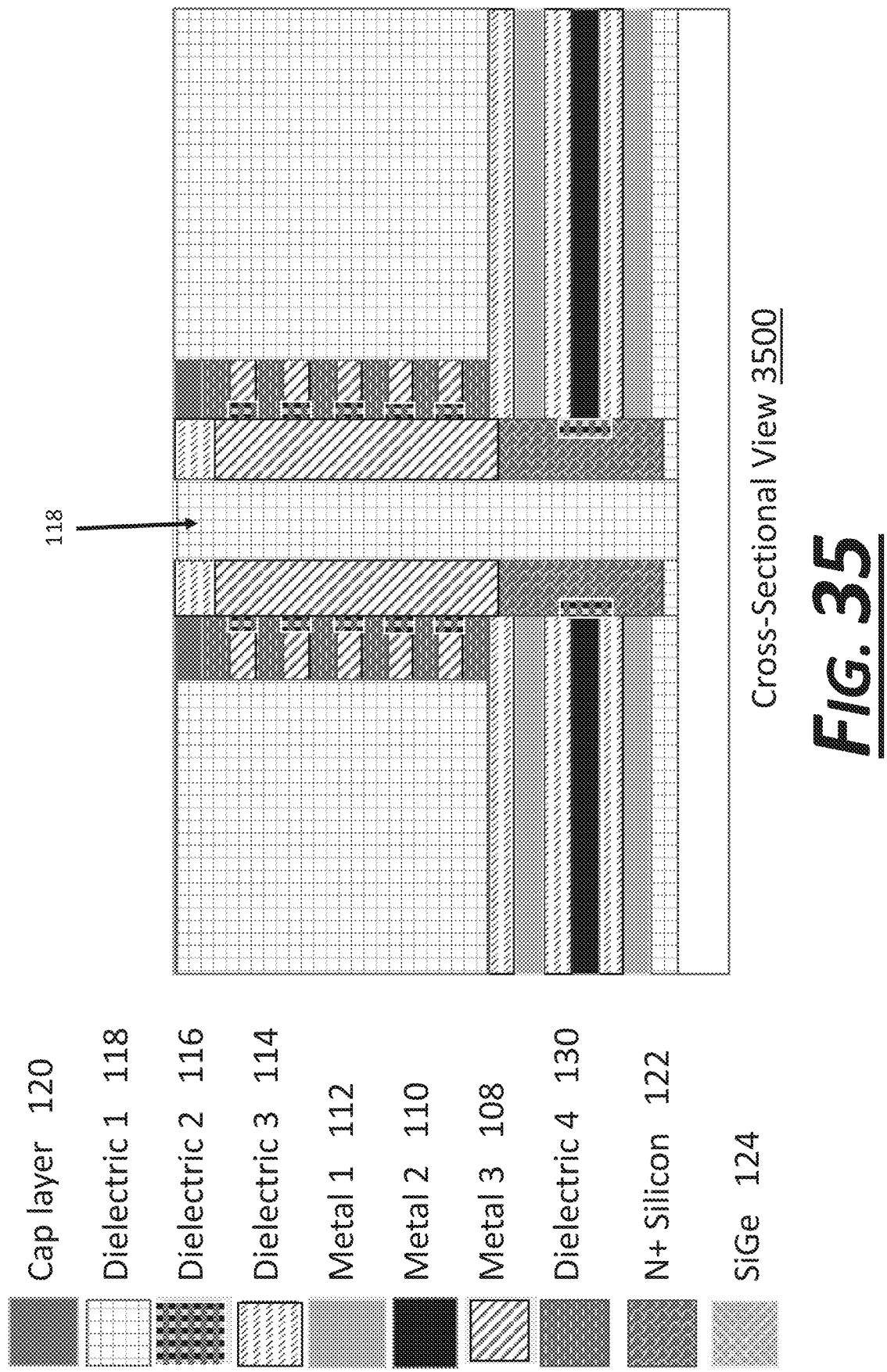

Referring to FIG. 35, illustrated is a cross-sectional view 3500 of the device at the next stage in the third process flow. At this stage, the core channel formed in the semiconductive-behaving material 122 and the metal material 108 can be filled with a dielectric 118. Any type of material deposition process may be used to form the dielectric 118, including ALD, CVD, PVD, or plasma enhanced techniques, among others. In some implementations, and as shown in the cross-sectional view 3500, the air gaps that remain after etching the seed layer 124 can also be deposit-filled with the dielectric 118. In some implementations, a CMP process may be performed following the deposition of the dielectric 118 in the core opening.

Figure 36:
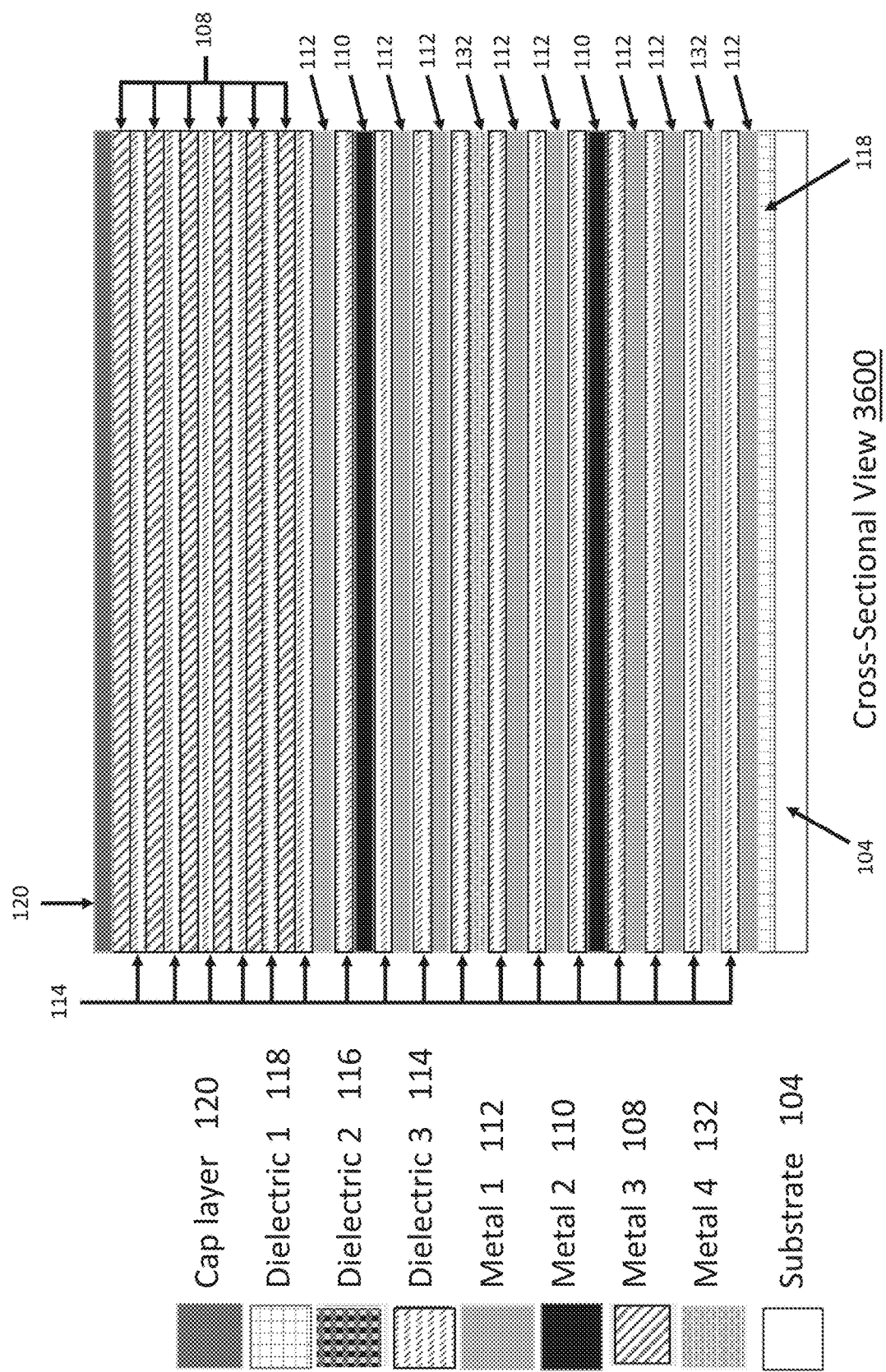

FIGS. 36 and 37 show cross-sectional view of a fourth process flow to form 3D NAND floating gate memory circuits integrated with 3D vertical semiconductor devices, according to an embodiment. Each of the FIGS. 36 and 37 generally refer to one or more process steps (sometimes referred to as "stages") in a fourth process flow, each of which is described in detail in connection with the respective Figure. Referring to FIG. 36, illustrated is a cross-sectional view 3600 of a device. At the start of the fourth process flow, a stack of layers is formed. The stack of layers formed in the fourth process flow may be similar to that described in connection with FIG. 1, but with additional transistor structures having different gate materials (e.g., the gate metal 132, shown as "Metal 4" in the legend). To form the stack of layers, a first layer of dielectric 118 is first deposited on top of a base layer 104. As described briefly above, the techniques described herein may be implemented without requiring epitaxial growth, and therefore the base layer 104 may be any type of material capable of binding to the dielectric 118. The base layer 104 may be active or passive and may comprise dielectric, conductive or semiconductive materials or any combination thereof. The dielectric 118 may be any type of dielectric material or otherwise non-conductive material that is capable of being disposed, patterned, or otherwise provided on top of the base layer 104. Some examples of dielectric materials can include, but are not limited to, oxide materials. The substrate 104 may remain in the final structure or may be removed during or after the formation of the devices described herein.

As used herein, the terms "first," "second," "third," and "fourth" with respect to particular layers of the stack shown in FIGS. 36 and 37 refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 118 (sometimes referred to herein as a "first dielectric layer") is deposited on top of the base layer 104, a first transistor structure may be formed using alternating layers of conductive and non-conductive material layers.

The first S/D layer 112 may be formed directly on the base layer 104 (e.g., if the base layer 104 is non-conductive), or on the one or more dielectric layers 118 described above. The S/D layers 112 may be any type of conductive material, such as a metal, suitable to form a source or drain electrode in a semiconductor device. Some examples of such materials include, but are not limited to copper, gold, silver, platinum, nickel, tungsten, ruthenium, or other types of conductive metals or alloys. An insulating dielectric 114 is formed on the first S/D layer 112, after the first S/D layer 112 has been formed.

A gate layer 132 (e.g., shown as "Metal 4" in the legend) may then be formed on top of the first insulating dielectric layer 114. A second insulating dielectric layer 114, and then a second S/D layer 112, is then formed on the gate layer 132. The gate layer 132 may be a different material than the first and second S/D layers 112 and may be a different material than the gate metal 110 described herein. A third insulating dielectric layer 114 may then be formed on top of the second S/D layer 114 to complete a first transistor structure. In some implementations, multiple transistor structures may be formed on top of one another prior to forming the material stacks for memory structures, as described herein. The layers that make up the transistor structures may have different materials that accommodate different types of semiconductive-behaving materials (e.g., P-type or N-type, etc.). In a multi-transistor stack, the foregoing layers (not necessarily including the base layer 104) would constitute a first sub-stack. As shown in the cross-sectional view 3600, multiple transistor structures are formed, which may include the gate metal 110 or the gate metal 132, each of which can accommodate a different type of semiconductive-behaving material (e.g., the semiconductive-behaving material 122 or the semiconductive-behaving material 134).

As shown, the additional transistor structures (which may be formed from second sub-stacks, third sub-stacks, etc.) may be stacked above the first transistor structure, by depositing similar sub-stacks of layers. One or more insulating dielectric layers 114 may be deposited between adjacent transistor structures. These insulating dielectric layers 114 in the stack of layers may be formed without a mask, such that each layer forms a blanket layer over the prior layer. The gate layers 110 and the gate layers 132 may be a different material than the S/D layers 112 to allow selectivity in etch and deposition processes. Moreover, the gate layer for a P-type device (e.g., the gate layer 132) may be selected to be different from the gate layer 110 of an N-type device, for example. A non-exhaustive list of potential materials to use for the gate layer includes Ru, TaN, TiN, W, WN, TiC, Ga, Gd, TiON, TaSiN, TiSiN, Mo, Al, Cu, and combinations, stacks, or alloys of these or similar materials.

After forming the one or more transistor structures in one or more corresponding sub-stacks, an additional sub-stack may be formed that includes alternating conductive and non-conductive layers, forming a memory structure. As shown in the cross-sectional view 3600, the memory structure includes alternating layers of the insulating dielectric 114 and a conductive layer 108. The conductive layers 108 may be different materials than the S/D layer 112 or the gate layer 110. The conductive layers 108 may include any type of conductive material, including copper, gold, silver, platinum, nickel, tungsten, ruthenium, or other types of conductive metals or alloys. In some implementations, the conductive layers 108 may include TaN, TiN, W, WN, TiC, Ga, Gd, TiON, TaSiN, TiSiN, Mo, Al, Cu, or combinations, stacks, or alloys of these or similar materials. These alternating layers of the insulating dielectric 114 and the conductive layers 108 collectively form a memory structure. After forming the memory structure, a cap layer 120 may be formed. The cap layer 120 can be any type of dielectric or other non-conductive material and may serve to protect the underlying layers from the external environment. In some implementations, one or more additional transistor structures (e.g., a deselect transistor, additional logic, etc.) may be formed (e.g., using techniques similar to those described above) on the memory structure prior to forming the cap layer 120.

When forming each of the layers, layers that make up the transistor structures or memory structures may be patterned as is well understood in the art to form electrical connections between transistor structures or the memory structures. These connections may be formed by patterning the conductive layers described herein, as well as by forming vias to electrically connect different layers. As such, transistor structures and memory structures that are isolated in the x-y plane may be electrically connected with one another to form logical or electronic circuits. Although the memory structure is shown as including six alternating layers of conductive layers 108 and insulating dielectric layers 114, it should be understood that any number of alternating conductive layers 108 and dielectric layers 114 may be utilized, and only a few layers are shown here for ease of visualization. For example, the memory structure may include dozens or hundreds of alternating conductive layers 108 and dielectric layers 114.

Referring to FIG. 37, illustrated is a cross-sectional view 3700 of a device at the next stage of the fourth process flow. As shown, the final device is constructed using techniques similar to those described herein. A channel opening can be defined in the stack of materials using etching techniques, and the high-k dielectric gates 116 can be formed on the gate layers 110 and the gate layers 132, using any of the techniques described herein. Then, alternating layers of the semiconductive-behaving material 134 (shown as "P+ Silicon" in the legend) and the semiconductive-behaving material 122 are formed in the channel opening, such that each is aligned with a respective transistor structure. As shown, the first transistor structure can be a P-type transistor structure, the second transistor structure can be an N-type transistor structure, the third transistor structure can be a P-type transistor structure, and the fourth transistor structure can be an N-type transistor structure. However, it should be understood that any number or combination of transistor structures may be formed beneath the memory structure in the stack of layers. Layers of the dielectric material 118 can be formed between the layers of semiconductive-behaving materials 134 and 122.

The layers of semiconductive-behaving materials 134 and 122 can be formed using any of the techniques described herein, including epitaxial growth or selective deposition. A core opening can be etched through the layers of semiconductive-behaving materials 134 and 122, and the core opening can be filled (e.g., deposit-filled) with the dielectric material 118. In some implementations, and as shown in the cross-sectional view 3700, the layers of the transistor structures may first be recessed away from the channel opening prior to forming the high-k dielectric gates 116, such that the semiconductive-behaving materials 134 and 122, are positioned under the layers of the memory structure. The semiconductive-behaving materials 134 and 122 may then be etched to form a core channel that is flush with the channel opening formed through the layers of the memory structure.

High-k dielectric gates 116 may then be formed on the metal layers 108 of the memory structure after recessing the metal layers 108, as described herein. A metal layer 108 may then be formed on the channel opening in contact with the high-k dielectrics 108 and the insulating dielectric layers 114 of the memory structure. The metal layer 108 may be in contact with the semiconductive behaving material 122 formed below the memory structure. A core opening through the metal layer 108 may be formed, and subsequently filled with the dielectric 118. At any stage after forming the material stack as described herein, one or more word line etches may be performed that etch material from the memory structure down to the insulating dielectric layer 114 that separates the memory structure from the uppermost transistor structure. The word line cuts may then be deposit-filled with the dielectric 118, as shown.

Figure 40:
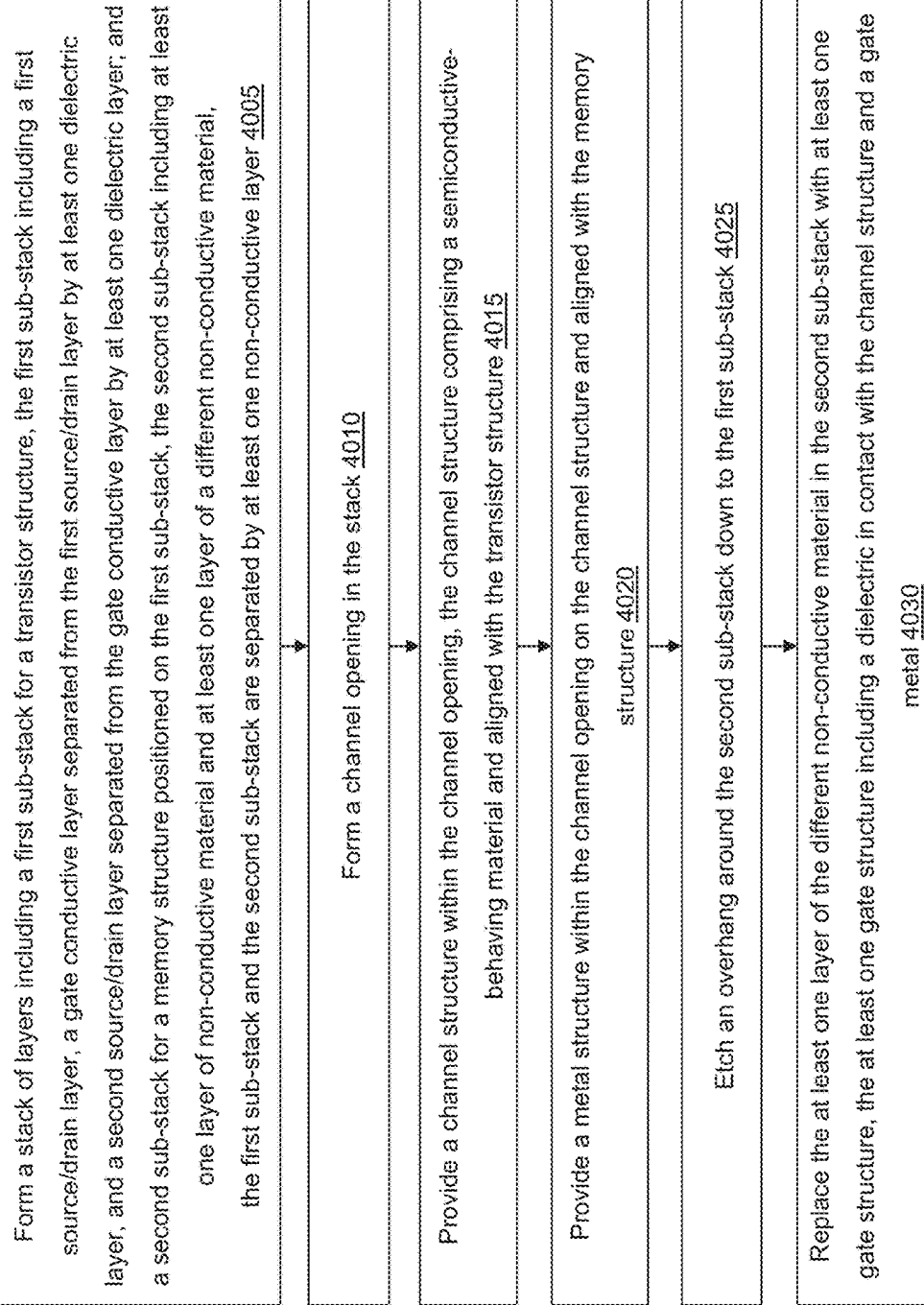

FIGS. 38-40 show flow diagrams of example methods for fabricating memory devices integrated with 3D vertical logic described in connection with FIGS. 1-36, according to an embodiment. Referring to FIG. 38, depicted is a flow diagram of a method 3800 for fabricating memory devices integrated with 3D vertical logic. The method 3800 may include steps 3805-3825. However, other embodiments may include additional or alternative steps, or may omit one or more steps altogether.

At step 3805, the method includes forming a stack of layers. To form the stack of layers, processes described herein above in connection with FIG. 1 may be performed. The stack of layers can include a first sub-stack for a transistor structure. The first sub-stack can include a first source/drain layer (e.g., the first S/D layer 112), a gate conductive layer (e.g., the gate layer 110) separated from the first source/drain layer by at least one dielectric layer (e.g., the first dielectric layer 114), and a second source/drain layer (e.g., the second S/D layer 112) separated from the gate conductive layer by at least one dielectric layer. The stack of layers can include a second sub-stack for a memory structure positioned on the first sub-stack. The second sub-stack can include at least one layer of conductive material (e.g., the metal layer 108) and at least one layer of non-conductive material (e.g., one or more layers of the dielectric materials 114). The first sub-stack and the second sub-stack are separated by at least one non-conductive layer (e.g., the dielectric layer 114 shown in FIG. 1 as separating the memory structure from the transistor structure). In some implementations, the patterned conductive source/drain layers may include connections to other source/drain structures of other transistors or the conductive layers of memory structures. Such connections may be formed by patterning one or more metal masks to form desired metal connections, such as connections that may be used to form logical or electronic circuits, as described herein.

At step 3810, the method includes forming a channel opening in the stack of layers. To do so, processes similar to those described in connection with FIG. 2 may be performed. For example, an etching process described in connection with FIG. 2 may be used to define the channel opening through the memory structure and the transistor structure. A substrate layer (e.g., the base layer 104) may act as an etch stop layer when etching the channel opening. Defining the channel opening may include defining an opening for any number of transistor structures, as described herein.

At step 3815, the method includes forming a gate dielectric in the channel opening. After defining the channel opening, high-k gate dielectrics (e.g., the high-k dielectric 116) may be deposited on the gate layers (e.g., the gate layers 110 or 132) in each transistor structure in the stack of layers. To do so, one or more of the gate layers may be recessed, and the high-k gate dielectric materials may be subsequently deposited using techniques similar to those described in connection with FIG. 3.

At step 3820, the method includes providing a channel structure within the channel opening. The channel structure can include a semiconductive-behaving material (e.g., the semiconductive-behaving material 122) and can be aligned with the transistor structure, and formed using processes described in connection with FIG. 4. The semiconductive-behaving material may be an N-type semiconductive-behaving material or a P-type semiconductive-behaving material. In some implementations, the channel structure can be formed on a seed layer, such as the seed layer 124 described in connection with FIG. 4. In such implementations, the channel structure may be formed using epitaxial techniques, as described herein.

At step 3825, the method includes providing a charge trap layer (e.g., the charge trap layer 126, etc.) within the channel opening. The charge trap layer can be aligned with the memory structure. To form the charge trap layer, processes described in connection with FIG. 5 may be performed. The charge trap layer may be formed on the channel structure in the channel opening. In some implementations, a core channel opening may be formed through the charge trap layer and the channel structure, for example, using processes similar to those described in connection with FIG. 6. A dielectric material may be provided in the core opening, such that the dielectric material is aligned with the channel structure, as described in connection with FIGS. 7 and 8. A metal layer may be formed in the core channel opening in contact with the charge trap layer and the channel structure, as described in connection with FIG. 9. A dielectric material may be provided in the core channel opening in contact with the metal layer, as described in connection with FIG. 10. The stack of layers may be etched to form a word line cut as described in connection with FIG. 11, and a dielectric material can be provided to fill the word line cut as described in connection with FIG. 12.

Referring to FIG. 39, depicted is a flow diagram of a method 3900 for fabricating memory devices integrated with 3D vertical logic. The method 3900 may include steps 3905-3925. However, other embodiments may include additional or alternative steps, or may omit one or more steps altogether.

At step 3905, the method includes forming a stack of layers including a first sub-stack for a transistor structure. To form the stack of layers, processes described in connection with FIG. 13 may be performed. The first sub-stack can include a first source/drain layer (e.g., the first S/D layer 112), a gate conductive layer (e.g., the gate layer 110) separated from the first source/drain layer by at least one dielectric layer (e.g., the dielectric layer 114), and a second source/drain layer (e.g., the second S/D layer 112) separated from the gate conductive layer by at least one dielectric layer (e.g., the dielectric layer 114). The stack of layers includes a second sub-stack for a memory structure positioned on the first sub-stack. The second sub-stack includes at least one layer of non-conductive material (e.g., the dielectric layer 114) and at least one layer of a different non-conductive material (e.g., the different dielectric layer 130). The first sub-stack and the second sub-stack can be separated by at least one non-conductive layer (e.g., the dielectric layer 114).

At step 3910, the method includes forming a channel opening in the stack of layers. The channel opening can be formed using processes described in connection with FIG. 14. A substrate layer (e.g., the base layer 104) may act as an etch stop layer when etching the channel opening. Defining the channel opening may include defining an opening for any number of transistor structures, as described herein. The method can include forming a gate dielectric on the gate conductive layer, as described in connection with FIG. 15.

At step 3915, the method includes providing a channel structure within the channel opening, the channel structure comprising a semiconductive-behaving material (e.g., the semiconductive-behaving material 122). The channel structure can be aligned with the transistor structure and the memory structure. The channel structure can be formed by performing the processes described in connection with FIG. 15. The semiconductive-behaving material can be an N-type semiconductive-behaving material or a P-type semiconductive-behaving material. The channel structure can be formed on a seed layer (e.g., the seed layer 124), in which case epitaxial formation techniques may be used to form the channel structure.

At step 3920, the method includes etching around the second sub-stack down to the first sub-stack. To do so, processes described in connection with FIG. 16 may be performed. The etching process may be performed to create one or more word line cuts and can expose one or more of the non-conductive of the memory structure for etching in further process steps.

At step 3925, the method includes replacing the at least one layer of the non-conductive material in the second sub-stack with at least one gate structure. The at least one gate structure can include a dielectric (e.g., the high-k dielectric 116) in contact with the channel structure and a gate metal (e.g., the gate metal 108). To do so, processes described in connection with FIGS. 17 and 18 can be performed. The method can include selectively etching the at least one layer of the non-conductive material to form at least one air gap, as described in connection with FIG. 17. The method can include selectively depositing a gate dielectric material in a portion of the at least one air gap, and forming the gate metal in a remaining portion of the at least one air gap to form the at least one gate structure, as described in connection with FIG. 18. The method can include providing a dielectric that surrounds the second sub-stack after forming the at least one gate structure, as described in connection with FIG. 19. The method can include forming a core opening through the channel structure, as described in connection with FIGS. 20 and 21. The method can include removing the seed layer after forming the core opening in the stack of layers, and depositing a dielectric material in the air gaps left by the seed layer and in the core opening, as described in connection with FIGS. 22 and 23.

Referring to FIG. 40, depicted is a flow diagram of a method 4000 for fabricating memory devices integrated with 3D vertical logic. The method 4000 may include steps 4005-4030. However, other embodiments may include additional or alternative steps, or may omit one or more steps altogether.

At step 4005, the method includes forming a stack of layers. To form the stack of layers, processes described in connection with FIG. 24 may be performed. The stack of layers can include a first sub-stack for a transistor structure. The first sub-stack can include a first source/drain layer (e.g., the first S/D layer 112), a gate conductive layer (e.g., the gate layer 110) separated from the first source/drain layer by at least one dielectric layer (e.g., the dielectric layer 114), and a second source/drain layer (e.g., the second S/D layer 112) separated from the gate conductive layer by at least one dielectric layer (e.g., the dielectric layer 114). The stack of layers can include a second sub-stack for a memory structure positioned on the first sub-stack. The second sub-stack including at least one layer of non-conductive material (e.g., the dielectric layer 114) and at least one layer of a different non-conductive material (e.g., the different dielectric layer 130). The first sub-stack and the second sub-stack are separated by at least one non-conductive layer (e.g., the dielectric layer 114). In some implementations, the stack of layers can include a third sub-stack for a second transistor structure. The third sub-stack can include a third conductive source/drain layer, a second gate conductive layer (e.g., the gate layer 132) separated from the first source/drain layer by at least one dielectric layer, and a fourth source/drain layer separated from the second gate conductive layer by at least one dielectric layer. The third sub-stack can be formed on a substrate layer below the first sub-stack and can be separated from the first sub-stack by at least one non-conductive layer. To form such a sub-stack, processes described in connection with FIG. 36 may be performed. Similarly, in some implementations, the non-conductive layers of the memory structure may be conductive layers (e.g., the metal layers 108), as shown in FIGS. 36 and 37.

At step 4010, the method includes forming a channel opening in the stack of layers. The channel opening can be formed using processes described in connection with FIG. 25. A substrate layer (e.g., the base layer 104) may act as an etch stop layer when etching the channel opening. Defining the channel opening may include defining an opening for any number of transistor structures, as described herein. The method can include forming a gate dielectric on the gate conductive layer, as described in connection with FIG. 26. In some implementations, an alternative approach may be performed to form the channel opening, which may include recessing the sub-stacks corresponding to the transistor structures in the stack of layers, as described in connection with FIG. 37.

At step 4015, the method includes providing a channel structure within the channel opening, the channel structure comprising a semiconductive-behaving material (e.g., the semiconductive-behaving material 122). The channel structure can be aligned with the transistor structure. The channel structure can be formed by performing the processes described in connection with FIG. 26. The semiconductive-behaving material can be an N-type semiconductive-behaving material or a P-type semiconductive-behaving material. The channel structure can be formed on a seed layer (e.g., the seed layer 124), in which case epitaxial formation techniques may be used to form the channel structure. In implementations where multiple transistor structures are provided, the techniques described in connection with FIG. 37 may be performed to provide a corresponding channel structure for each transistor structure in the stack of materials.

At step 4020, the method includes providing a metal structure (e.g., the metal material 108) within the channel opening on the channel structure. The metal structure can be aligned with the memory structure. The metal structure can be formed by performing the processes described in connection with FIG. 27. The metal structure can be deposited on the channel structure in the channel opening. In implementations where the non-conductive layers in the memory structure are conductive (e.g., as described in connection with FIGS. 36 and 37), gate dielectrics (e.g., the high-k dielectrics 116) may be formed on the gate layers prior to depositing the metal structure.

At step 4025, the method includes etching around the second sub-stack down to the first sub-stack. To do so, processes described in connection with FIG. 28 may be performed. The etching process may be performed to create one or more word line cuts and can expose one or more of the non-conductive of the memory structure for etching in further process steps.

At step 4030, the method includes replacing the at least one layer of the non-conductive material in the second sub-stack with at least one gate structure, the at least one gate structure including a dielectric (e.g., the high-k dielectric 116) in contact with the channel structure and a gate metal (e.g., the gate metal 108). To do so, the processes described in connection with FIGS. 29 and 30 can be performed. The method can include selectively etching the at least one layer of the non-conductive material to form at least one air gap, as described in connection with FIG. 29. The method can include selectively depositing a gate dielectric material in a portion of the at least one air gap, as described in connection with FIG. 30. The method can include forming the gate metal in a remaining portion of the at least one air gap to form the at least one gate structure, as described in connection with FIG. 30. The method can include providing a dielectric that surrounds the second sub-stack after forming the at least one gate structure, as described in connection with FIG. 31. In implementations where the memory structure includes conductive layers, as described in connection with FIGS. 36 and 37, the method may not include replacing any material in the memory structure. The method can include forming a core channel opening through the metal structure and the channel structure, as described in connection with FIGS. 32 and 33 or in FIG. 37. The method can include forming removing the seed layer used to form the channel structure, if present, and filling the air gap left when the seed layer was removed and the core opening with a dielectric material, as described in connection with FIGS. 34 and 35.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
   forming a stack of layers including:
      forming a first sub-stack configured for forming a transistor structure, the first sub-stack including a first source/drain layer, a gate conductive layer, and a second source/drain layer vertically separated from one another;
      forming at least one non-conductive layer on the first sub-stack; and
      forming a second sub-stack on the at least one non-conductive layer, the second sub-stack configured for forming a memory structure, the second sub-stack including at least one layer of conductive material and at least one layer of non-conductive material,
   forming a channel opening extending through the first sub-stack and the second sub-stack;
   forming a gate dielectric through the channel opening to contact the gate conductive layer of the first sub-stack;
   forming a channel structure within the channel opening, the channel structure comprising a semiconductor oxide and aligned with the first sub-stack; and
   forming a charge trap layer within the channel opening and aligned with the second sub-stack, wherein the charge trap layer includes at least two dielectric layers.

2. The method of claim 1, further comprising forming an opening extending through the charge trap layer and the channel structure.

3. The method of claim 2, further comprising:
   forming a metal layer in the opening to contact the charge trap layer and the channel structure.

4. The method of claim 1, wherein the semiconductor oxide is a p-type or n-type oxide.

5. The method of claim 1, further comprising etching the stack of layers to form an opening.

6. The method of claim 5, further comprising providing a dielectric material in the opening.

7. The method of claim 1, wherein forming the channel structure includes forming the channel structure on a seed layer, and the method further comprises removing the seed layer after forming the channel opening further extending through the seed layer.

8. A method comprising:
   forming a stack of layers including:
      forming a first sub-stack for a transistor structure, the first sub-stack including a first source/drain layer, a gate conductive layer separated from the first source/drain layer by at least one dielectric layer, and a second source/drain layer separated from the gate conductive layer by at least one dielectric layer;
      forming at least one non-conductive layer on the first sub-stack; and
      forming a second sub-stack on the at least one non-conductive layer, the second sub-stack for a memory structure positioned on the first sub-stack, the second sub-stack including at least one layer of non-conductive material and at least one layer of a different non-conductive material;
   forming a channel opening in the stack of layers;
   forming a channel structure within the channel opening by disposing a semiconductor oxide in alignment with the transistor structure and the memory structure;
   etching around the second sub-stack down to the first sub-stack; and
   replacing the at least one layer of the non-conductive material in the second sub-stack with at least one gate structure by disposing a dielectric in contact with the channel structure and a gate metal.

9. The method of claim 8, wherein replacing the at least one layer of the non-conductive material in the second sub-stack comprises:
   selectively etching the at least one layer of the non-conductive material to form at least one air gap;
   selectively depositing a gate dielectric material in a portion of the at least one air gap; and
   forming the gate metal in a remaining portion of the at least one air gap to form the at least one gate structure.

10. The method of claim 9, further comprising providing a dielectric that surrounds the second sub-stack after forming the at least one gate structure.

11. The method of claim 8, further comprising forming a gate dielectric on the gate conductive layer prior to providing the channel structure.

12. The method of claim 8, further comprising forming a core opening through the channel structure.

* * * * *